US008470961B2

(12) United States Patent
Facchetti et al.

(10) Patent No.: US 8,470,961 B2
(45) Date of Patent: Jun. 25, 2013

(54) NAPHTALENE-IMIDE SEMICONDUCTOR POLYMERS

(75) Inventors: Antonio Facchetti, Chicago, IL (US); Zhihua Chen, Skokie, IL (US); He Yan, Skokie, IL (US); Yan Zheng, Skokie, IL (US); Jordan Quinn, Skokie, IL (US); Marcel Kastler, Basel (CH); Florian Doetz, Singapore (SG); Silke Koehler, Basel (CH)

(73) Assignees: BASF SE, Ludwigshafen (DE); Polyera Corporation, Skokie, IL (US)

( * ) Notice: Subject to any disclaimer, the term of this patent is extended or adjusted under 35 U.S.C. 154(b) by 183 days.

(21) Appl. No.: 12/865,964

(22) PCT Filed: Feb. 5, 2009

(86) PCT No.: PCT/EP2009/051314
§ 371 (c)(1), (2), (4) Date: Aug. 3, 2010

(87) PCT Pub. No.: WO2009/098253
PCT Pub. Date: Aug. 13, 2009

(65) Prior Publication Data
US 2010/0326527 A1  Dec. 30, 2010

Related U.S. Application Data

(60) Provisional application No. 61/112,478, filed on Nov. 7, 2008, provisional application No. 61/088,215, filed on Aug. 12, 2008, provisional application No. 61/088,246, filed on Aug. 12, 2008, provisional application No. 61/088,236, filed on Aug. 12, 2008, provisional application No. 61/050,010, filed on May 2, 2008, provisional application No. 61/026,322, filed on Feb. 5, 2008, provisional application No. 61/026,311, filed on Feb. 5, 2008.

(51) Int. Cl.
*C08G 73/06* (2006.01)
*C08G 73/10* (2006.01)
*C08G 65/34* (2006.01)
*C08G 75/06* (2006.01)
*C08G 75/00* (2006.01)

(52) U.S. Cl.
USPC ........... 528/424; 528/377; 528/378; 528/367; 528/423; 528/425

(58) Field of Classification Search
USPC ................ 528/377, 378, 380, 367, 423, 424, 528/425
See application file for complete search history.

(56) References Cited

U.S. PATENT DOCUMENTS

2008/0177073 A1   7/2008   Facchetti et al.
2008/0185577 A1   8/2008   Facchetti et al.

OTHER PUBLICATIONS

Guo et al; Conjugated polymers from naphtalene bisimide; American Chemical Society; Organic letters (2008), 10(23), 5333-5336.*
International Search Report issued May 27, 2009 in PCT/EP2009/051314 filed Feb. 5, 2009.

(Continued)

*Primary Examiner* — Duc Truong
(74) *Attorney, Agent, or Firm* — Oblon, Spivak, McClelland, Maier & Neustadt, L.L.P.

(57) ABSTRACT

Disclosed are new semiconductor materials prepared from naphthalene-imide copolymers. Such polymers can exhibit desirable electronic properties and can possess processing advantages including solution-processability and/or good stability at ambient conditions.

38 Claims, 18 Drawing Sheets

OTHER PUBLICATIONS

Piyakulawat, P. et al., "Synthesis and Preliminary Characterization of Novel Naphthalene Bisimide Based Copolymers", Synthetic Metals, vol. 159, pp. 467-472, XP-002527469 (Dec. 23, 2008).

Zhan, X. et al., "A High-Mobility Electron-Transport Polymer With Broad Absorption and Its Use in Field-Effect Transistors and All-Polymer Solar Cells", Journal of the American Chemical Society, vol. 129, No. 23, pp. 7246-7247 and S1-S11, XP-002527202 (May 18, 2007).

Jones, B. A. et al., "Tuning Orbital Energetics in Arylene Diimide Semiconductors. Materials Design for Ambient Stability of n-Type Charge Transport", Journal of the American Chemical Society, vol. 129, No. 49, pp. 15259-15278, XP-002526266 (Jan. 1, 2007).

Pina, J. et al., "Spectral and Photophysical Studies of Poly [2,6-(1,5-dioctylnaphthalene)]thiophenes", Journal of Physical Chemistry, vol. 111, No. 19, pp. 7185-7191 XP-002527470 (Apr. 24, 2007).

Mori, T. et al., "Synthesis and Optical Properties of polynaphthalene Derivatives", Optical Materials, vol. 30, pp. 545-552, XP-022323146 (Feb. 27, 2007).

U.S. Appl. No. 61/057,547, filed May 30, 2008, Facchetti, et al.
U.S. Appl. No. 61/026,311, filed Feb. 5, 2008, Kastler, et al.
U.S. Appl. No. 61/026,322, filed Feb. 5, 2008, Facchetti, et al.
U.S. Appl. No. 61/050,010, filed May 2, 2008, Chen, et al.
U.S. Appl. No. 61/088,215, filed Aug. 12, 2008, Facchetti, et al.
U.S. Appl. No. 61/088,236, filed Aug. 12, 2008, Facchetti, et al.
U.S. Appl. No. 61/088,246, filed Aug. 12, 2008, Facchetti, et al.
U.S. Appl. No. 60/859,761, filed Nov. 17, 2006, Facchetti, et al.
U.S. Appl. No. 60/879,145, filed Jan. 8, 2007, Facchetti, et al.
U.S. Appl. No. 13/140,595, filed Jun. 17, 2011, Mishra, et al.
U.S. Appl. No. 13/128,961, filed May 12, 2011, Quinn, et al.
U.S. Appl. No. 13/266,935, filed Oct. 28, 2011, Karpov, et al.

* cited by examiner

NAPHTALENE-IMIDE SEMICONDUCTOR POLYMERS

CROSS REFERENCE TO RELATED APPLICATION

This application claims priority to and the benefit of U.S. Provisional Patent Application Ser. Nos. 61/026,322, filed on Feb. 5, 2008; 61/026,311, filed on Feb. 5, 2008; 61/050,010, filed on May 2, 2008; 61/088,236, filed on Aug. 12, 2008; 61/088,246, filed on Aug. 12, 2008; 61/088,215, filed on Aug. 12, 2008; and 61/112,478, filed on Nov. 7, 2008, the disclosure of each of which is incorporated by reference herein in its entirety.

BACKGROUND

A new generation of optoelectronic devices such as organic thin film transistors (OTFTs), organic light emitting transistors (OLETs), organic light emitting diodes (OLEDs), printable circuits, organic photovoltaic (OPV) devices, electrochemical capacitors, and sensors are built upon organic semiconductors as their active components. To enable high device efficiencies such as large charge carrier mobilities ($\mu$) needed for transistor/circuit operations, or efficient exciton formation/splitting that is necessary for OLED/OPV operations, it is desirable that both p-type and n-type organic semiconductor materials are available. Furthermore, these organic semiconductor-based devices should exhibit satisfactory stability in ambient conditions and should be processable in a cost-effective manner.

Several p- and n-channel molecular semiconductors have achieved acceptable device performance and stability. For example, OTFTs based on certain acenes, oligothiophenes (p-channel), and perylenes (n-channel) can exhibit carrier mobilities ($\mu$'s) greater than about 0.5 cm$^2$/Vs in ambient conditions. However, molecular semiconductors typically are less easily processable than polymeric semiconductors, and often cannot be processed via printing methodologies due to solution viscosity requirements.

Accordingly, the art desires new polymeric semiconductors, particularly those having good stability, processing properties, and/or charge transport characteristics in ambient conditions.

SUMMARY

In light of the foregoing, the present teachings provide naphthalene-based semiconducting polymers that can address various deficiencies and shortcomings of the prior art, including those outlined above. Also provided are associated devices and related methods for the preparation and use of these polymers. The present polymers can exhibit properties such as excellent charge transport characteristics in ambient conditions, chemical stability, low-temperature processability, large solubility in common solvents, and processing versatility (e.g., printability). As a result, field effect devices such as thin film transistors that incorporate one or more of the present polymers as the semiconductor layer can exhibit high performance in ambient conditions, for example, demonstrating one or more of large electron mobilities, low threshold voltages, and high current on-off ratios. Similarly, other organic semiconductor-based devices such as OPVs, OLETs, and OLEDs can be fabricated efficiently using the polymeric materials described herein.

Generally, the present teachings provide polymers that can be represented by the formula:

wherein M$_1$ is an optionally substituted naphthalene imide selected from:

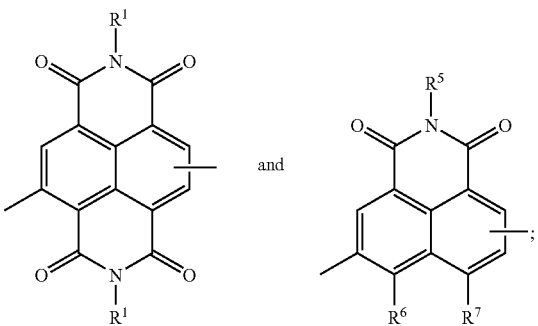

M$_2$ has a formula selected from:

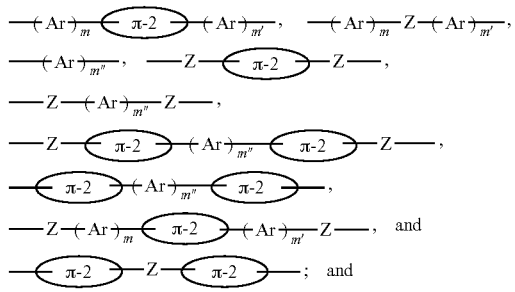

n is an integer greater than or equal to 2;
wherein R$^1$, R$^5$, R$^6$, R$^7$, $\pi$-2, Ar, Z, m, m', and m" are as defined herein.

The present teachings also provide methods of preparing such polymers and semiconductor materials, as well as various compositions, composites, and devices that incorporate the polymers and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

FIG. 10a shows a typical current-voltage output plot as a function of $V_{SG}$ for a representative TGBC device on glass (Entry 3 in Table 2). FIG. 10b shows a magnified view of the low-$V_{SD}$ region in FIG. 10a. FIG. 10c shows typical TFT transfer plots of current vs. $V_{SG}$ for a representative TGBC device on glass measured immediately after fabrication and 9 and 16 weeks after fabrication (Entry 3 in Table 2). FIG. 10d shows a typical TFT transfer plot of current vs. $V_{SG}$ for a representative TGBC device on PET (Entry 4 in Table 2). FIG. 10e shows typical TFT transfer plot of current vs. $V_{SG}$ for a representative TGBC device on PET with a ~120 nm-thick dielectric layer. FIG. 10f shows representative transistor performance parameters vs. time plots for a TGBC TFT array on glass. FIG. 10g shows a representative electron mobility vs. relative humidity plot for a TGBC TFT array on PET (Entry 4 in Table 2).

FIG. 11a shows representative TFT transfer plots of current vs. carrier density ($N_{ind}$) of various gravure-printed TGBC TFTs with dielectric and semiconductor layers of different thicknesses (Entries 5-9 and 11 in Table 2). FIG. 11b shows representative TFT transfer plots of current vs. $V_{SG}$ for a representative spin-coated (square) and gravure-printed (star) TGBC device (Entries 4 and 8 in Table 2). FIG. 11c shows representative TFT transfer plot of current vs. $V_{SG}$ for a representative fully gravure-printed TGBC device (Entries 12 and 13 in Table 2).

DETAILED DESCRIPTION

Figure 1:
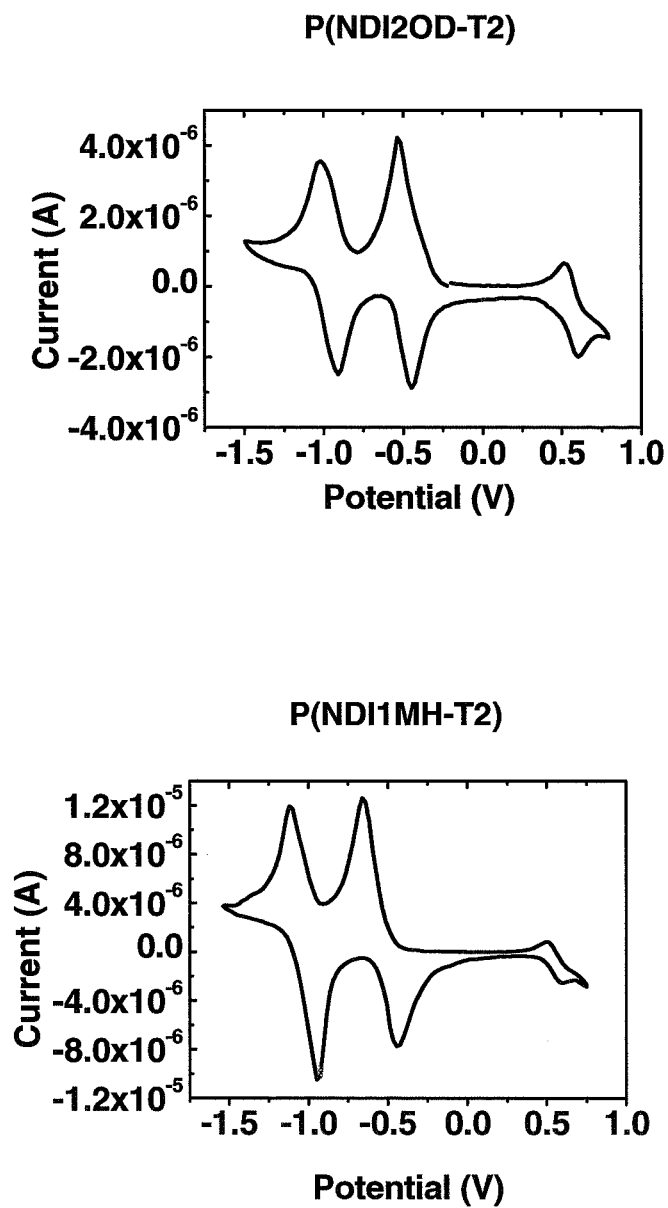
FIG. 1 shows cyclic voltammograms for two embodiments of the present polymers, namely, P(NDI2OD-T2) (top) and P(NDI1MH-T2) (bottom), with the polymer deposited on a 0.4-mm diameter Pt working electrode with silver as the counter electrode in a TFH-TBAPF6 electrolyte solution at a scanning rate of v=80 mVs$^{-1}$ with ferrocene as the internal standard (0.54V vs SCE).

The present teachings provide organic semiconductor materials that include one or more naphthalene-based semiconducting polymers, and associated compositions, composites, and/or devices. Polymers of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present polymers can possess certain processing advantages such as solution-processability and/or good stability (for example, air stability) in ambient conditions. The polymers of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Accordingly, one aspect of the present teachings provides polymers having semiconducting activity and semiconductor materials prepared from these polymers. More specifically, the polymers can be A-B copolymers comprising a first repeating unit (monomer A, M$_1$) that includes an aromatic imide, and a second repeating unit (monomer B, M$_2$) that includes one or more cyclic moieties. In various embodiments, both monomer A and monomer B can include an aromatic or otherwise highly conjugated cyclic (carbocyclic or heterocyclic) moieties, where such cyclic moieties can be optionally substituted or functionalized with one or more electron-withdrawing or electron-donating groups. The pairing of monomers A and B, the imide position functionalization of monomer A, and any additional functionalization on either monomer can be affected by one or more of the following considerations: 1) the electron-withdrawing capability for semiconductor processing in air and stable charge transport operation; 2) modulation of the majority carrier type depending on the electronic structure of monomers A and B; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) achieving strong π-π interactions/intermolecular electronic coupling; and 8) bandgap modulation via electron donor-acceptor coupling of electron-poor (acceptor) and electron-rich (donor) A-B or B-A repeating units. The resulting polymers and related methods can be employed to enhance the performance of an associated device (e.g., an organic field effect transistor, a light-emitting transistor, a solar cell, or the like).

More specifically, monomer A of the present polymers generally comprises an optionally substituted (core-substituted and/or imide-substituted) naphthalene diimide or monoimide, while monomer B generally comprises one or more optionally substituted aromatic (or otherwise π-conjugated) monocyclic moieties. In certain embodiments, monomer B can include one or more linkers and/or one or more polycyclic moieties in addition to the one or more monocyclic moieties. In various embodiments, monomer B as a whole can comprise a highly conjugated system. The present teachings also relate to homopolymers of monomer A.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymer" or "polymeric compound" refers to a molecule (e.g., a macromolecule) including a plurality of one or more repeating units connected by covalent chemical bonds. A polymer can be represented by the general formula:

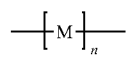

wherein M is the repeating unit or monomer, and n is the number of M's in the polymer. For example, if n is 3, the polymer shown above is understood to be:

M-M-M.

The polymer or polymeric compound can have only one type of repeating unit as well as two or more types of different repeating units. In the former case, the polymer can be referred to as a homopolymer. In the latter case, the term "copolymer" or "copolymeric compound" can be used instead, especially when the polymer includes chemically significantly different repeating units. The polymer or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a Spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

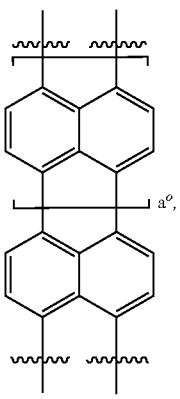

where $a^o$ can be an integer in the range of 0-3; coronenes (or analogs thereof containing one or more heteroatoms) having the formula:

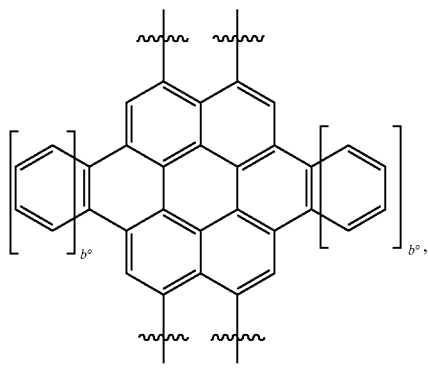

where $b^o$ can be an integer in the range of 0-3; and linear acenes (or analogs thereof containing one or more heteroatoms) having the formula:

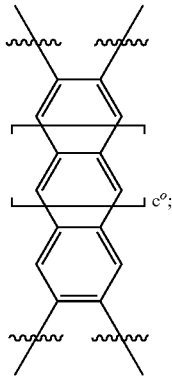

where $c^o$ can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_zH_{2z+1-t}X^o_t$, where $X^0$, at each occurrence, is F, Cl, Br or I, z is an integer in the range of 1 to 40, and t is an integer in the range of 1 to 81, provided that t is less than or equal to 2z+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group (which, in some cases, can be expressed as $—S(O)_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

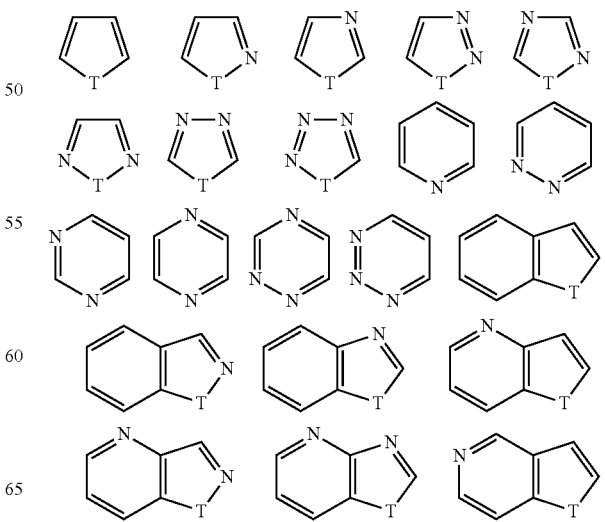

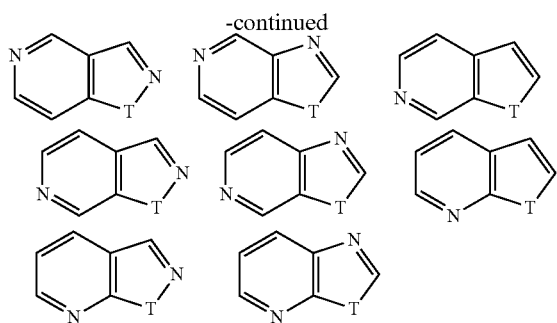

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Polymers of the present teachings can include a "divalent group" defined herein as a linking group capable of forming a covalent bond with two other moieties. For example, polymers of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group), a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —NO$_2$, —CN, —NC, —S(R$^o$)$_2{}^+$, —N(R$^o$)$_3{}^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, —CON(R$^o$)$_2$, $C_{1-40}$ haloalkyl groups, $C_{6-14}$ aryl groups, and 5-14 membered electron-poor heteroaryl groups; where R$^o$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —NO$_2$, —CN, —NC, —S(R$^o$)$_2{}^+$, —N(R$^o$)$_3{}^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, and —CON(R)$_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR$^o$, —NH$_2$, —NHR$^o$, —N(R$^o$)$_2$, and 5-14 membered electron-rich heteroaryl groups, where R$^o$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents of monomers A and B are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_4$, $C_1$-$C_3$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Polymers described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of polymers containing alkenyl moieties (e.g., alkenes, azo, and imines). It also should be understood that the polymers of the present teachings encompass all possible regioisomers in pure form and mixtures thereof. In some embodiments, the preparation of the present polymers can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, "field effect mobility" refers to a measure of the velocity with which charge carriers, for example, holes (or units of positive charge) in the case of a p-type semiconductor material and electrons in the case of an n-type semiconductor material, move through the material under the influence of an electric field.

As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a compound can be described as ambient stable if its carrier mobility or reduction potential does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

In various embodiments, the polymers of the present teachings can have the formula:

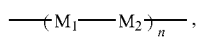

wherein $M_1$ is an optionally substituted naphthalene imide selected from:

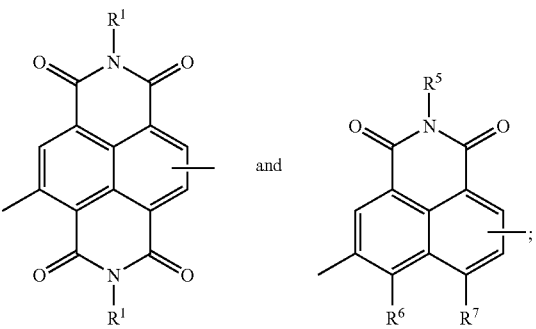

$M_2$ has a formula selected from:

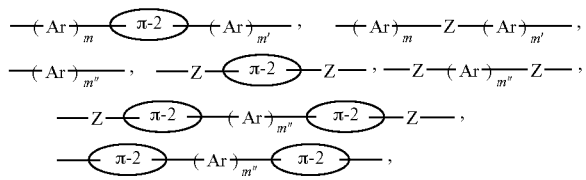

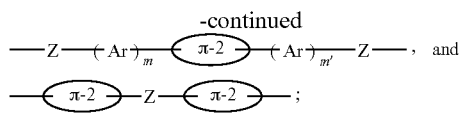

n is an integer between 2 and 5,000; and $R^1, R^5, R^6, R^7, \pi$-2, Ar, Z, m, m', and m'' are as defined herein.

More specifically, in the formula of $M_1$ selected from:

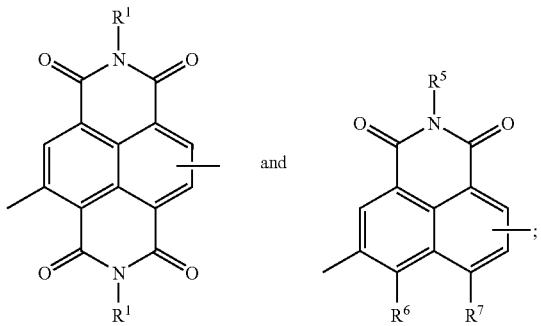

$R^1$, at each occurrence, is independently selected from H, a $C_{1-40}$ alkyl group, a $C_{2-40}$ alkenyl group, a $C_{1-40}$ haloalkyl group, and 1-4 cyclic moieties, wherein:
each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —$NH(C_{1-20}$ alkyl), —$N(C_{1-20}$ alkyl)$_2$, —$S(O)_2OH$, —CHO, —C(O)—$C_{1-20}$ alkyl, —C(O)OH, —C(O)—$OC_{1-20}$ alkyl, —C(O)$NH_2$, —C(O)NH—$C_{1-20}$ alkyl, —C(O)N($C_{1-20}$ alkyl)$_2$, —$OC_{1-20}$ alkyl, —$SiH_3$, —SiH($C_{1-20}$ alkyl)$_2$, —$SiH_2(C_{1-20}$ alkyl), and —Si($C_{1-20}$ alkyl)$_3$;

each of the $C_{1-40}$ alkyl group, the $C_{2-40}$ alkenyl group, and the $C_{1-40}$ haloalkyl group can be covalently bonded to the imide nitrogen atom via an optional linker; and each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, =C(CN)$_2$, —$NH_2$, —$NH(C_{1-20}$ alkyl), —$N(C_{1-20}$ alkyl)$_2$, —$S(O)_2OH$, —CHO, —C(O)OH, —C(O)—$C_{1-20}$ alkyl, —C(O)—$OC_{1-20}$ alkyl, —C(O)$NH_2$, —C(O)NH—$C_{1-20}$ alkyl, —C(O)N($C_{1-20}$ alkyl)$_2$, —$SiH_3$, —$SiH(C_{1-20}$ alkyl)$_2$, —$SiH_2(C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, a $C_{1-20}$ alkyl group, a $C_{1-20}$ alkenyl group, and a $C_{1-20}$ haloalkyl group;

$R^5$ is defined as $R^1$; and $R^6$ and $R^7$, independently are selected from H, an electron-withdrawing group, and a $C_{1-40}$ alkyl group optionally substituted with 1-5 electron-withdrawing groups.

In some embodiments, each of $R^1$ and $R^5$ can be independently selected from H, a $C_{1-40}$ alkyl group, a $C_{2-40}$ alkenyl group, a $C_{2-40}$ alkynyl group, a $C_{1-40}$ haloalkyl group, -L-$R^a$, -L-$Ar^1$, -L-$Ar^1$—$Ar^1$, -L-$Ar^1$—$R^a$, -L-$Ar^1$—$Ar^1$—$R^a$, -L-$Cy^1$, -L-$Cy^1$-$Cy^1$, -L-$Cy^1$-$R^a$, and -L-$Cy^1$-$Cy^1$-$R^a$;

wherein:
L, at each occurrence, is independently selected from —Y—O—Y—, —Y—[S(O)$_w$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

$Ar^1$, at each occurrence, is independently a monovalent or divalent $C_{6-14}$ aryl group or a 5-14 membered heteroaryl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;

$Cy^1$, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group; and $R^a$, at each occurrence, is independently selected from a $C_{1-40}$ alkyl group, a $C_{2-40}$ alkenyl group, a $C_{2-40}$ alkynyl group, a $C_{1-40}$ haloalkyl group, a $C_{1-40}$ alkoxy group, -L'-$R^b$, -L'-$Ar^2$, -L'-$Ar^2$—$Ar^2$, -L'-$Ar^2$—$R^b$, -L'-$Ar^2$—$Ar^2$—$R^b$, -L'-$Cy^2$, -L'-$Cy^2$-$Cy^2$, -L'-$Cy^2$-$R^b$, -L'-$Cy^2$-$Cy^2$-$R^b$;

wherein:
L', at each occurrence, is independently selected from —Y—O—Y—, —Y—[S(O)$_w$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

$Ar^2$, at each occurrence, is independently a monovalent or divalent $C_{6-14}$ aryl group or a 5-14 membered heteroaryl group, each optionally substituted with 1-5 substituents independently selected from halogen, —CN, oxo, =C(CN)$_2$, a $C_{1-6}$ alkyl group, a $C_{1-6}$ alkoxy group, and a $C_{1-6}$ haloalkyl group;

$Cy^2$, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;

$R^b$, at each occurrence, is independently selected from a $C_{1-40}$ alkyl group, a $C_{2-40}$ alkenyl group, a $C_{2-40}$ alkynyl group, a $C_{1-40}$ haloalkyl group, and a $C_{1-40}$ alkoxy group;

$R^c$, at each occurrence, is independently selected from H, a $C_{1-6}$ alkyl group, and a —Y—$C_{6-14}$ aryl group;

Y, at each occurrence, is independently selected from a divalent $C_{1-6}$ alkyl group, a divalent $C_{1-6}$ haloalkyl group, and a covalent bond; and w is 0, 1, or 2.

In various embodiments, $M_1$ can be selected from:

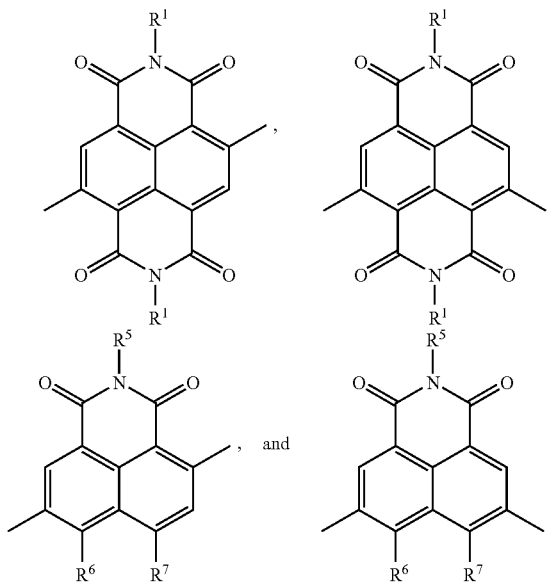

wherein the napthalene core can be optionally substituted with 1-2 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)$NH_2$, —C(O)NH—$C_{1-20}$ alkyl, —C(O)N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, a $C_{1-20}$ alkyl group, a $C_{1-20}$ alkenyl group, and a $C_{1-20}$ haloalkyl group; and
$R^1$, $R^5$, $R^6$, and $R^7$ are as defined herein.

In some embodiments, substitution of alkyl chains (and similar groups such as haloalkyl groups, arylalkyl groups, heteroarylalkyl groups and so forth) on one or both imide nitrogen atoms can improve solubility of the polymer in an organic solvent. Accordingly, in certain embodiments, $R^1$ can be a linear or branched $C_{3-40}$ alkyl group, examples of which include an n-hexyl group, a 1-methylpropyl group, a 1-methylbutyl group, a 1-methylpentyl group, a 1-methylhexyl group, a 1-ethylpropyl group, a 1-ethylbutyl group, a 1-3, dimethylbutyl group, and a 2-octyldodecyl group. In certain embodiments, $R^1$ can be a linear or branched $C_{3-40}$ alkenyl group. In particular embodiments, $R^1$ can be a branched $C_{3-20}$ alkyl group or a branched $C_{3-20}$ alkenyl group. For example, $R^1$, at each occurrence, independently can be selected from the following:

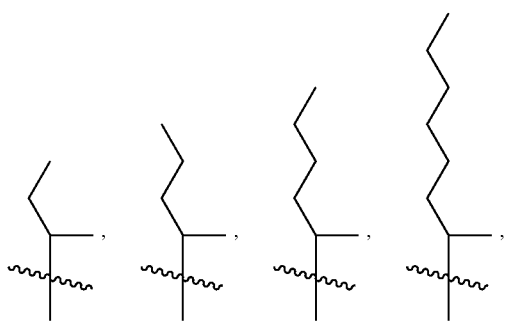

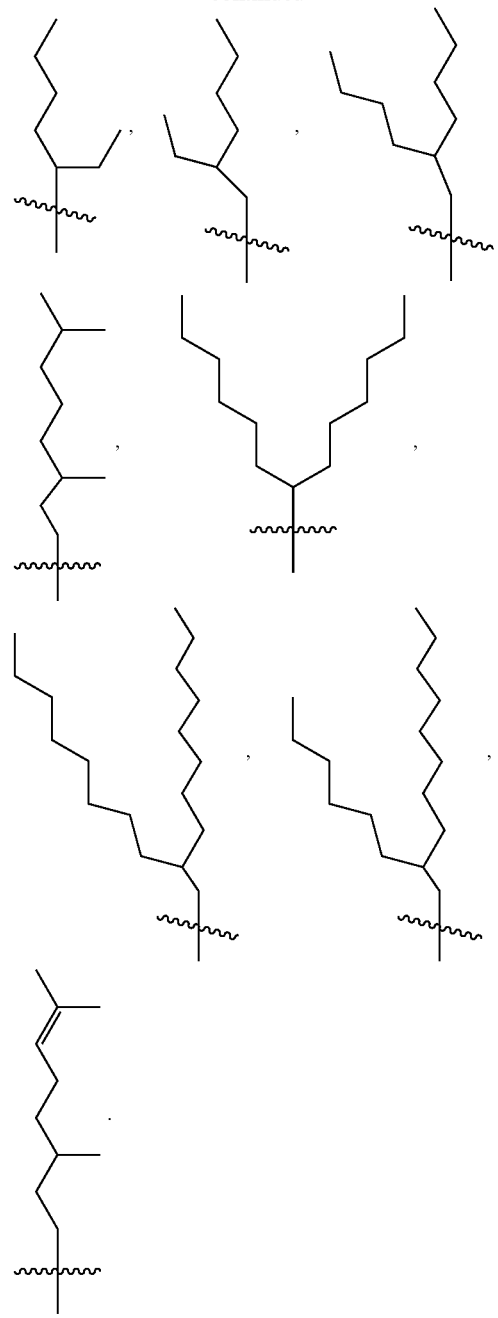

In certain embodiments, $R^1$, at each occurrence, can be a linear or branched $C_{6-40}$ alkyl or alkenyl group, an arylalkyl group optionally substituted with a linear or branched $C_{6-40}$ alkyl or alkenyl group, an aryl group (e.g., a phenyl group) substituted with a linear or branched $C_{6-40}$ alkyl or alkenyl group, or a biaryl group (e.g., a biphenyl group) optionally substituted with a linear or branched $C_{6-40}$ alkyl or alkenyl group, wherein each of these groups optionally can be substituted with 1-5 halo groups (e.g., F). In some embodiments, $R^1$ can be a biaryl group wherein the two aryl groups are covalently linked via a linker (L'). For example, the linker can be a divalent $C_{1-6}$ alkyl group or a carbonyl group. In particular embodiments, $R^1$, at each occurrence, independently can be selected from:

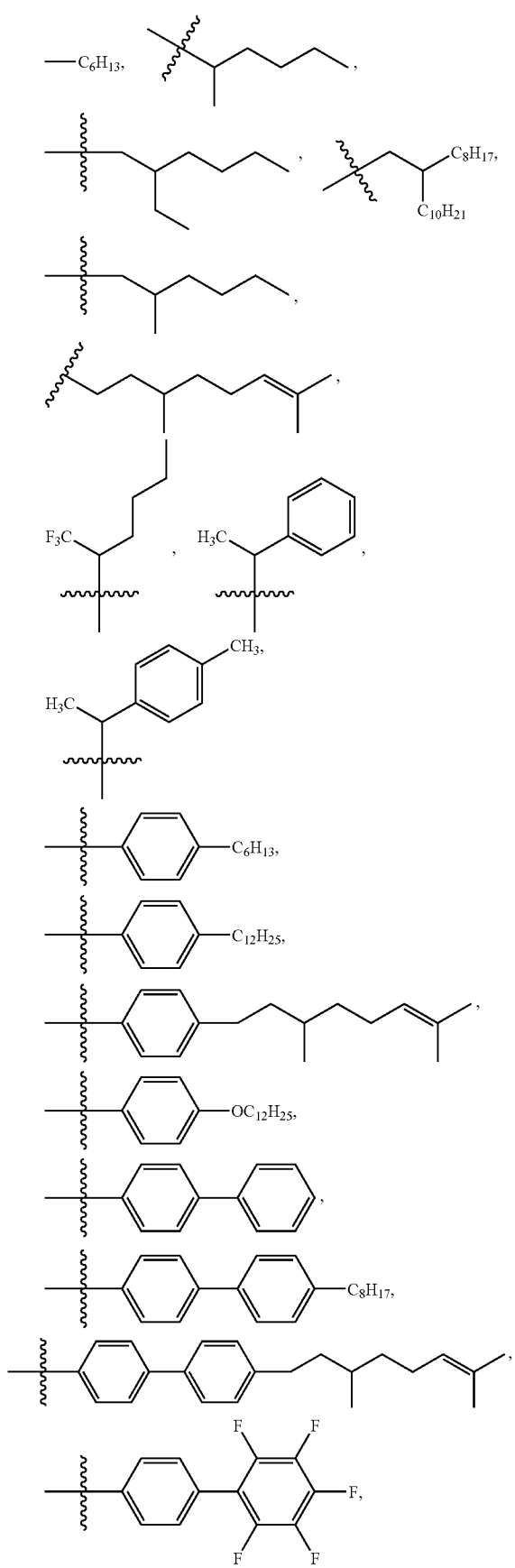
In some embodiments, $R^1$ can be an optionally substituted $C_{6-14}$ cycloalkyl group. For example, $R^1$, at each occurrence, independently can be selected from:
In various embodiments, the polymers of the present teachings can include a comonomer $M_2$ having a formula selected from:

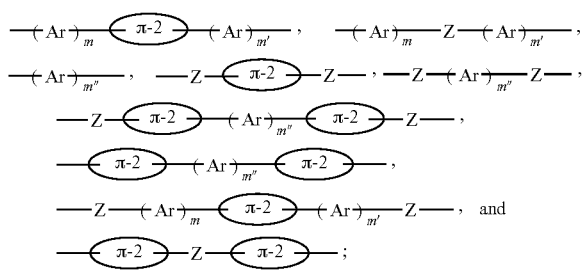

wherein:

π-2 is an optionally substituted polycyclic moiety;

Ar, at each occurrence, is independently an optionally substituted monocyclic aryl or heteroaryl group;

Z is a conjugated linear linker; and m, m' and m" independently are 0, 1, 2, 3, 4, 5 or 6.

In some embodiments, π-2 can be a polycyclic $C_{8-24}$ aryl group or a polycyclic 8-24 membered heteroaryl group, wherein each of these groups can be optionally substituted with 1-6 $R^e$ groups, wherein:

$R^e$, at each occurrence, is independently a) halogen, b) —CN, c) —NO$_2$, d) oxo, e) —OH, =C(R$^f$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^f$, at each occurrence, is independently a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-20}$ alkyl, m) —S(O)$_2$OH, n) —S(O)$_w$—OC$_{1-20}$ alkyl, o) —S(O)$_w$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_w$NH$_2$, al) —S(O)$_w$NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$N(C$_{1-20}$ alkyl)-C$_{6-14}$ aryl, am) —S(O)$_w$N(C$_{6-14}$ aryl)$_2$, an) —SiH$_3$, ao) —SiH(C$_{1-20}$ alkyl)$_2$, ap) —SiH$_2$(C$_{1-20}$ alkyl), aq) —Si(C$_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group; and w is 0, 1, or 2.

For example, π-2 can have a planar and highly conjugated cyclic core which can be optionally substituted as disclosed herein. In various embodiments, π-2 can have a reduction potential (versus an SCE electrode and measured in, for instance, a THF solution) greater than (i.e., more positive than) about −3.0 V. In certain embodiments, π-2 can have a reduction potential greater than or equal to about −2.2 V. In particular embodiments, π-2 can have a reduction potential greater than or equal to about −1.2 V. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P. In certain embodiments, π-2 can include at least one electron-withdrawing group.

In certain embodiments, π-2 can include two or more (e.g., 2-4) fused rings where each ring can be a five-, six-, or seven-membered ring optionally substituted with 1-6 $R^e$ groups, wherein $R^e$ is as defined herein. For example, in the various embodiments described herein, $R^e$ can be an electron-withdrawing group such as a halogen, —CN, oxo, =C(R$^f$)$_2$, a $C_{1-20}$ alkoxy group, a $C_{1-20}$ alkylthio group, or a $C_{1-20}$ haloalkyl group. In certain embodiments, $R^e$ can be a halogen (e.g., F, Cl, Br, or I), —CN, a $C_{1-6}$ alkoxy group, —OCF$_3$, or —CF$_3$. In particular embodiments, $R^e$ can be =O, —CN, =C(CN)$_2$, F, Cl, Br, or I.

In some embodiments, π-2 can include a monocyclic ring (e.g., a 1,3-dioxolane group or a derivative thereof including optional substituents and/or ring heteroatoms) covalently bonded to a second monocyclic ring or a polycyclic system via a spiroatom (e.g., a Spiro carbon atom).

In some embodiments, π-2 can be selected from:

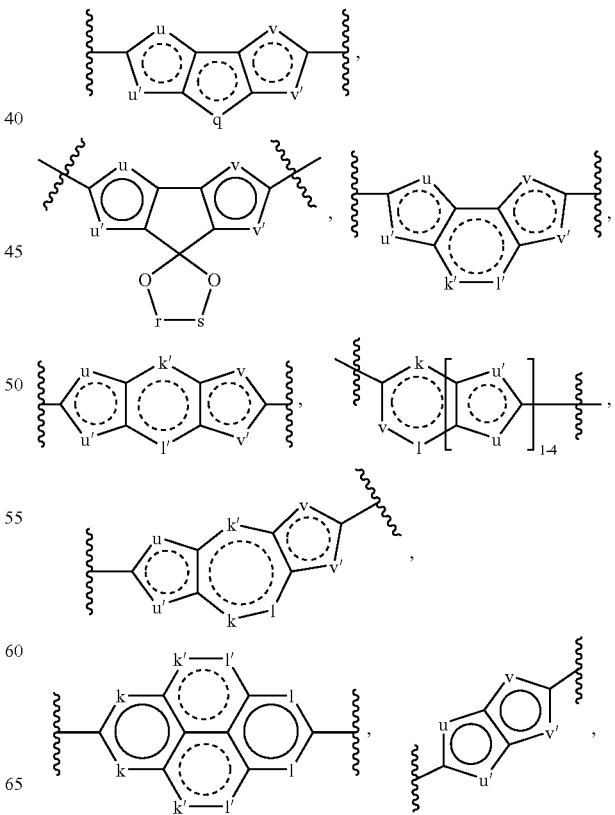

-continued

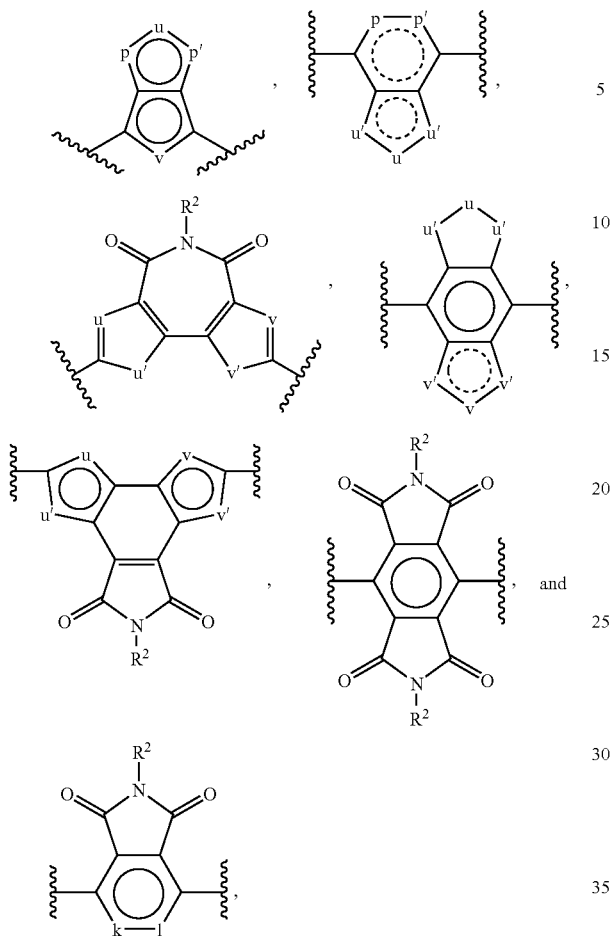

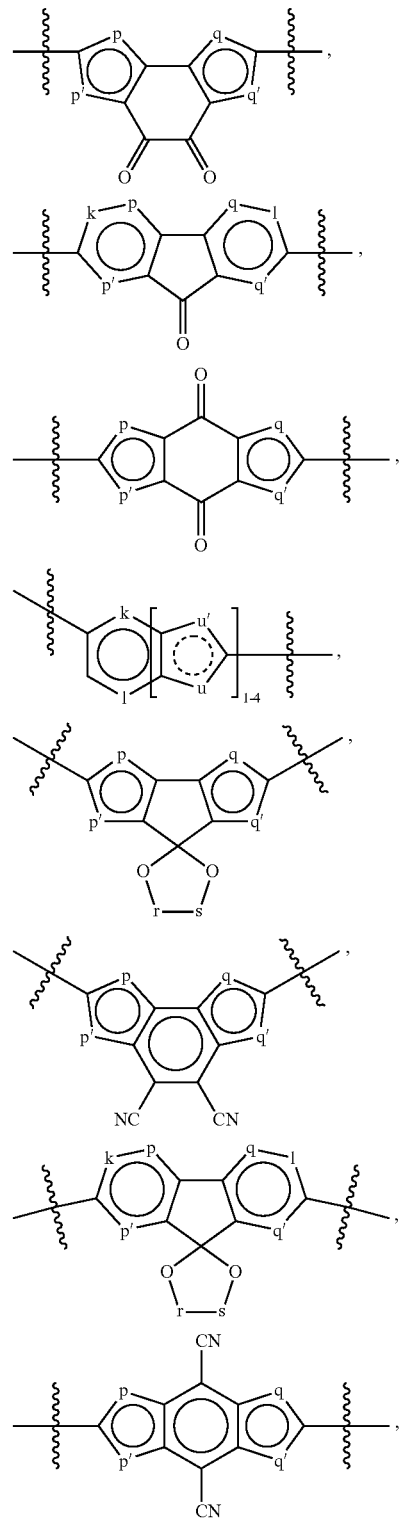

wherein:

k, k', l and l' independently can be selected from —CR²═, ═CR²—, —C(O)—, and —C(C(CN)₂)—;

p, p', q and q' independently can be selected from —CR²═, ═CR²—, —C(O)—, —C(C(CN)₂)—, —O—, —S—, —N═, ═N—, —N(R²)—, —SiR²═, ═SiR²—, and —SiR²R²—;

r and s independently can be —CR²R²— or —C(C(CN)₂)—;

u, u', v and v' independently can be selected from —CR²═, ═CR²—, —C(O)—, —C(C(CN)₂)—, —S—, —S(O)—, —S(O)₂—, —O—, —N═, ═N—, —SiR²═, ═SiR²—, —SiR²R²—, —CR²R²—CR²R²—, and —CR²═CR²—; and R², at each occurrence, independently can be H or R$^e$, wherein R$^e$ is as defined herein.

In certain embodiments, π-2 can be selected from:

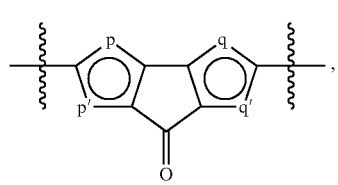

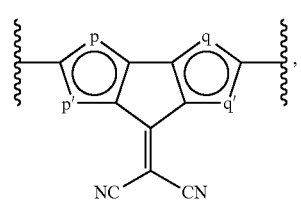

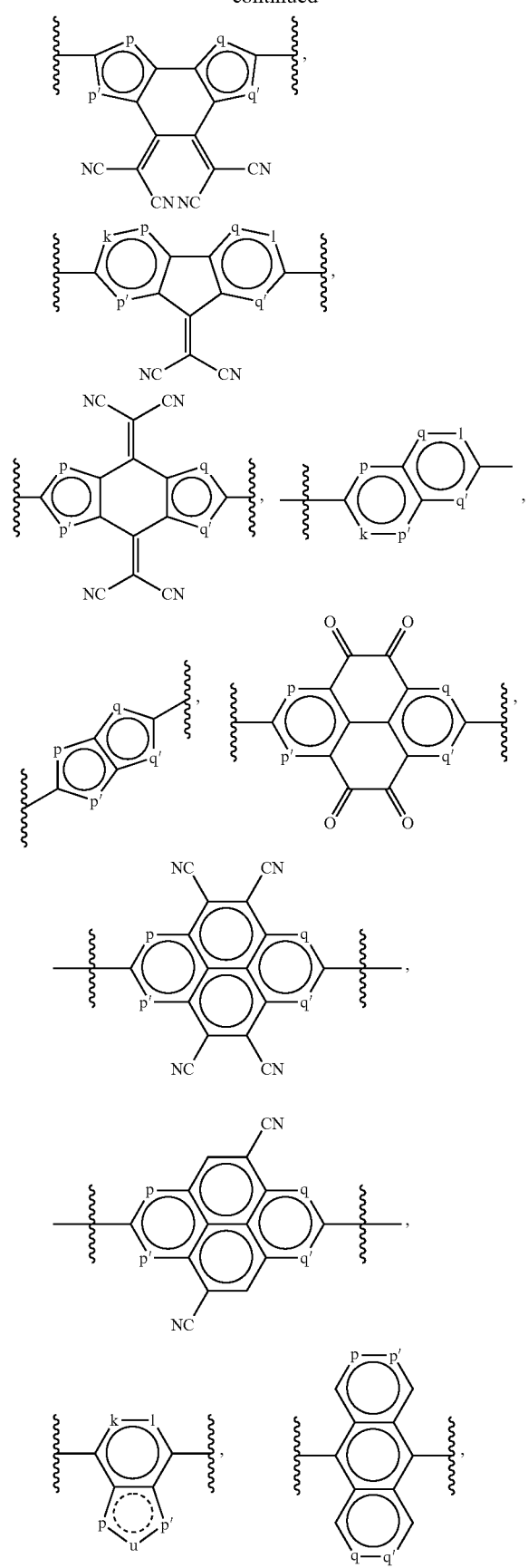
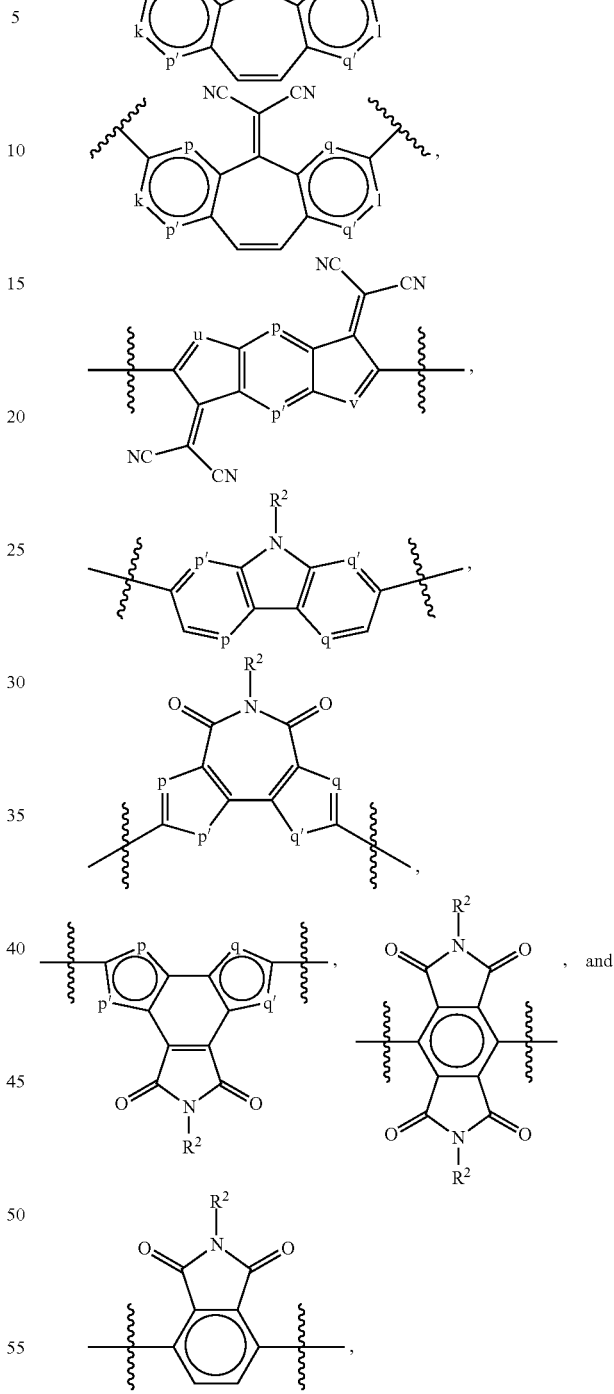

where k, l, p, p', q, q', r, s and $R^2$ are as defined herein. In some embodiments, k and l independently can be selected from $-CR^2=$, $=CR^2-$, and $-C(O)-$; p, p', q, and q' independently can be selected from $-O-$, $-S-$, $-N(R^2)-$, $-N=$, $=N-$, $-CR^2=$, and $=CR^2-$; u and v independently can be selected from $-CR^2=$, $=CR^2-$, $-C(O)-$, $-C(C(CN)_2)-$, $-S-$, $-O-$, $-N=$, $=N-$, $-CR^2R^2-CR^2R^2-$, and $-CR^2=CR^2-$; where $R^2$ is as defined herein. For example, $R^2$, at each occurrence, independently can be selected from H, a halogen, —CN, —OR$^c$, —N(R$^c$)$_2$, a C$_{1-20}$ alkyl group, and a C$_{1-20}$ haloalkyl group, where R$^c$ is as defined herein. Each of r and s can be CH$_2$.

In certain embodiments, π-2 can be a polycyclic moiety including one or more thienyl, thiazolyl, or phenyl groups, where each of these groups can be optionally substituted as disclosed herein. For example, π-2 can be selected from:

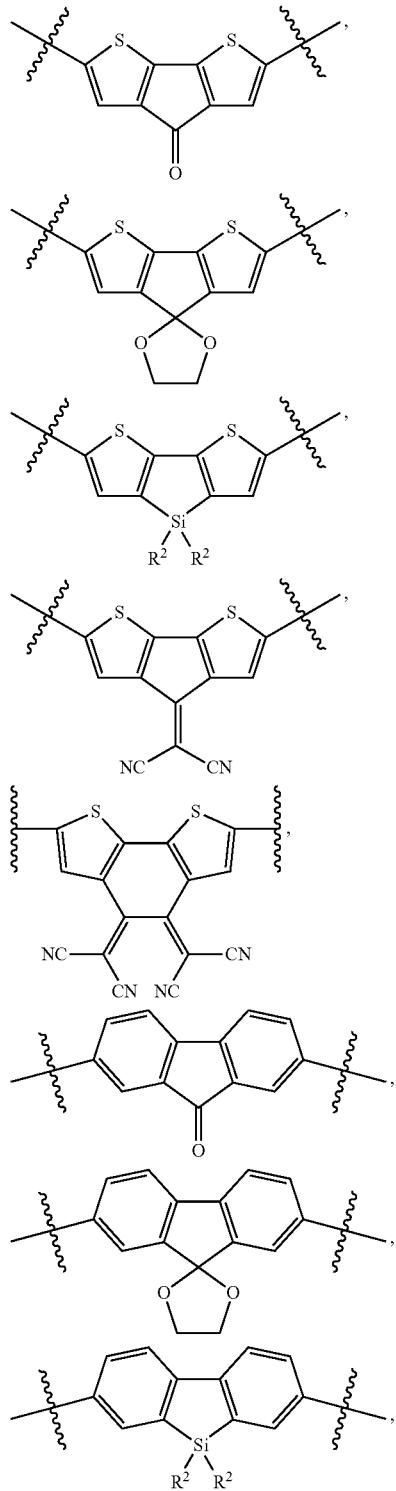

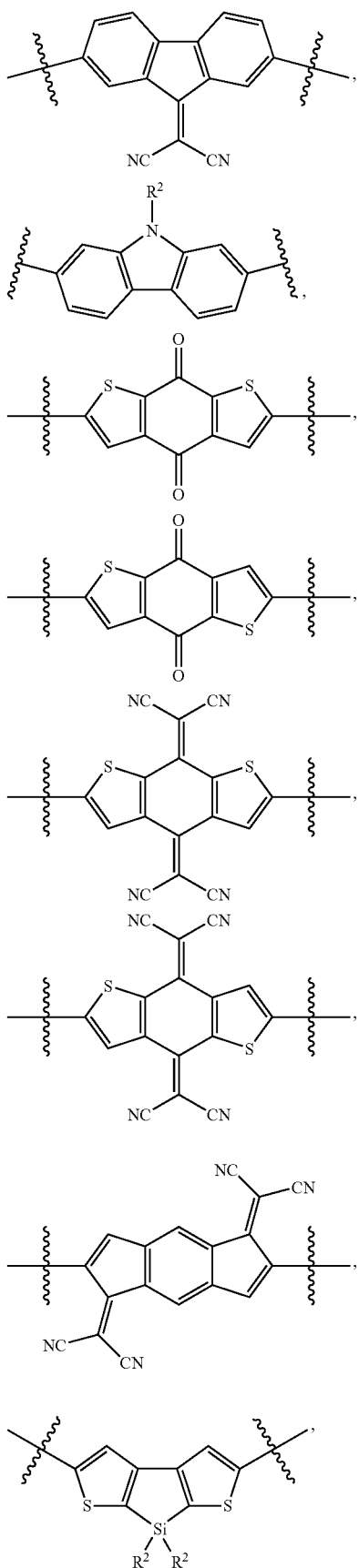

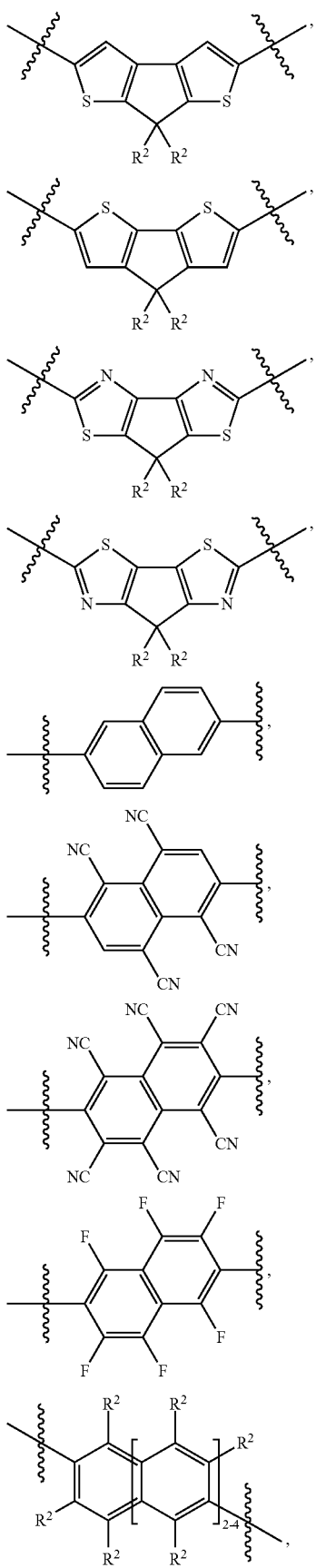
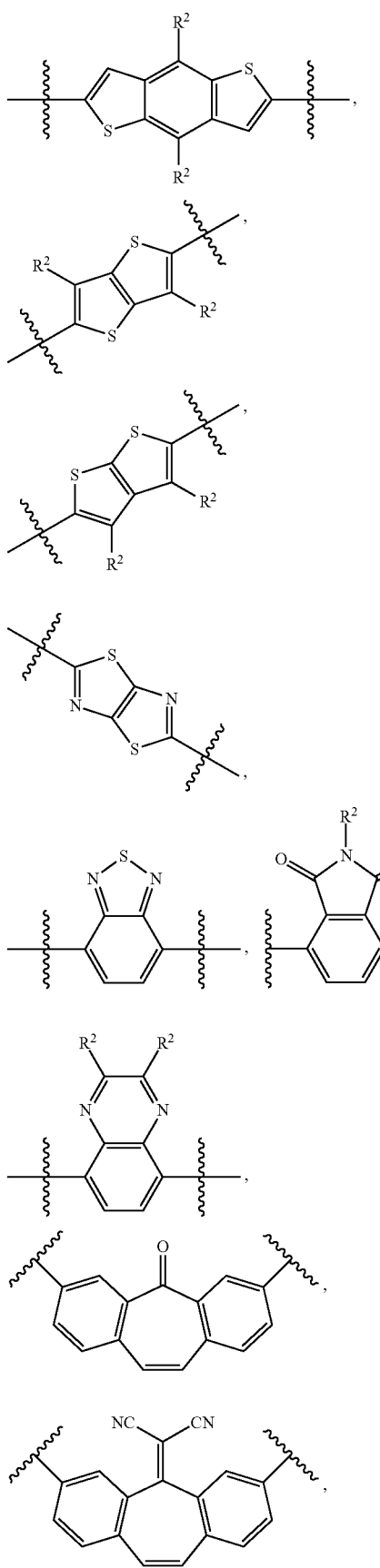

-continued

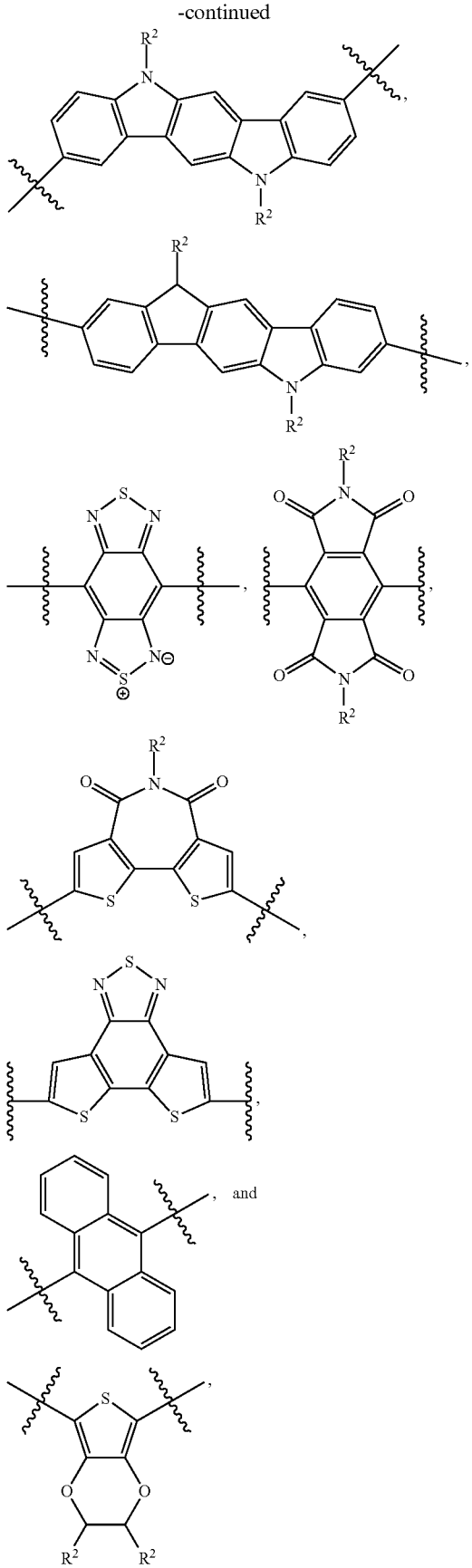

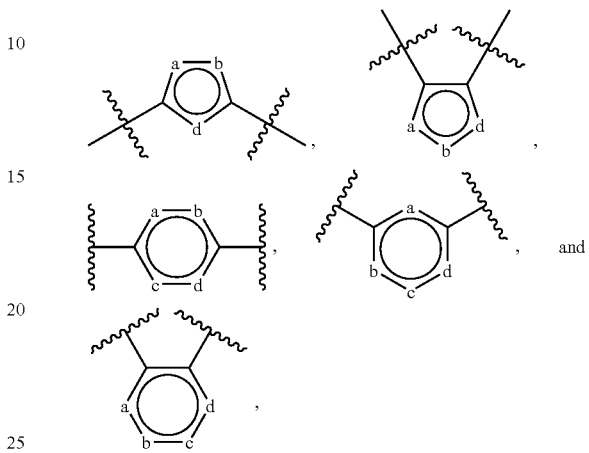

wherein R² is as defined herein. For example, R² can be selected from H, a $C_{1-20}$ alkyl group, a $C_{1-20}$ alkoxy group, and a $C_{1-20}$ haloalkyl group.

In some embodiments, Ar, at each occurrence, independently can be an optionally substituted monocyclic moiety selected from:

wherein:
a, b, c and d independently are selected from —S—, —O—, —CH=, =CH—, —CR³=, =CR³—, —C(O)—, —C(C(CN)₂)—, —N=, =N—, —NH— and —NR³—;
R³, at each occurrence, is independently selected from a) halogen, b) —CN, c) —NO₂, d) —N(R$^c$)₂, e) —OR$^c$, f) —C(O)R$^c$, g) —C(O)OR$^c$, h) —C(O)N(R$^c$)₂, i) a $C_{1-40}$ alkyl group, j) a $C_{2-40}$ alkenyl group, k) a $C_{2-40}$ alkynyl group, l) a $C_{1-40}$ alkoxy group, m) a $C_{1-40}$ alkylthio group, n) a $C_{1-40}$ haloalkyl group, o) a —Y—$C_{3-14}$ cycloalkyl group, p) a —Y—$C_{6-14}$ aryl group, q) a —Y-3-14 membered cycloheteroalkyl group, and r) a —Y-5-14 membered heteroaryl group, wherein each of the $C_{1-40}$ alkyl group, the $C_{2-40}$ alkenyl group, the $C_{2-40}$ alkynyl group, the $C_{3-14}$ cycloalkyl group, the $C_{6-14}$ aryl group, the 3-14 membered cycloheteroalkyl group, and the 5-14 membered heteroaryl group optionally is substituted with 1-5 R$^e$ groups; and
Y, R$^c$ and R$^e$ are as defined herein.

Depending on whether it is located within the polymeric backbone or it constitutes one of the end groups of the polymer, Ar can be divalent or monovalent. In certain embodiments, each Ar can be independently a 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$ haloalkyl group, NH₂, NH($C_{1-6}$ alkyl) and N($C_{1-6}$ alkyl)₂. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$ alkoxy group, a $C_{1-6}$ haloalkyl group, NH₂, NH($C_{1-6}$ alkyl) and N($C_{1-6}$ alkyl)₂. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$ alkyl groups.

By way of example, $(Ar)_m$, $(Ar)_{m'}$, and $(Ar)_{m''}$ can be selected from:

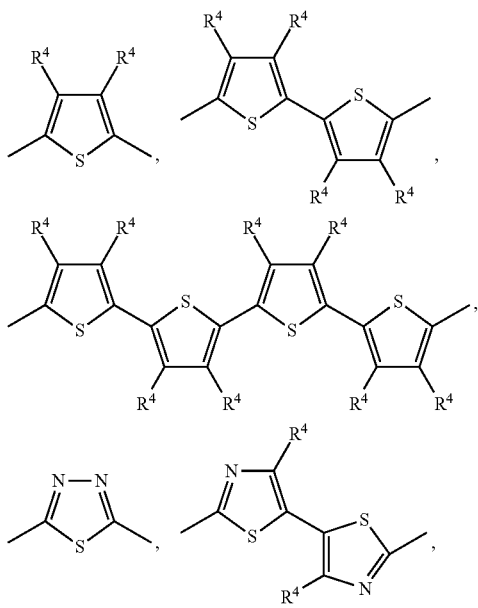

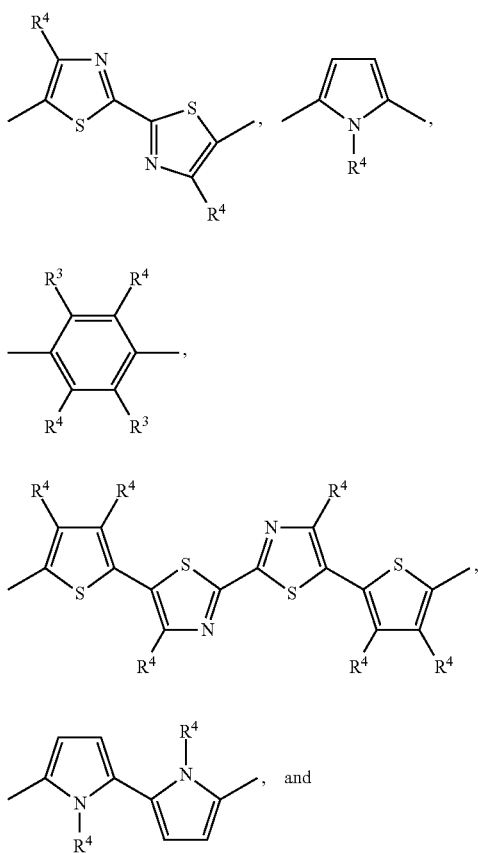

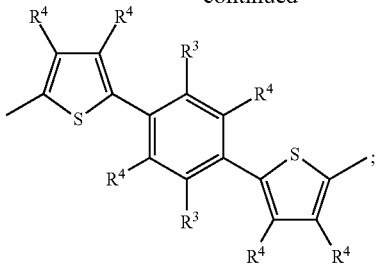

wherein $R^4$, at each occurrence, independently is H or $R^3$, and $R^3$ is as defined herein. In particular embodiments,

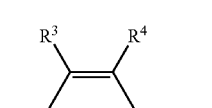 of

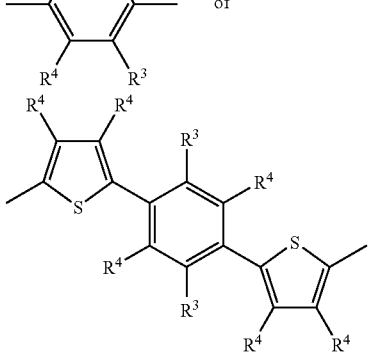

can be selected from:

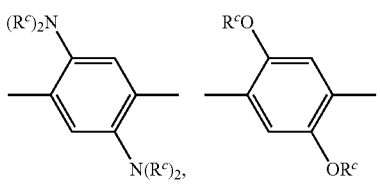

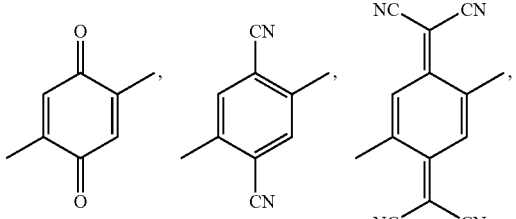

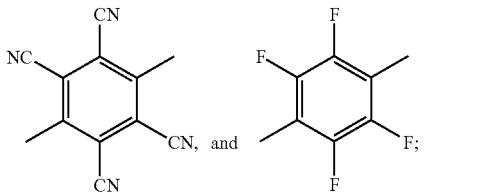

wherein $R^c$ is as defined herein.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

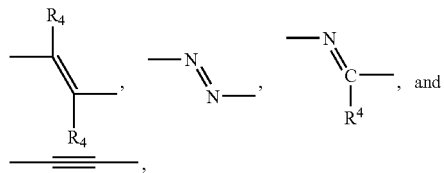

wherein $R^4$ is as defined herein. In certain embodiments, Z can be selected from:

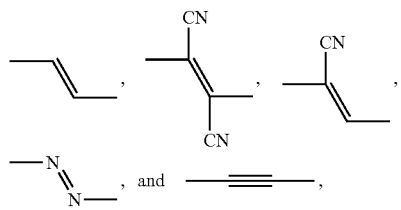

In some embodiments, $M_2$ can include at least one optionally substituted monocylic aryl or heteroaryl group. For example, $M_2$ can have the formula:

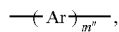

wherein m" is selected from 1, 2, 4, or 6; and Ar is as defined herein. For example, $M_2$ can be selected from:

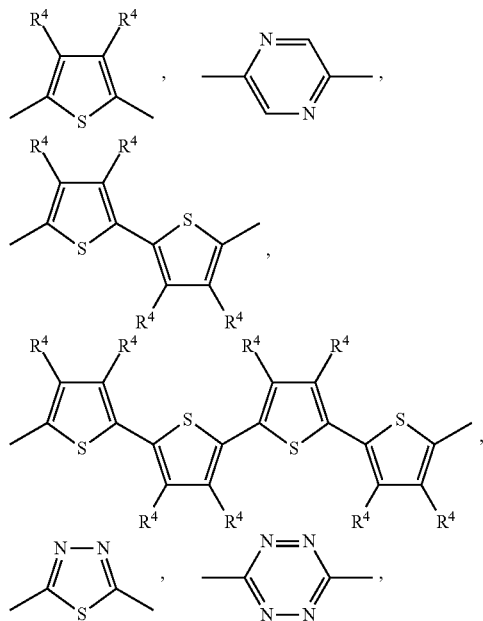

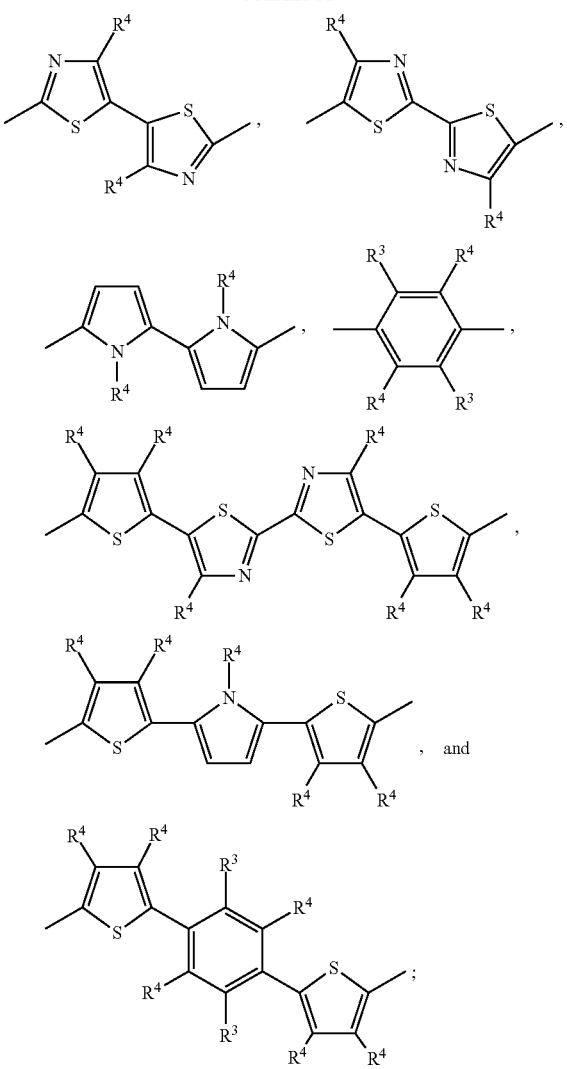

wherein $R^3$ and $R^4$ are as defined herein. In particular embodiments, $M_2$ can be selected from:

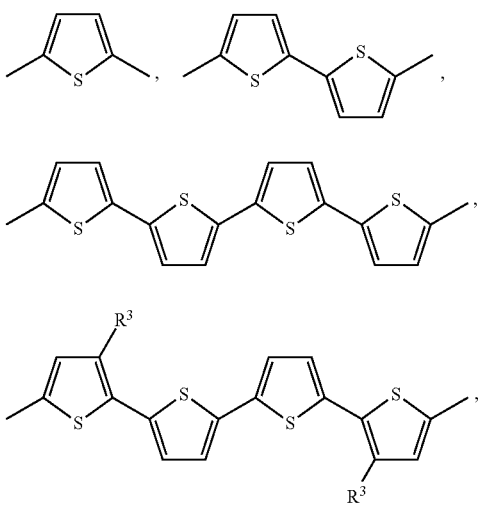

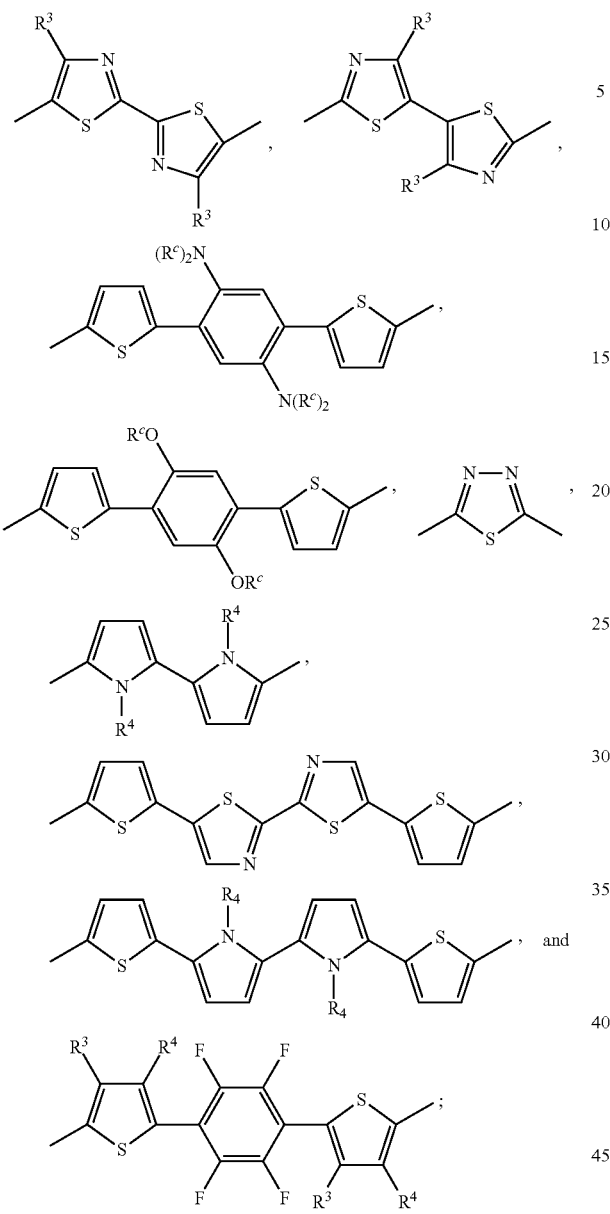

wherein $R^3$ can be independently selected from a halogen, —CN, a $C_{1-20}$ alkyl group, a $C_{1-20}$ alkoxy group, and a $C_{1-20}$ haloalkyl group; $R^4$ can be independently selected from H, a halogen, —CN, a $C_{1-20}$ alkyl group, a $C_{1-20}$ alkoxy group, and a $C_{1-20}$ haloalkyl group; and $R^c$, at each occurrence, can be independently H or a $C_{1-6}$ alkyl group.

In some embodiments, $M_2$, in addition to the one or more optionally substituted monocyclic aryl or heteroaryl group, can include a linker. For example, $M_2$ can have the formula:

$$-\!\!-\!\!(\text{Ar})_m\!\!-\!\!Z\!\!-\!\!(\text{Ar})_{m'}\!\!-\!\!- \quad \text{or} \quad -\!\!-\!\!Z\!\!-\!\!(\text{Ar})_{m''}\!\!-\!\!Z\!\!-\!\!-,$$

wherein m and m' are selected from 1, 2, 4, or 6; m" is selected from 1, 2, 3, or 4; and Ar and Z are as defined herein. In certain embodiments, $M_2$ can be selected from:

wherein $R^4$ and $R^c$ are as defined herein.

In some embodiments, $M_2$, in addition to the one or more optionally substituted monocyclic aryl or heteroaryl group, can include one or more optionally substituted polycyclic moieties. For example, $M_2$ can have the formula:

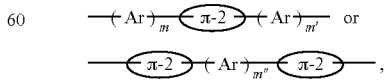

wherein m and m' are selected from 1, 2, 4, or 6; and Ar and π-2 are as defined herein. In certain embodiments, $M_2$ can be selected from:

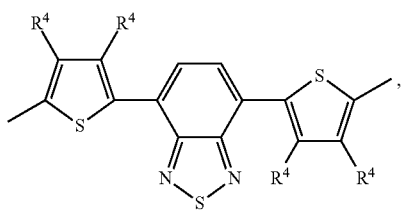

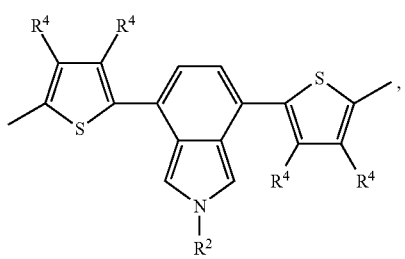

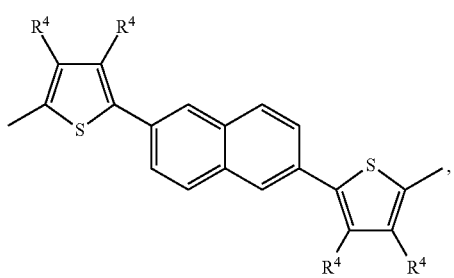

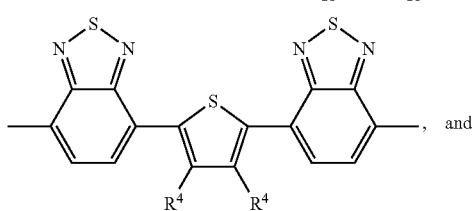

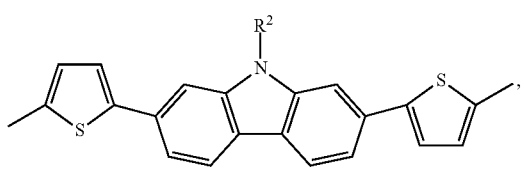

wherein $R^2$ and $R^4$ are as defined herein.

In some embodiments, $M_2$, in addition to the one or more optionally substituted monocyclic aryl or heteroaryl group, can include one or more linkers and/or optionally substituted polycyclic moieties. For example, $M_2$ can have a formula selected from:

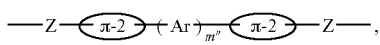

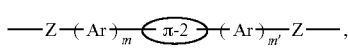

wherein m, m' and m" independently are 1, 2, 3 or 4; and Ar, π-2 and Z are as defined herein. In certain embodiments, $M_2$ can be selected from

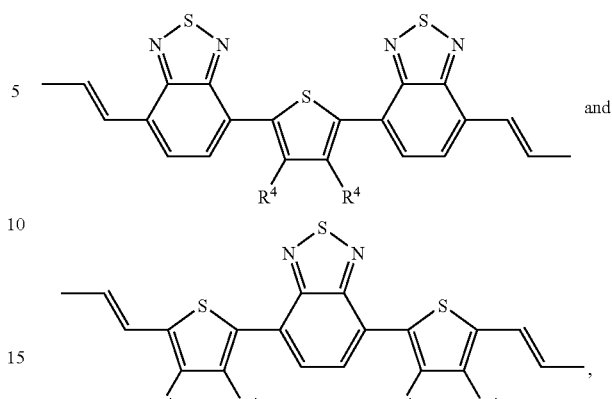

wherein $R^4$ is as defined herein.

In other embodiments, $M_2$ can have a formula selected from:

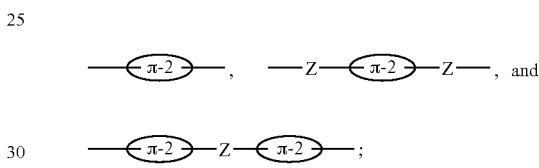

wherein π-2 and Z are as defined herein.

While the present teachings generally relate to copolymers of $M_1$ and $M_2$, homopolymers of $M_1$ are within the scope of the present teachings.

For the various polymers described above, n can be an integer in the range of 2 to 5,000. For example, n can be 2-1,000, 2-500, 2-400, 2-300, or 2-200. In certain embodiments, n can be 2-100. In some embodiments, n can be an integer between 3 and 1,000. In certain embodiments, n can be 4-1,000, 5-1,000, 6-1,000, 7-1,000, 8-1,000, 9-1,000, or 10-1,000. For example, n can be 8-500, 8-400, 8-300, or 8-200. In certain embodiments, n can be 8-100.

Accordingly, in certain embodiments, the polymers of the present teachings can include repeating units of Formula Ia, Ib, or both:

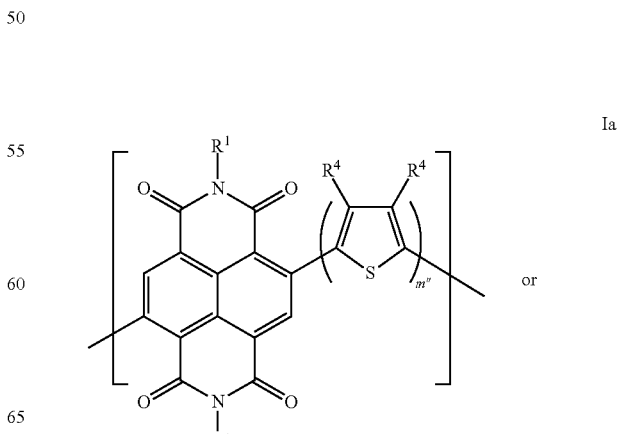

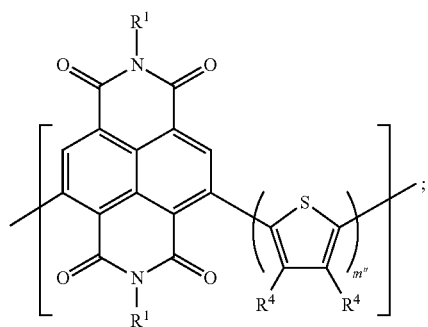

wherein $R^1$, $R^4$, and m" are as defined herein.

For example, in certain embodiments, polymers of the present teachings can include repeating units of one or more of Formulae Ia', Ib', Ia", and Ib":

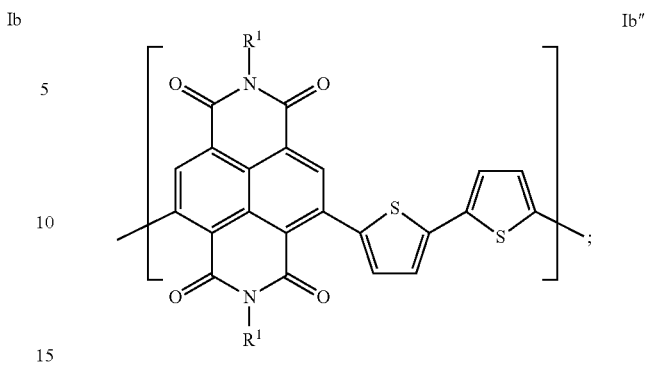

wherein $R^1$ is as defined herein.

Certain embodiments of the polymers of the present teachings can include repeating units of one or more of Formula Ia''', Ib''', Ia'''', and Ib'''':

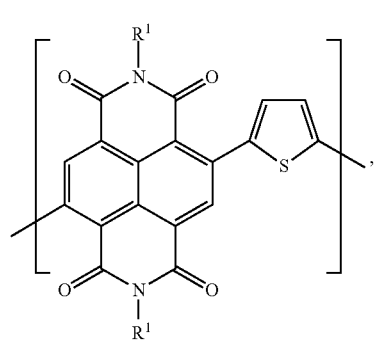

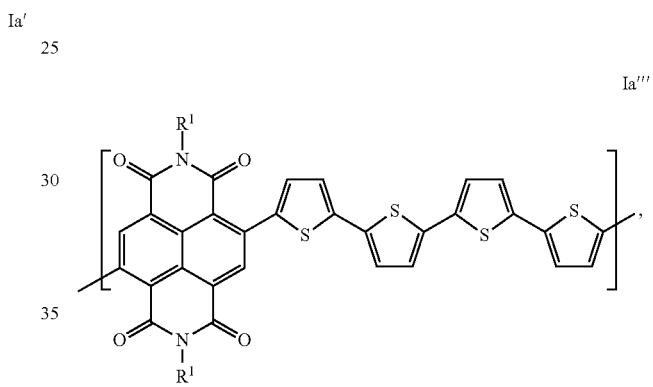

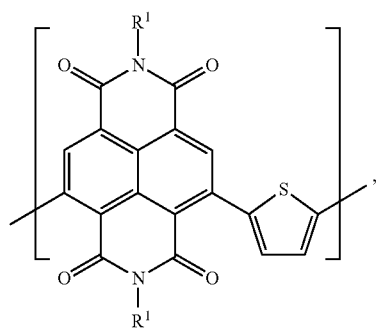

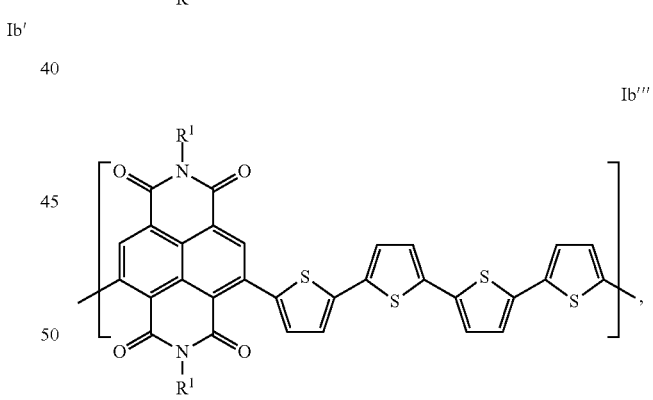

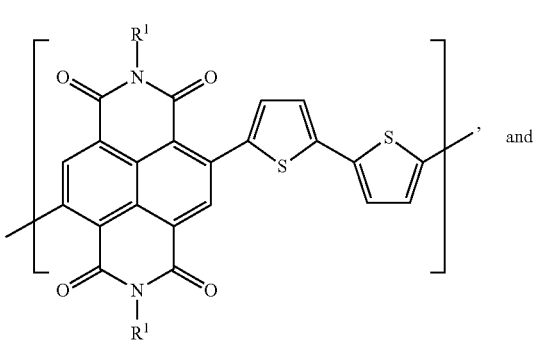

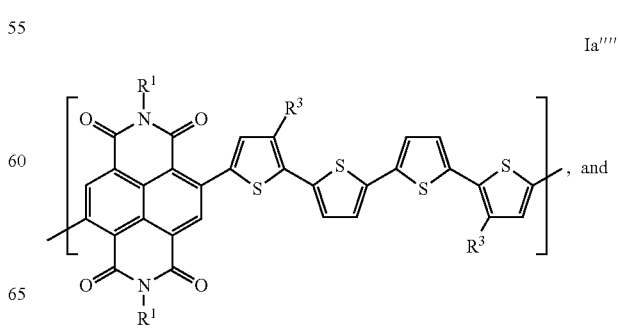

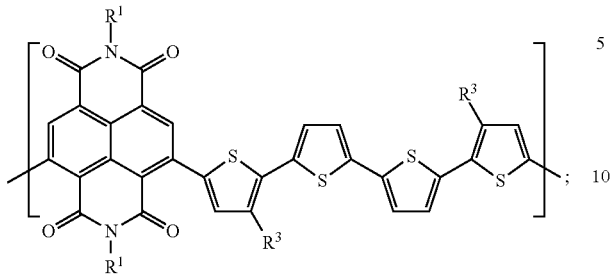

wherein $R^1$ and $R^3$ are as defined herein. For example, $R^3$, at each occurrence, can be independently selected from a halogen, —CN, a $C_{1-40}$ alkyl group, a $C_{1-40}$ alkoxy group, and a $C_{1-40}$ haloalkyl group.

In some embodiments, the polymers of the present teachings can include one or more repeating units of Formulae Ic, Id, Ie, and If:

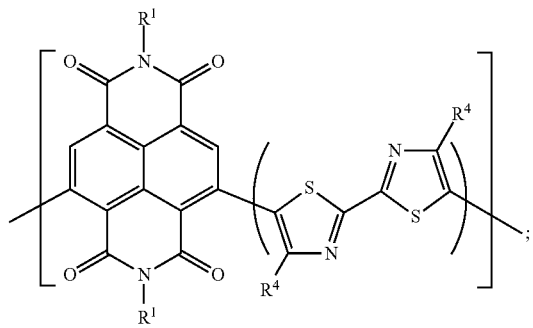

wherein $R^1$ and $R^4$ are as defined herein.

For example, in certain embodiments, polymers of the present teachings can include repeating units of one or more of Formula Ic', Id', Ie', and If':

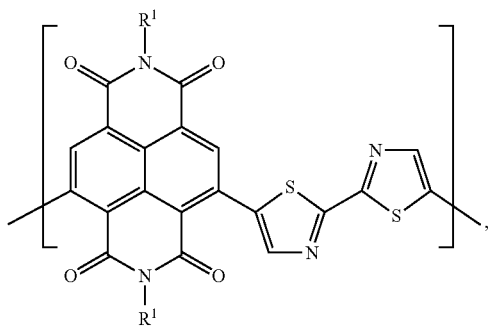

If' wherein $R^1$ is as defined herein.

In certain embodiments, the polymers of the present teachings can include a repeating unit of Formula Ig, Ih, or both:

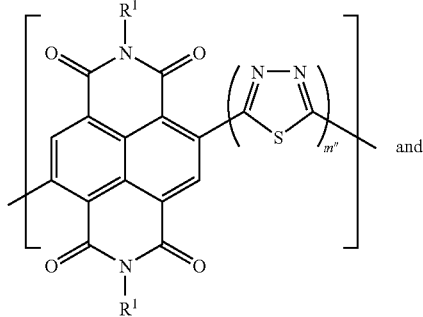

Ig

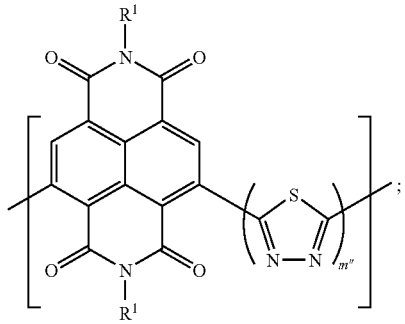

Ih wherein $R^1$ and m" are as defined herein.

In certain embodiments, the polymers of the present teachings can include a repeating unit of Formula Ii', Ij', or both:

Ii'

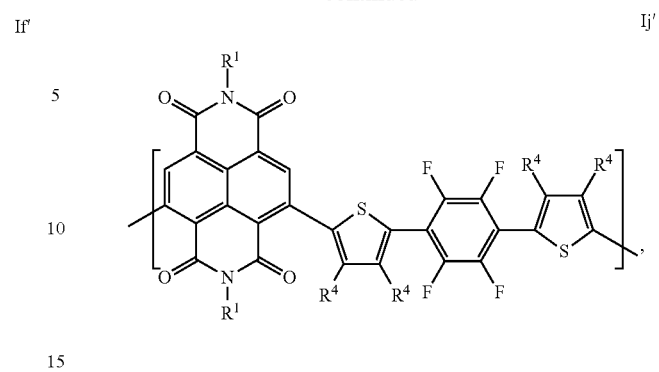

Ij' and wherein $R^1$ is as defined herein.

In certain embodiments, the polymers of the present teachings can include repeating units of Formula IIa, IIb, or both:

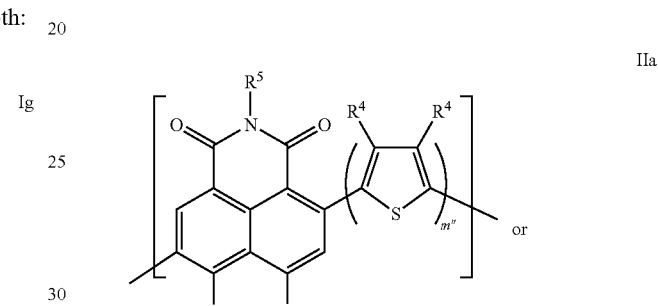

IIa or

IIb

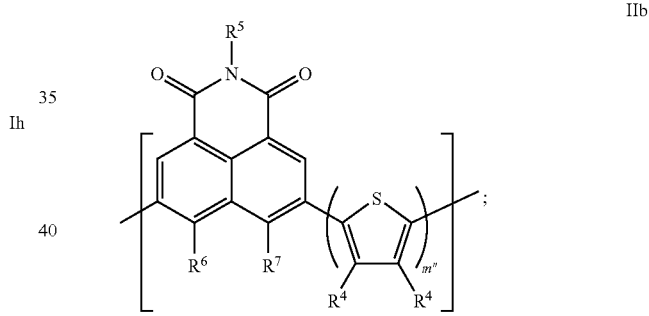

wherein $R^4$, $R^5$, $R^6$, $R^7$, and m" are as defined herein. In some embodiments, $R^6$ and $R^7$ independently can be selected from H, a halogen, —CN, and a $C_{1-10}$ haloalkyl group. For example, $R^6$ and $R^7$ independently can be H, a halogen (e.g., F, Cl, and Br), or —CN.

In certain embodiments, the polymers of the present teachings can include one or more repeating units of Formulae IIc, IId, IIe, and IIf:

IIc

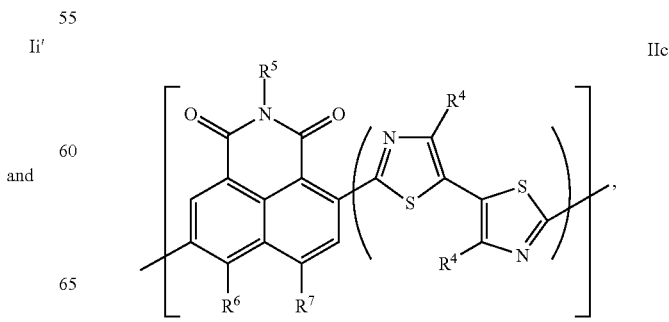

IId
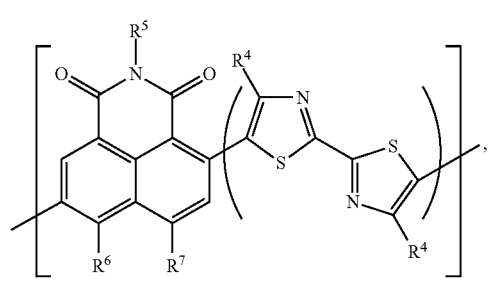
IIe
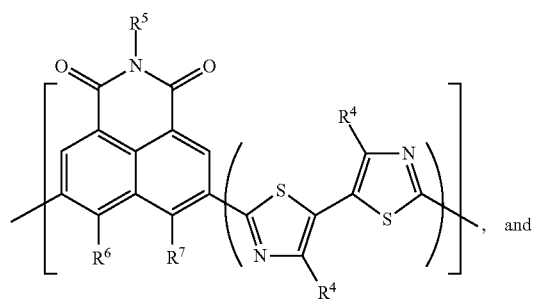
, and
IIf
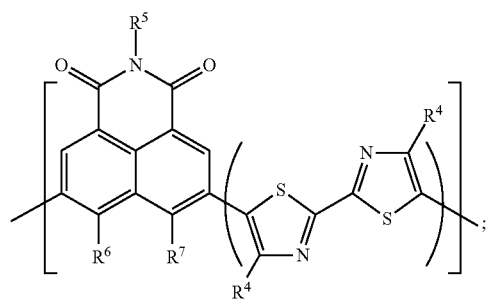
;
wherein $R^4$, $R^5$, $R^6$, and $R^7$ are as defined herein.
Further examples of polymers according to the present teachings can include repeating units of one or more of Formulae IIIa', IIIa'', Va', Va'', Vb', Vb'', Vc', and Vc'':
IIIa'
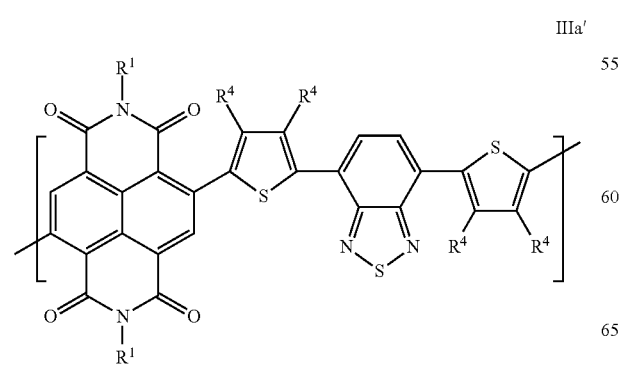
IIIa''
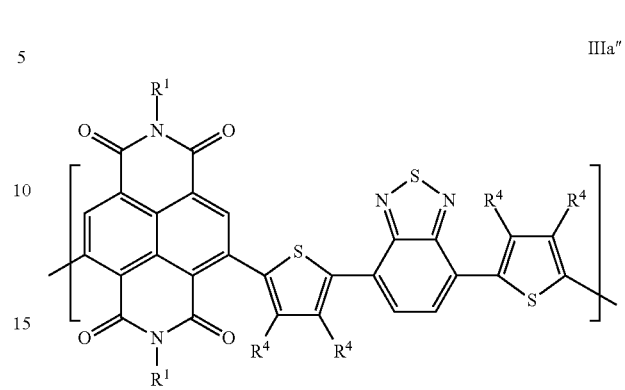
Va'
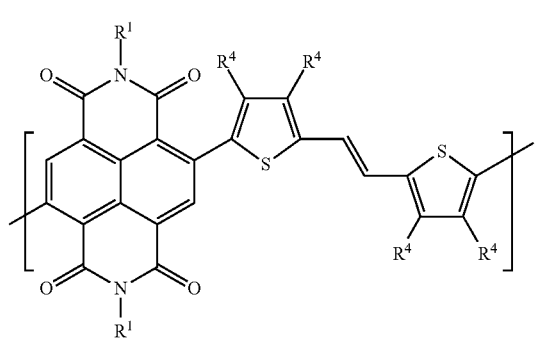
Va''
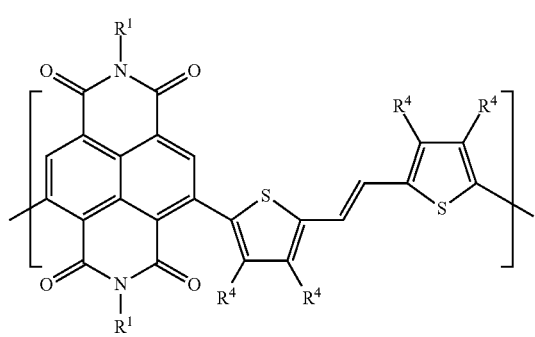
Vb'
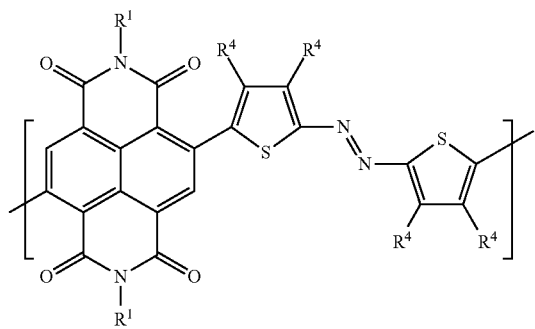

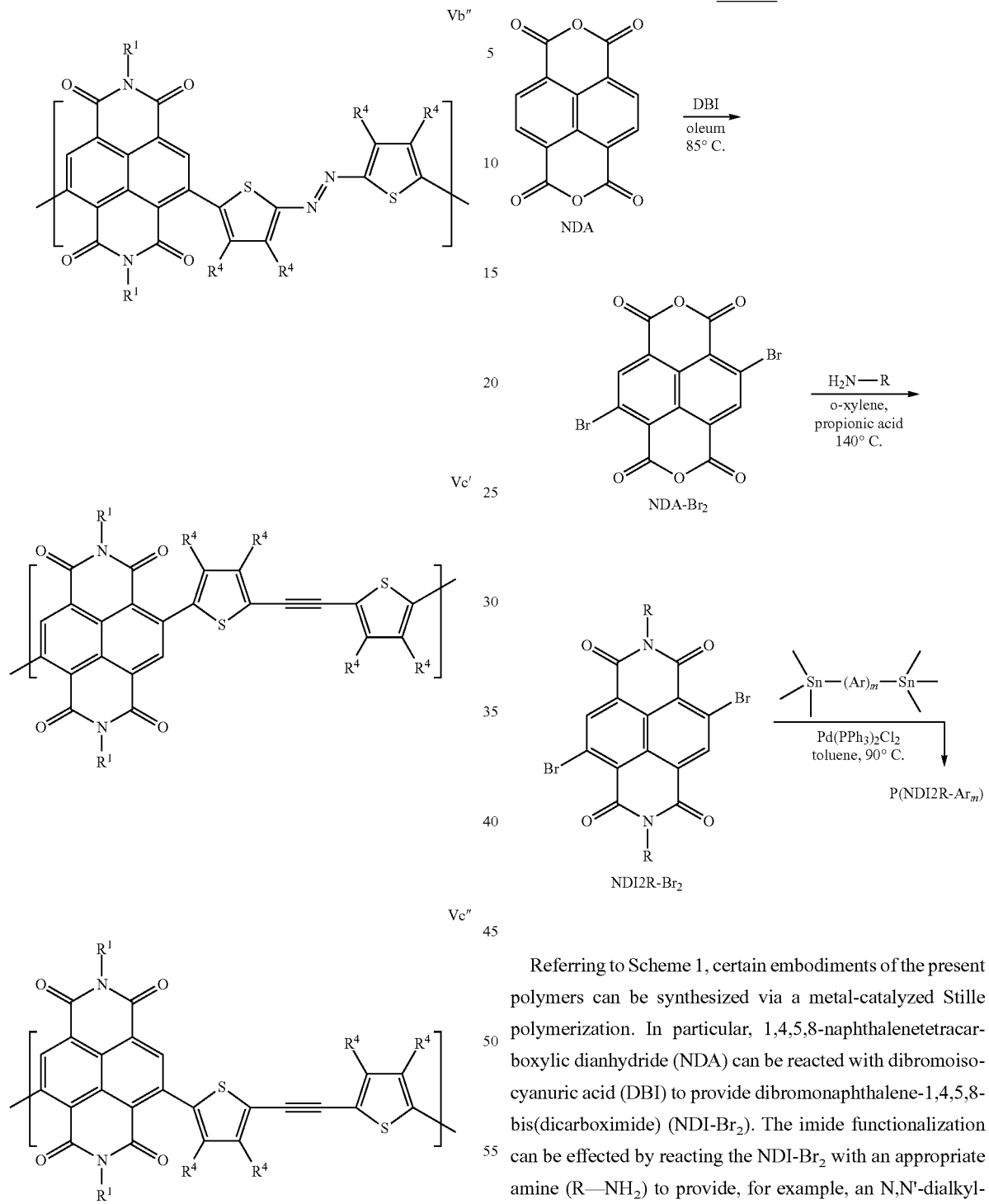

wherein R¹ and R⁴ are as defined herein.

Certain embodiments of the present polymers can be prepared in accordance with the procedures outlined in Scheme 1 below:

Referring to Scheme 1, certain embodiments of the present polymers can be synthesized via a metal-catalyzed Stille polymerization. In particular, 1,4,5,8-naphthalenetetracarboxylic dianhydride (NDA) can be reacted with dibromoisocyanuric acid (DBI) to provide dibromonaphthalene-1,4,5,8-bis(dicarboximide) (NDI-Br$_2$). The imide functionalization can be effected by reacting the NDI-Br$_2$ with an appropriate amine (R—NH$_2$) to provide, for example, an N,N'-dialkyl-naphthalene-1,4,5,8-bis(dicarboximide) (NDI2R-Br$_2$). Polymerization of NDI2R-Br$_2$ with the appropriate organotin compound in the presence of a metal catalyst such as dichloro-bis(triphenylphosphine)palladium (II) (Pd(PPh$_3$)$_2$Cl$_2$) leads to the desired polymer.

Scheme 2 below shows an alternative synthesis for preparing certain embodiments of the present polymers:

Scheme 2

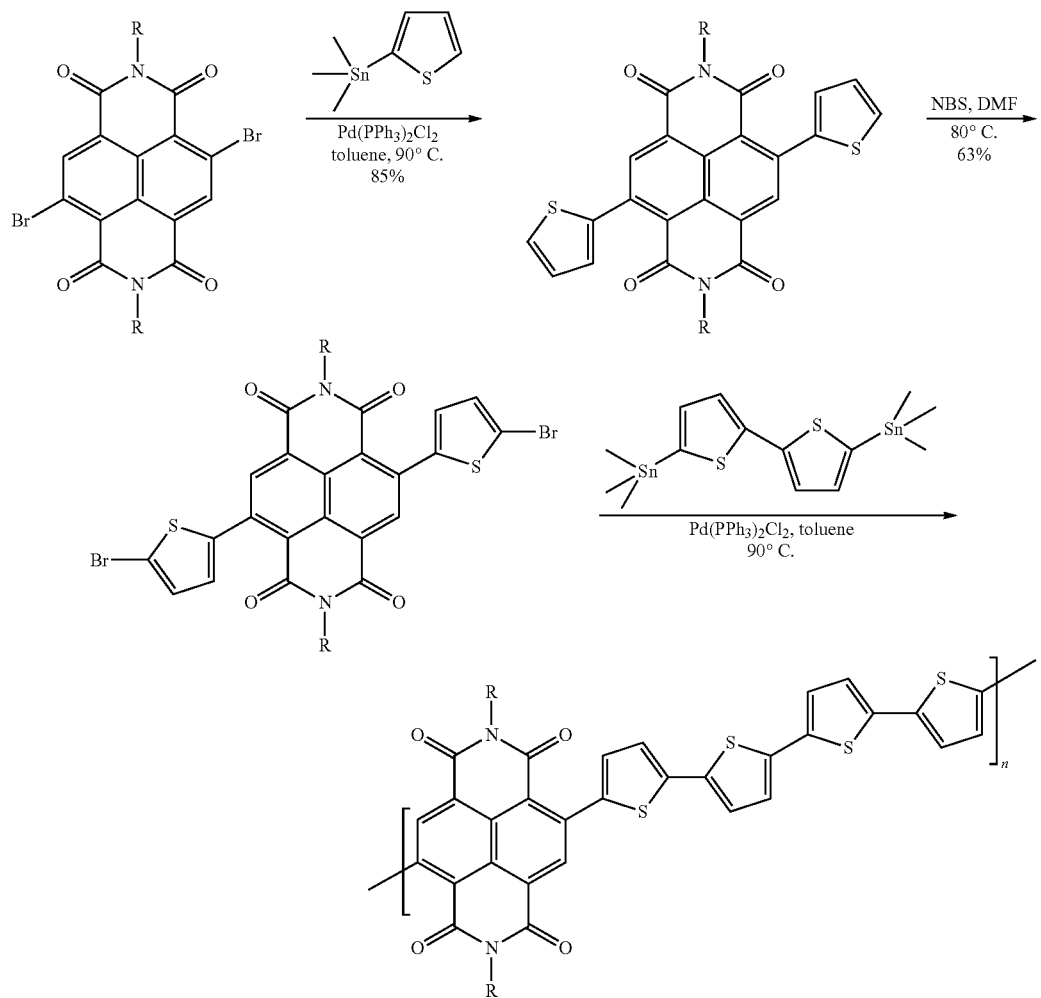

Other polymers of the present teachings can be prepared according to procedures analogous to those described in Schemes 1 and 2. Alternatively, the present polymers can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the polymers described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Without wishing to be bound by any particular theory, it is believed that polymers of the present teachings that have a regioregular polymeric backbone can lead to higher molecular weights, a more π-conjugated structure and, consequently better charge transport efficiencies. Accordingly, in preparing the present polymers, the present teachings can include isolating a particular average molecular weight fractions, and/or enriching and/or isolating NDIR-Br$_2$ (and the corresponding dibromonaphthalene dicarboximide) as enriched or pure 2,6-diastereoisomers. Because the isolation of 2,6-dibromonaphthalene-1,4,5,8-bis(dicarboximide) from the isomeric mixture can be carried out easily and efficiently, the present polymers include those having the Formulae I', II', III', IV', V', VI', VII', VIII', IX', X', XI', XII', XIII', XIV', XV', or XVI':

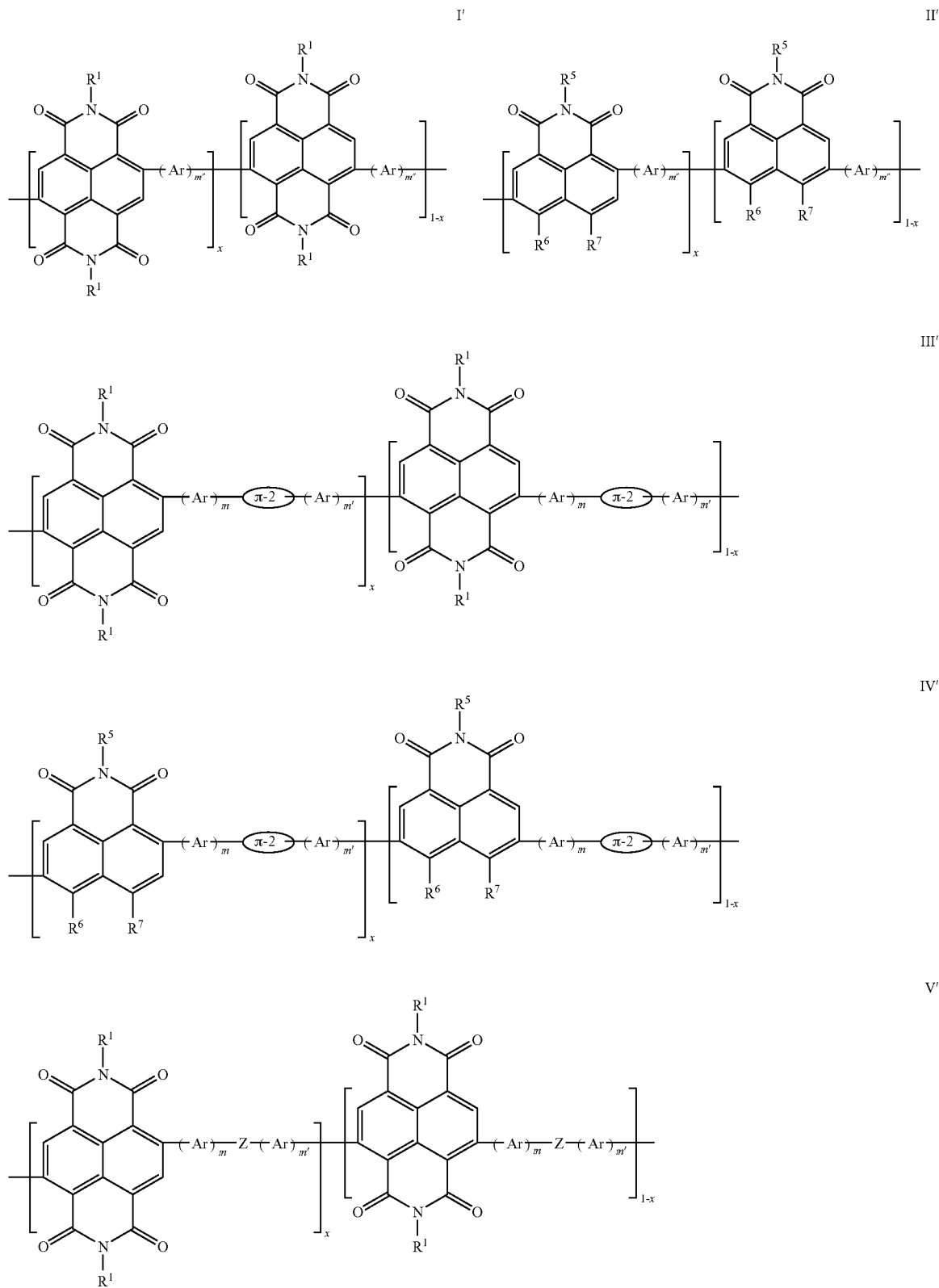

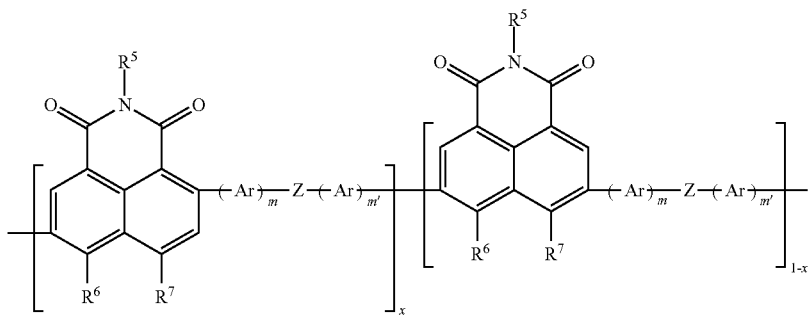
VI'
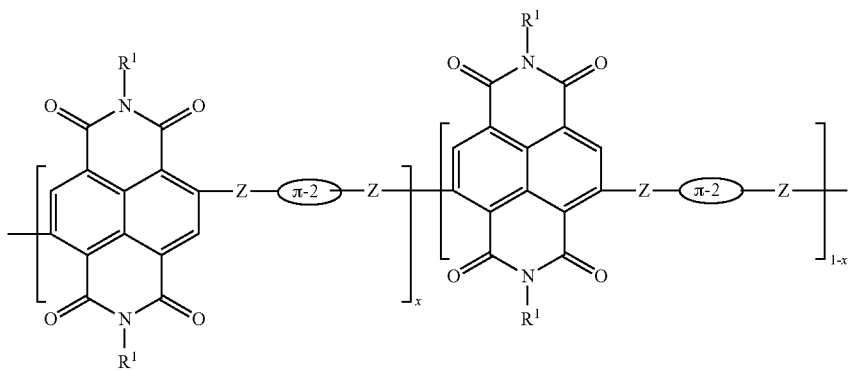
VII'
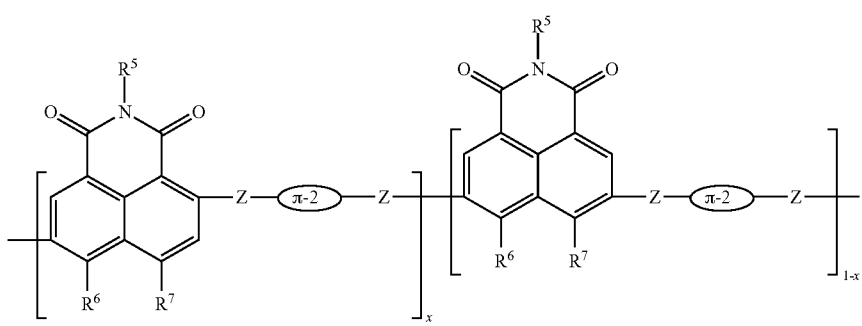
VIII'
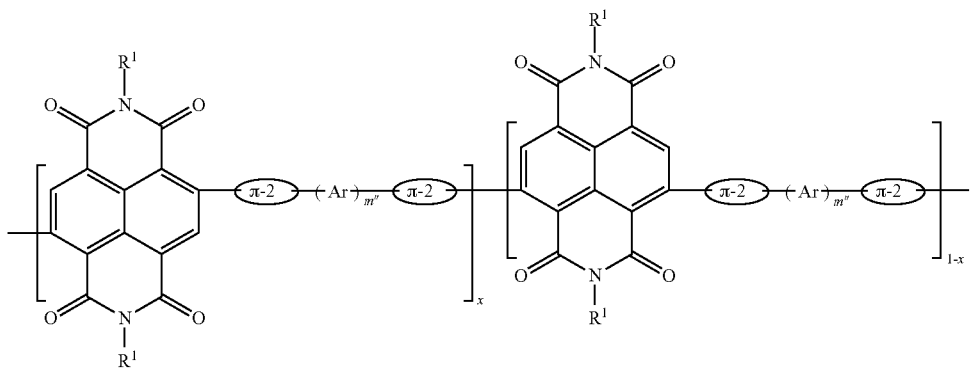
IX'

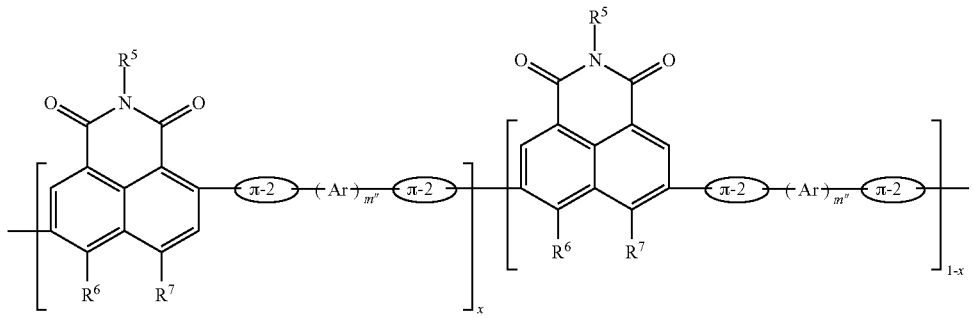
X'
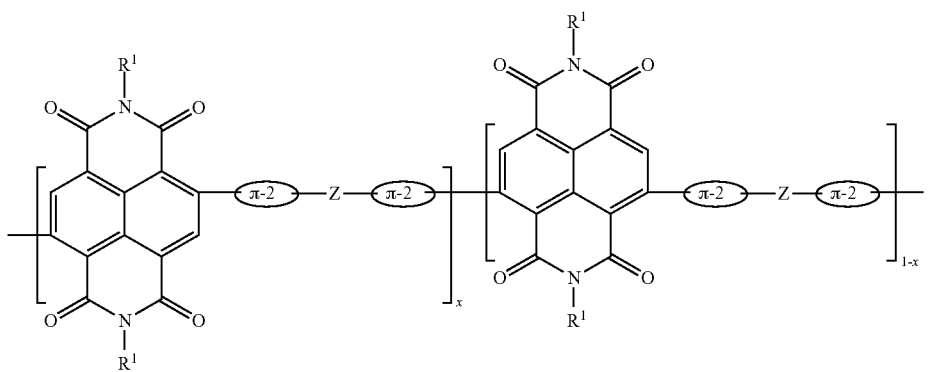
XI'
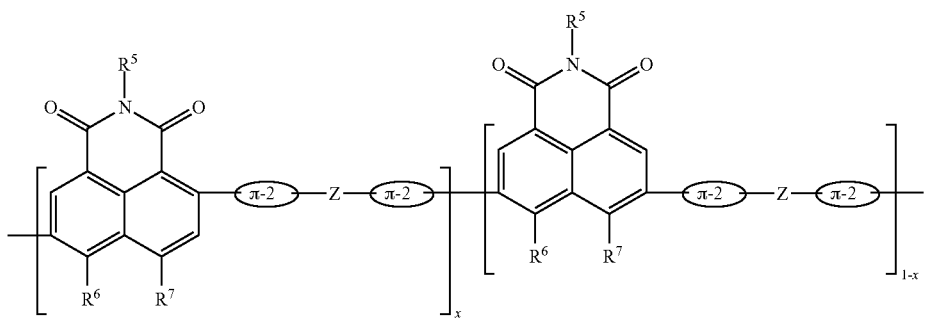
XII'
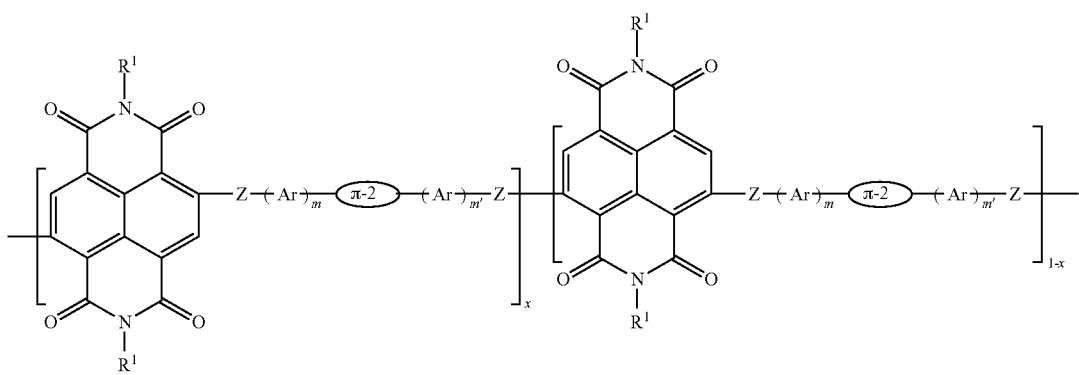
XIII'

-continued

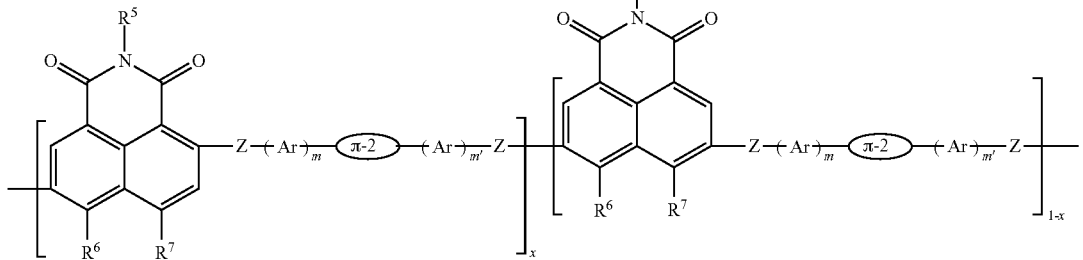

XIV'

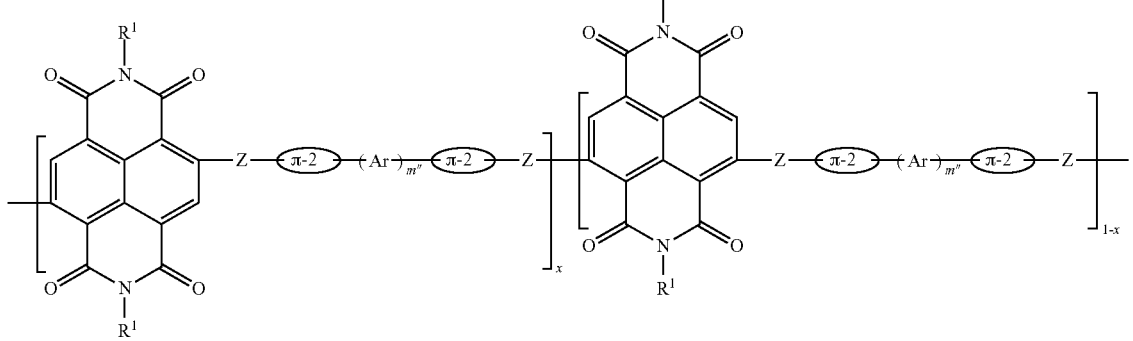

XV'

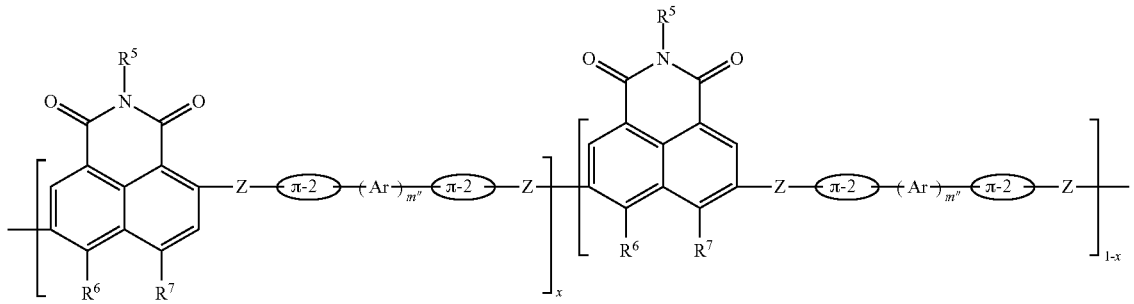

XVI' wherein x is a real number and $0.5 < x \leq 1$, and $R^1$, $R^5$, $R^6$, $R^7$, π-2, Ar, Z, m, m', and m" are as defined herein. In various embodiments, x is at least about 0.6, for example, greater than about 0.75, greater than about 0.80, greater than about 0.85, greater than about 0.90, or greater than about 0.95.

Certain embodiments disclosed herein can be stable in ambient conditions ("ambient stable") and soluble in common solvents. As used herein, a polymer can be considered electrically "ambient stable" or "stable at ambient conditions" when the carrier mobility or the reduction-potential of the polymer is maintained at about its initial measurement when the polymer is exposed to ambient conditions, for example, air, ambient temperature, and humidity, over a period of time. For example, a polymer according to the present teachings can be described as ambient stable if its carrier mobility or redox potential does not vary more than 20% or more than 10% from its initial value after exposure to ambient conditions, including, air, humidity and temperature, over a 3 day, 5 day, or 10 day period. In addition, a polymer can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

Without wishing to be bound by any particular theory, it is believed that if n-channel transport is desired, the strong electron-depleted electronic structure enabled by $M_1$ copolymerized with a strong electron-depleted $M_2$ repeating unit, together with the regioregular highly π-conjugated polymeric backbone of the present polymers, can make the present polymers ambient-stable n-channel semiconductor materials without requiring additional π-core functionalization (i.e., core substitution of the naphthalene moiety) with strong electron-withdrawing functionalities. If large light absorption (extinction coefficient) is desired, the present polymers can be provided with a highly π-conjugated polymeric backbone and by having the $M_1$ unit copolymerized with an electron-donating $M_2$ comonomer to enable a push-pull structure. If an ambipolar polymer is desired, for example in light-emitting transistor applications, the present polymers can have a highly π-conjugated polymeric backbone comprising a copolymer of $M_1$ and an electron-neutral or electron-donating (electron-rich) $M_2$ unit.

OTFTs based on the present polymers can have long-term operability and continued high-performance in ambient conditions. For example, OTFTs based on certain embodiments of the present polymers can maintain satisfactory device performance in highly humid environment. Certain embodiments of the present polymers also can exhibit excellent thermal stability over a wide range of annealing temperatures. Photovoltaic devices can maintain satisfactory power conversion efficiencies over an extended period of time.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone. As demonstrated in the examples hereinbelow, the present polymers can have room temperature solubilities in conventional organic solvents such as xylene, dichlorobenzene (DCB), and other chlorinated hydrocarbons (CHCs) as high as 60 g/L.

Given their high solubilities in common solvents, the present polymers can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like. For example, much of the printed electronics technology has focused on inkjet printing, primarily because this technique offers greater control over feature position and multilayer registration. Inkjet printing offers the benefits of not requiring a preformed master (compared to contact printing techniques), as well as digital control of ink ejection, thereby providing drop-on-demand printing. However, contact printing techniques have the advantage of being well-suited for very fast roll-to-roll processing. Note that different printing techniques require substantially different ink rheological properties, ranging from very viscous formulations used in flexography to less viscous gravure-printing inks to far more dilute solutions suitable for inkjet printing. As such, it cannot always be assumed a priori that a polymer functioning well in spin-coated devices, hence solution-processable, will necessarily be printable.

Therefore, one of the unexpected properties of the present polymers includes their processing versatility as demonstrated in the examples hereinbelow. Formulations including the present polymers were shown to be printable via different types of printing techniques including gravure printing, flexographic printing, and inkjet printing, providing smooth and uniform films that allow, for example, the formation of a pinhole-free dielectric film thereon, and consequently, the fabrication of all-printed devices.

Polymers of the present teachings can be used to prepare semiconductor materials (e.g., compositions and composites), which in turn can be used to fabricate various articles of manufacture, structures, and devices. In some embodiments, semiconductor materials incorporating one or more polymers of the present teachings can exhibit n-type semiconductor activity, ambipolar activity, light absorption, and/or light emission.

The present teachings, therefore, further provide methods of preparing a semiconductor material. The methods can include preparing a composition that includes one or more polymers disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a polymer disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the polymers disclosed herein are within the scope of the present teachings as are methods of making the same. The present polymers can offer processing and operation advantages in the fabrication and/or the use of these devices.

For example, articles of manufacture such as the various devices described herein can include a composite having a semiconductor material of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., PNAS, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANT), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

Figure 7:
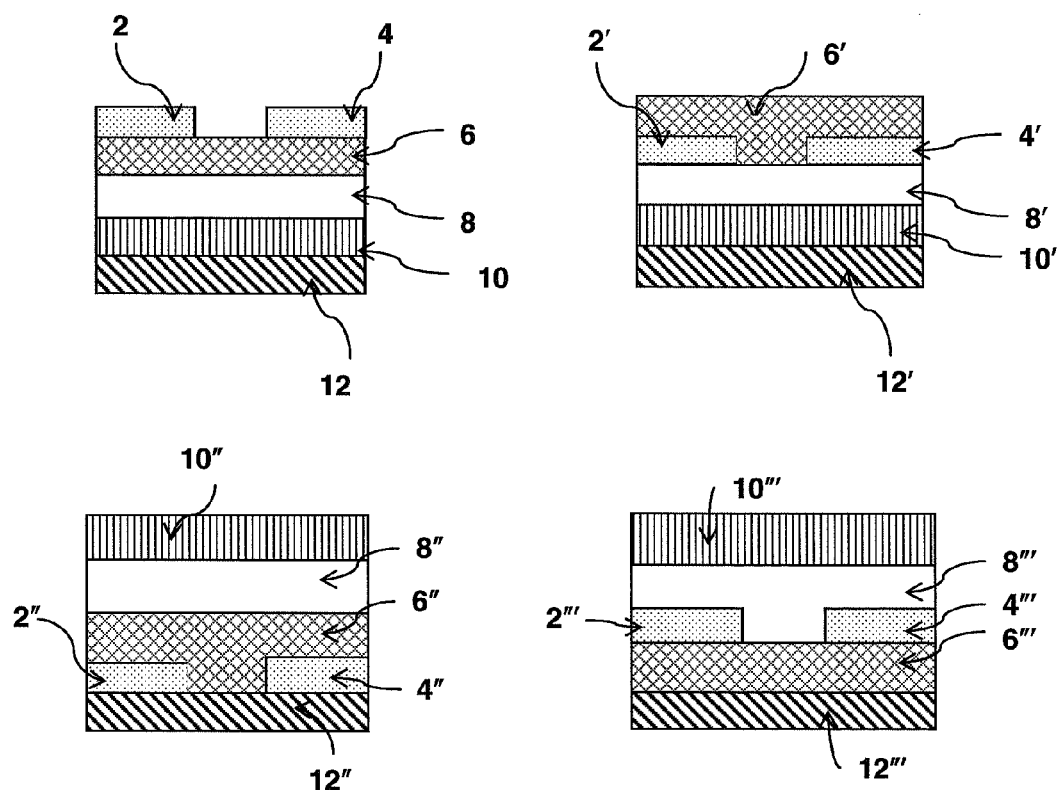
FIG. 7 illustrates four different configurations of thin film transistors: bottom-gate top contact (top left), bottom-gate bottom-contact (top right), top-gate bottom-contact (bottom left), and top-gate top-contact (bottom right); each of which can be used to incorporate polymers of the present teachings.

FIG. 7 illustrates the four common types of OFET structures: (top left) bottom-gate top-contact structure, (top right) bottom-gate bottom-contact structure, (bottom left) top-gate bottom-contact structure, and (bottom right) top-gate top-contact structure. As shown in FIG. 7, an OFET can include a dielectric layer (e.g., shown as 8, 8', 8", and 8'''), a semiconductor layer (e.g., shown as 6, 6', 6", and 6'''), a gate contact (e.g., shown as 10, 10', 10", and 10''), a substrate (e.g., shown as 12, 12', 12", and 12'''), and source and drain contacts (e.g., shown as 2, 2', 2", 2''', 4, 4', 4", and 4''').

In certain embodiments, OTFT devices can be fabricated with the present polymers on doped silicon substrates, using $SiO_2$ as the dielectric, in top-contact geometries. In particular embodiments, the active semiconductor layer which incorporates at least a polymer of the present teachings can be deposited at room temperature or at an elevated temperature. In other embodiments, the active semiconductor layer which incorporates at least one polymer of the present teachings can be applied by spin-coating or printing as described herein. For top-contact devices, metallic contacts can be patterned on top of the films using shadow masks.

In certain embodiments, OTFT devices can be fabricated with the present polymers on plastic foils, using polymers as the dielectric, in top-gate bottom-contact geometries. In particular embodiments, the active semiconducting layer which incorporates at least a polymer of the present teachings can be deposited at room temperature or at an elevated temperature. In other embodiments, the active semiconducting layer which incorporates at least a polymer of the present teachings can be applied by spin-coating or printing as described herein. Gate and source/drain contacts can be made of Au, other metals, or conducting polymers and deposited by vapor-deposition and/or printing.

As demonstrated in the examples hereinbelow, devices fabricated from the present polymers have shown an unexpected combination of desirable properties. In addition to the processing advantages described above, OTFTs based on the present polymers have shown electron mobilities up to about 0.85 $cm^2$/Vs and $I_{on}$:$I_{off}$>$10^6$ under ambient conditions. To the inventors' knowledge, these characteristics, and especially, the combination of these characteristics, have not been achieved by any n-channel polymeric semiconductor materials to date.

Other articles of manufacture in which polymers of the present teachings are useful are photovoltaics or solar cells. Polymers of the present teachings can exhibit broad optical absorption and/or a tuned redox properties and bulk carrier mobilities, making them desirable for such applications. Accordingly, the polymers described herein can be used as an acceptor (n-type) semiconductor or a donor (p-type) semiconductor depending on the nature of the $M_2$ unit in a photovoltaic design, which includes an adjacent p-type or n-type semiconductor material, respectively, that forms a p-n junction. The polymers can be in the form of a thin film semiconductor, which can be deposited on a substrate to form a composite. Exploitation of polymers of the present teachings in such devices is within the knowledge of a skilled artisan.

Figure 17:
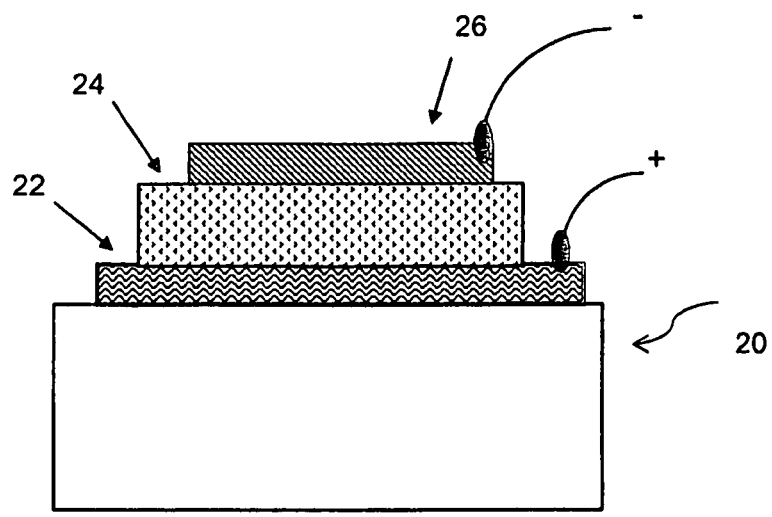
FIG. 17 illustrates a representative structure of a bulk-heterojunction organic photovoltaic device (also known as solar cell) which can incorporate one or more polymers of the present teachings as the donor and/or acceptor materials.
Figure 18:
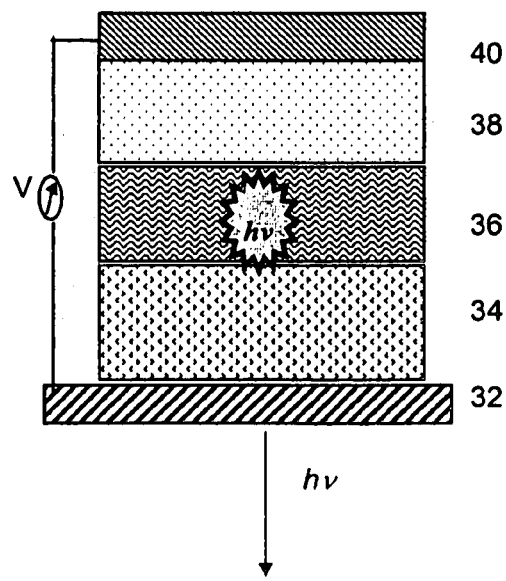
FIG. 18 illustrates a representative structure of an organic light-emitting device which can incorporate one or more polymers of the present teachings as electron-transporting and/or emissive and/or hole-transporting materials.

Accordingly, another aspect of the present teachings relates to methods of fabricating an organic light-emitting transistor, an organic light-emitting diode (OLED), or an organic photovoltaic device that incorporates one or more semiconductor materials of the present teachings. FIG. 17 illustrates a representative structure of a bulk-heterojunction organic photovoltaic device (also known as solar cell) which can incorporate one or more polymers of the present teachings as the donor and/or acceptor materials. As shown, a representative solar cell generally includes a substrate 20 (e.g., glass), an anode 22 (e.g., ITO), a cathode 26 (e.g., aluminium or calcium), and an active layer 24 between the anode and the cathode which can incorporate one or more polymers of the present teachings as the electron donor (p-channel) and/or electron acceptor (n-channel) materials. FIG. 18 illustrates a representative structure of an OLED which can incorporate one or more polymers of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more polymers of the present teachings as hole-transporting (n-channel) (layer 34 as shown) and/or emissive (layer 36 as shown) and/or electron-transporting (p-channel) materials (layer 38 as shown).

The following examples are provided to illustrate further and to facilitate the understanding of the present teachings and are not in any way intended to limit the invention.

All reagents were purchased from commercial sources and used without further purification unless otherwise noted. Specifically, dioxane, dichlorobenzene (DCB), chloroform ($CHCl_3$), and other chlorinated hydrocarbons (CHCs) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under $N_2$ unless otherwise noted. The compound 5,5'-bis(trimethylstannyl)-2,2'-bithiophene was prepared according to the procedures described in Goto et al., *Angew. Chem. Int. Ed.*, vol. 44: 4322 (2005).

Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest microlab, LLC. Polymer molecular weights were determined on a Waters GPC system (Waters Pump 510) in THF at room temperature versus polystyrene standards.

Example 1

Polymer Synthesis

The following examples describe the preparation of certain polymers of the present teachings and related intermediates.

Example 1A

Preparation of poly{[N,N'-bis(2-ethylhexyl)-1,4,5,8-naphthalene diimide-2,6-diyl]-alt-5,5'-(2,2'-bithiophene)} [P(NDI2EH-T2)]

Preparation of 2,6-dibromonaphthalene-1,4,5,8-tetracarboxydianhydride (NDA-Br$_2$). A mixture of 1,4,5,8-naphthalenetetracarboxylic dianhydride (2.8 g, 10.3 mmol) and oleum (20% SO$_3$, 100 mL) was stirred at 55° C. for 2 hours. To this mixture, a solution of dibromoisocyanuric acid (3.0 g, 10.5 mmol) in oleum (50 mL) was added over 40 mins. The resulting mixture was then warmed to 85° C. and maintained at this temperature for 43 hours. After cooling to room temperature, the reaction mixture was poured onto crushed ice (420 g), diluted with water (400 mL), and then stirred at room temperature for 1 hour. The resulting precipitates were collected by centrifugation, washed with water and methanol, collected by centrifugation and finally dried under vacuum, leading to a greenish yellow solid (3.6 g, 8.5 mmol, yield 82.2%). Elemental Analysis (calc. C, 39.47; H, 0.47; N, 0.00): found C, 38.20; H, 0.79; N, 0.00.

Preparation of N,N'-bis(2-ethylhexyl)-2,6-dibromonaphthalene-1,4,5,8-bis(dicarboximide) (NDI2EH-Br$_2$). A mixture of NDA-Br$_2$ (above, 1.6 g, 3.9 mmol), 2-ethylhexylamine (1.4 mL, 8.5 mmol), o-xylene (6 mL), and propionic acid (2 mL) was stirred at 140° C. for 1 h. After cooling to room temperature, methanol (10 mL) was added to the reaction mixture and the resulting precipitate was collected by filtration, washed with methanol, and dried in vacuum leading to the crude product as a red solid (0.81 g). Further purification was carried out by column chromatography on silica gel using a mixture of chloroform:hexane (5:1, v/v) as eluent, affording a slightly yellow solid as the product (0.61 g, 0.94 mmol, yield 24.4%).

$^1$H NMR (CDCl$_3$, 500 MHz): δ 9.01 (s, 2H), 4.10-4.25 (m, 4H), 19.4-1.97 (m, 2H), 1.20-1.40 (m, 16H), 0.87-1.03 (m, 12H). $^{13}$C NMR (CDCl$_3$, 125 MHz): δ 161.4, 161.2, 139.4, 128.6, 127.9, 125.5, 124.3, 45.3, 38.0, 30.8, 28.7, 24.2, 23.3, 14.3, 10.8.

Preparation of copolymer P(NDI2EH-T2). Under argon, a mixture of NDI2EH-Br$_2$ (above, 98 mg, 0.15 mmol), 5,5'-bis(trimethylstannyl)-2,T-bithiophene (74 mg, 0.15 mmol), and Pd(PPh$_3$)$_2$Cl$_2$ (3.5 mg, 0.005 mmol) in anhydrous toluene (5 mL) was stirred at 90° C. for 4 days. Bromobenzene (0.3 mL) was then added to the reaction and the resulting mixture was stirred for an additional 12 hours. After cooling to room temperature, a solution of potassium fluoride (1.2 g) in water (2.5 mL) was added. This mixture was stirred at room temperature for 2 hours and the precipitate was collected by filtration. The solid was taken with a small amount of chloroform, methanol was added, and the solid collected by filtration. This procedure was repeated using chloroform and acetone, leading to a deep blue solid as the crude product. This crude product was purified by Soxhlet extraction with acetone for 24 hours (80 mg, yield 80.7%).

$^1$H NMR (CDCl$_3$, 500 MHz): δ 8.82 (br, 2H), 7.35 (br, 4H), 4.15 (br, 4H), 1.97 (br, 2H), 1.18-1.70 (m, br, 16H). 0.80-1.12 (m, br, 12H). Elemental Analysis (calc. C, 69.91; H, 6.18; N, 4.29): found C, 69.63; H, 5.66; N, 3.71.

Example 1B

Preparation of poly{[N,N'-bis(2-ethylhexyl)-1,4,5,8-naphthalene diimide-2,6-diyl]-alt-2,5-thiophene} [P(NDI2EH-T1)]

Preparation of copolymer P(NDI2EH-T1). Under argon, a mixture of NDI2EH-Br$_2$ (Example 1A, 84 mg, 0.13 mmol), 2,5-bis(trimethylstannyl)thiophene (53 mg, 0.13 mmol), and Pd(PPh$_3$)$_2$Cl$_2$ (3.0 mg, 0.004 mmol) in anhydrous toluene (5 mL) was stirred at 90° C. for 4 days. Bromobenzene (0.3 mL) was then added and the resulting mixture was stirred at 90° C. for an additional 12 hours. Upon cooling to room temperature, a solution of potassium fluoride (1.2 g) in water (2.5 mL) was added. This mixture was stirred at room temperature for 2 hours and the precipitate collected by filtration. The solid was taken with a small amount of chloroform, methanol was added, and the resulting solid collected by filtration. This procedure was repeated using chloroform and acetone, leading to a deep blue solid as the crude product (20.0 mg, yield 20.7%). Elemental Analysis (calc. C, 71.55; H, 6.71; N, 4.91): found C, 71.59; H, 6.00; N, 4.56.

Example 1C

Preparation of Poly{[N,N'-bis(2-octyldodecyl)-1,4,5,8-naphthalene diimide-2,6-diyl]-alt-5,5'-(2,2'-bithiophene)} [P(NDI2OD-T2)]

Preparation of 1-iodo-2-octyldodecane. Iodine (12.25 g, 48.3 mmol) was added to a solution of 2-octyl-1-dodecanol (12.42 g, 41.6 mmol), triphenylphosphine (13.17 g, 50.2 mmol), and imidazole (3.42 g, 50.2 mmol) in 80 mL dichloromethane at 0° C. After stirring for 30 min, the reaction mixture was allowed to warm to room temperature over 4 h before 12 mL of saturated Na$_2$SO$_3$ (aq) was added. The organics were concentrated by evaporation and the mixture taken up in 500 mL pentane, washed three times with 200 mL water, and once with 150 mL brine. The mixture was then passed through a 3 cm silica gel plug, and dried over Na$_2$SO$_4$. The organics were concentrated by evaporation to give a colorless oil (15.78 g, yield 92.9%).

$^1$H NMR (CDCl$_3$ 500 MHz): δ: 2.60 (d, J=5.0 Hz, 2H), 2.00 (t, J=5.0 Hz, 1H), 1.30-1.20 (b, 32H), 0.89 (t, J=7.5 Hz, 6H); MS (EI): m/z (%) 408.23 (100) [M$^+$]. Elemental Analysis (calc. C, 58.81; H, 10.12): found C, 58.70; H, 9.97.

Preparation of 2-octyldodecylamine. 1-Iodo-2-octyldodecane (5.90 g, 14.5 mmol) and potassium phthalimide (2.94 g, 15.9 mmol) were dissolved in 25 mL of DMF and vigorously stirred for 72 h at 25° C. The reaction mixture was poured into 200 mL of pentane, and washed four times with 100 mL water. The mixture was then passed through a 3 cm silica gel plug, and concentrated to give a colorless oil. The oil was next dissolved in 150 mL of ethanol, and 4 mL of hydrazine hydrate were added leading to a mixture which was refluxed overnight. The resulting precipitates were collected by filtration, dissolved in 100 mL water, and the solution was made alkaline by addition of 6 M NaOH (aq). The resulting mixture was dissolved in 200 mL pentane, washed four times with 100 mL water, once with 70 mL brine, dried over MgSO$_4$, and concentrated to give a colorless oil (3.08 g, 72% yield).

$^1$H NMR (CDCl$_3$ 500 MHz): δ: 2.60 (d, J=5.0 Hz, 21-1), 2.00 (t, J=5.0 Hz, 1H), 1.30-1.20 (b, 32H), 0.89 (t, J=7.5 Hz,

6H); MS (EI): m/z (%) 297.34 (100) [M⁺]. Elemental Analysis (calc. C, 80.73; H, 14.57): found C, 80.78; H, 14.52.

Preparation of N,N'-bis(2-octyldodecyl)-2,6-dibromonaphthalene-1,4,5,8-bis(dicarboximide) (NDI2OD-Br$_2$) A mixture of NDA-Br$_2$ (Example 1A, 2.34 g, 5.49 mmol), 2-octyldodecylamine (4.10 g, 13.78 mmol), o-xylene (18 mL), and propionic acid (6 mL) was stirred at 140° C. for 1 h. Upon cooling to room temperature, most of the solvent was removed in vacuo, and the residue was purified by a column chromatography on silica gel with a mixture of chloroform:hexane (1:1, v/v) as the eluent, affording a slightly yellow solid as the product (1.98 g, 2.01 mmol, yield 36.7%).

$^1$H NMR (CDCl$_3$ 500 MHz): δ: 8.95 (s, 2H), 4.12 (d, J=7.5 Hz, 4H), 1.97 (m, 2H), 1.20-1.40 (m, 64H), 0.84-0.89 (m, 12H). $^{13}$C NMR (CDCl$_3$, 125 MHz): δ: 161.3, 161.1, 139.3, 128.5, 127.8, 125.4, 124.2, 45.6, 36.6, 32.1, 32.0, 31.7, 30.2, 29.9, 29.8, 29.7, 29.6, 29.5, 26.5, 22.9, 22.8, 14.3. Elemental Analysis (calc. C, 65.84; H, 8.60; N, 2.84): found C, 65.68; H, 8.60; N, 2.89.

Preparation of copolymer P(NDI2OD-T2). Under argon, a mixture of NDI-2OD-Br$_2$ (95 mg, 0.096 mmol), 5,5'-bis(trimethylstannyl)-2,2'-bithiophene (48 mg, 0.096 mmol), and Pd(PPh$_3$)$_2$Cl$_2$ (3.5 mg, 0.005 mmol) in anhydrous toluene (5 mL) was stirred at 90° C. for 4 days. Bromobenzene (0.2 mL) was then added and the reaction mixture was maintained at 90° C. for an additional 12 hours. Upon cooling to room temperature, a solution of potassium fluoride (1 g) in water (2 mL) was added. This mixture was stirred at room temperature for 2 hours before it was extracted with chloroform (60 mL×2). Organic layers were combined, washed with water (50 mL×2), dried over anhydrous sodium sulfate, and concentrated on a rotary evaporator. The residue was taken with a small amount of chloroform and precipitated in methanol and acetone in sequence. The obtained blue solid product was purified by Soxhlet extraction with acetone for 48 hours. The remaining solid residue was redissolved in chloroform (50 mL) and the resulting mixture was heated to boil. Upon cooling to room temperature, the chloroform solution was filtered through a 5 µm filter, and the filtrate was added slowly to methanol (50 mL). The precipitates were collected by filtration, washed with methanol, and dried in vacuum, leading to a deep blue solid as the product (88.0 mg, yield 92.1%).

Figure 6:
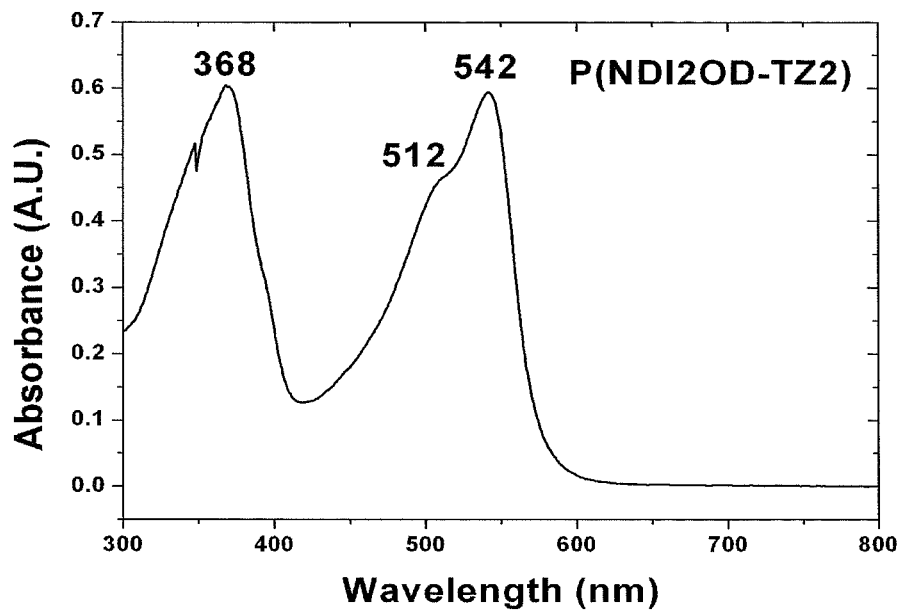
FIG. 6 shows the UV-vis spectra of two embodiments of the present polymers, namely, P(NDI2OD-TZ2) (top) and P(NDI2OD-T4) (bottom), in solution (CHCl$_3$).
Figure 6:
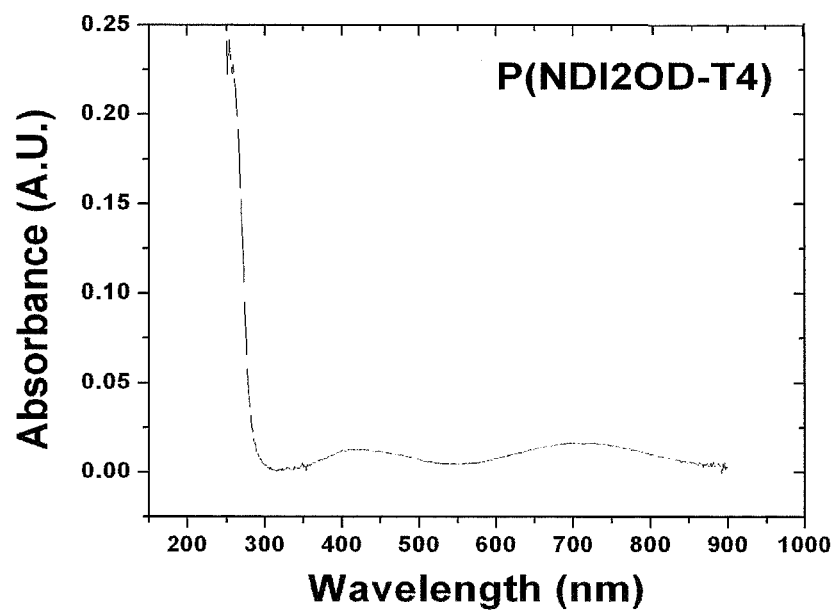

$^1$H NMR (CDCl$_3$ 500 MHz): δ: 8.53-8.84 (m, br, 2H), 7.20-7.48 (br, 4H), 4.13 (s, br, 2H), 2.00 (s, br, 4H), 1.05-1.30 (s, br, 64H), 0.87 (s, br, 12H). GPC: M$_n$=47.8K Da, M$_w$=264.4K Da, PDI=5.53. Elemental Analysis (calc. C, 75.26; H, 8.96; N, 2.83, Br, 0.00): found C, 75.22; H, 9.01; N, 2.77, Br, 0.00. FIG. 6 shows a representative GPC chromatogram of P(NDI2OD-T2).

Example 1D

Preparation of Poly{[N,N'-bis(1-methylhexyl)-1,4,5, 8-naphthalene diimide-2,6-diyl]-alt-5,5'-(2,2'-bithiophene)} [P(NDI1MH-T2)]

Preparation of N,N % bis(1-methylhexyl)-2,6-dibromonaphthalene-1,4,5,8-bis(dicarboximide) (NDI1MH-Br$_2$). A mixture of NDA-Br$_2$ (Example 1A, 2.42 g, 5.68 mmol), 1-methylhexylamine (2.5 mL, 16.55 mmol), propionic acid (12 mL), and o-xylene (36 mL) was stirred under argon at 140° C. for 17 hours. Upon cooling to room temperature, solvents were removed in vacuo and the residue was subject to a column chromatography on silica gel using a mixture of CHCl$_3$:hexane (1:1, v/v) as the eluent, leading to slightly yellow solid as the product (0.24 g, 0.39 mmol, yield 6.9%).

$^1$H NMR (CDCl$_3$, 500 MHz): δ 8.96 (s, 2H), 5.24 (m, 2H), 2.13 (m, 2H), 1.94 (m, 2H), 1.56 (d, J=7.0 Hz, 6H), 1.10-1.40 (m, 12H), 0.81-0.86 (t, J=7.0 Hz, 6H). $^{13}$C NMR (CDCl$_3$, 125 MHz): δ: 161.3, 161.3, 139.3, 128.3, 127.8, 125.7, 124.5, 51.5, 33.5, 31.8, 26.9, 22.7, 18.3, 14.2.

Preparation of copolymer P(NDI1MH-T2). Under argon, a mixture of NDI1MH-Br$_2$ (above, 151 mg, 0.24 mmol), 5,5'-bis(trimethylstannyl)-2,2'-bithiophene (120 mg, 0.24 mmol), and Pd(PPh$_3$)$_2$Cl$_2$ (6.5 mg, 0.009 mmol) in anhydrous toluene (12 mL) was stirred at 90° C. for 24 hours. Bromobenzene (0.2 mL) was then added and the reaction mixture was maintained at 90° C. for an additional 12 hours. Upon cooling to room temperature, the reaction mixture was added slowly to methanol (50 mL) and the resulting mixture was stirred at room temperature for 10 mins. The precipitates were collected by filtration and washed with methanol. The isolated solid was then taken with chloroform (30 mL) and sonicated for 5 mins. A solution of potassium fluoride (4 g) in water (8 mL) was added, and this mixture was vigorously stirred at room temperature for 1 hour. The mixture was then diluted with chloroform (100 mL), and washed with water (100 mL×2). The organic layer was concentrated on rotary evaporator. The residue was taken with chloroform (30 mL), followed by sonication for 5 mins. This mixture was precipitated in methanol (150 mL), leading to deep blue precipitates, which were collected by filtration, washed with methanol, and dried in a vacuum (143 mg, yield 94%). Further purification involved Soxhlet extraction with acetone and then another precipitation in methanol.

$^1$H NMR (CDCl$_3$, 500 MHz): δ 8.70-8.82 (br, 2H), 7.05-7.73 (m, br, 3H), 6.64 (br, 1H), 5.15-5.50 (m, br, 2H), 0.71-2.43 (m, br, 28H).

Example 1E

Preparation of poly{[N,N'-bis(2-octyldodecyl)-1,4,5, 8-naphthalene diimide-2,6-diyl]-alt-5,5'''-(quarterthiophene)} [P(NDI2OD-T4)]

Preparation of N,N'-bis(2-octyldodecyl)-2,6-bis(2-thienyl)naphthalene-1,4,5,8-bis(dicarboximide) (NDI2OD-T1). Under argon, a mixture of NDI2OD-Br$_2$ (Example 1A, 280.0 mg, 0.28 mmol), 2-trimethylstannylthiophene (400.0 mg, 1.62 mmol), Pd(PPh$_3$)$_2$Cl$_2$ (28.0 mg, 0.04 mmol) in anhydrous toluene (20 mL) was stirred at 90° C. for 22 h. Upon cooling to room temperature, the reaction mixture was diluted with chloroform (100 mL), and the resulting mixture was washed with water (80 mL×2), dried over anhydrous sodium sulfate (Na$_2$SO$_4$), and concentrated on rotary evaporator. The residue was subject to column chromatography on silica gel with a mixture of chloroform:hexane (3:2, v/v) as eluent, leading to an orange solid as the product (240.0 mg, 0.24 mmol, 85.2%).

$^1$H NMR (CDCl$_3$ 500 MHz): δ: 8.77 (s, 2H), 7.57 (d, J=5.0 Hz, 2H), 7.31 (d, J=3.5 Hz, 2H), 7.21 (m, 2H), 4.07 (d, J=7.5 Hz, 4H), 1.95 (m, 2H), 1.18-40 (m, br, 64H), 0.84-0.88 (m, 12H); $^{13}$C NMR (CDCl$_3$ 125 MHz): δ: 162.8, 162.6, 141.1, 140.4, 136.8, 128.4, 128.2, 127.7, 127.6, 125.6, 123.6, 45.0, 36.6, 32.1, 31.7, 30.3, 29.9, 29.8, 29.7, 29.6, 29.5, 26.6, 22.9, 14.4, 14.3.

Preparation of N,N'-bis(2-octyldodecyl)-2,6-bis(5-bromo-2-thienyl)naphthalene-1,4,5,8-bis(dicarboximide) (NDI2OD-BrT1). Under argon, a mixture of NDI2OD-T1 (200.0 mg, 0.20 mmol) and NBS (125.0 mg, 0.70 mmol) in DMF (20 mL) was stirred at 80° C. for 25 h. Upon cooling to room temperature, the reaction mixture was poured into water (100 mL), and the resulting mixture was extracted with chloroform (100 mL) The organic layer was separated, washed with water (100 mL×2), dried over anhydrous $Na_2SO_4$, and concentrated on rotary evaporator. The residue was subject to column chromatography on silica gel with a mixture of chloroform:hexane (2:3, v/v, slowly up to 1:1) as eluent, leading to a red solid as the product (145.0 mg, 0.13 mmol, 62.5%).

$^1$H NMR (CDCl$_3$, 500 MHz): δ: 8.73 (s, 2H), 7.15 (d, J=4.0 Hz, 2H), 7.09 (d, J=4.0, 2H), 4.08 (d, J=7.5 Hz, 4H), 1.93-1.98 (m, 2H), 1.20-1.40 (br, m, 64H), 0.83-0.89 (m, 12H). Elemental Analysis (calc. C, 64.79; H, 7.72; N, 2.44): found C, 64.50; H, 7.74; N, 2.49.

Preparation of copolymer P(NDI2OD-T4). Under argon, a mixture of NDI2OD-BrT1 (92.1 mg, 0.08 mmol), 5,5'-bis(trimethylstannyl)-2,2'-bithiophene (39.4 mg, 0.08 mmol), and Pd(PPh$_3$)$_2$Cl$_2$ (2.8 mg, 0.004 mmol) in anhydrous toluene (5 mL) was stirred at 90° C. for 4 days. Bromobenzene (0.3 mL) was then added and the resulting mixture was stirred for an additional 12 hours. After cooling to room temperature, a solution of potassium fluoride (1 g) in water (2 mL) was added. This mixture was stirred and shaken at room temperature for 1 hour, before it was diluted with chloroform (150 mL). The resulting mixture was washed with water (100 mL×3), dried over anhydrous $Na_2SO_4$, and concentrated on rotary evaporator. The residue was taken with chloroform (30 mL) and precipitated in methanol (50 mL). This procedure was repeated using chloroform and acetone, leading to a dark blue solid as crude product. This crude product was purified by Soxhlet extraction with acetone for 48 hours. The isolated solid was dissolved in chloroform (50 mL) and then heated to boil. After cooling to room temperature, the chloroform solution was passed through a syringe filter (5 μm), and the filtrate was precipitated in methanol (50 mL) The precipitates were collected by filtration, washed with methanol, and dried in vacuum, leading to a dark blue solid (87.0 mg, 94.1%).

$^1$H NMR (CDCl$_2$CDCl$_2$, 500 MHz): δ: 8.70-8.81 (m, br, 2H), 7.10-7.40 (m, br, 8H), 4.10 (br, 4H), 1.99 (s, br, 2H), 1.10-1.45 (m, br, 64H), 0.86 (m, br, 12H). GPC: $M_n$=67.4K Da, $M_w$=170.3K Da, PDI=2.5. Elemental Analysis (calc. C, 72.87; H, 8.04; N, 2.43): found C, 72.69; H, 8.06; N, 2.47.

Example 1F

Preparation of Poly{[N,N'-bis(2-octyldodecyl)-1,4,5,8-naphthalene diimide-2,6-diyl]-alt-5,5'-(2,2'-bithiazole)} [P(NDI2OD-TZ2)]

Preparation of copolymer P(NDI2OD-TZ2). Under argon, a mixture of NDI2OD-Br$_2$ (Example 1A, 235 mg, 0.239 mmol), 5,5'-bis(trimethylstannyl)-2,2'-bithiazole (118 mg, 0.239 mmol), and Pd(PPh$_3$)$_2$Cl$_2$ (7.0 mg, 0.010 mmol) in anhydrous toluene (12 mL) was stirred at 90° C. for 3 days. Bromobenzene (0.3 mL) was then added and the resulting mixture was stirred for an additional 12 hours. After cooling to room temperature, a solution of potassium fluoride (2 g) in water (4 mL) was added. This mixture was stirred and shaken at room temperature for 1 hour, before it was diluted with chloroform (150 mL). The resulting mixture was washed with water (100 mL×3), dried over anhydrous $Na_2SO_4$, and concentrated on a rotary evaporator. The residue was taken with chloroform (50 mL) and precipitated in methanol (100 mL). This procedure was repeated using chloroform and acetone, leading to a dark red solid as the crude product. This crude product was purified by Soxhlet extraction with acetone for 72 hours. The isolated solid was dissolved in chloroform (80 mL) and then heated to boil. Upon cooling to room temperature, this chloroform solution was passed through a syringe filter (5 μm), and the filtrate was precipitated in methanol (80 mL). The precipitates were collected by filtration, washed with methanol, and dried in vacuum, leading to a dark red solid (222 mg, 93.7%).

$^1$H NMR (CDCl$_3$, 500 MHz): δ: 7.71 (m, br, 2H), 7.54 (m, br, 2H), 4.20-4.25 (m, br, 4H), 1.69 (m, br, 2H), 1.15-1.50 (m, br, 64H) 0.80-0.95 (m, br, 12H). Elemental Analysis (calc. C, 72.68; H, 8.74; N, 5.65): found C, 72.07; H, 8.61; N, 5.56.

Example 1G

Preparation of Poly{[N,N'-bis(2-octyldodecyl)-1,4,5,8-naphthalene diimide-2,6-diyl]-alt-5,5-(4',7'-di-2-thienyl-2',1',3'-benzothiadiazole)} [P(NDI2OD-TBT)]

Preparation of copolymer P(NDI2OD-TBT) (Suzuki Coupling Reaction). Under argon, a mixture of N,N'-bis(2-octyldodecyl)-2,6-bis(5'-bromo-2'-thienyl)naphthalene-1,4,5,8-bis(dicarboximide) (NDI2OD-BrT1) (Example 1E, 85.0 mg, 0.074 mmol), 4,7-bis(4,4,5,5-tetramethyl-1,3,2-dioxaborolan-2-yl)-2,1,3-benzothiadiazole (28.7 mg, 0.074 mmol), potassium carbonate (81.0 mg, 0.586 mmol), and Pd(PPh$_3$)$_4$ (1.8 mg, 0.002 mmol) in anhydrous toluene (4 mL) and DMF (2 mL) was stirred at 100° C. for 3 days. Bromobenzene (0.3 mL) was then added and the resulting mixture was stirred for an additional 12 hours. After cooling to room temperature, the reaction mixture was poured into methanol (200 mL), and the resulting mixture was stirred at room temperature for 15 mins. The precipitates were collected by filtration, washed with methanol, and dried in vacuum, leading a dark solid as the product (62.0 mg, 74.6%).

Elemental Analysis (calc. C, 72.68; H, 8.07; N, 4.99): found C, 72.41; H, 7.90; N, 5.00.

Preparation of copolymer P(NDI2OD-TBT) (Stille Coupling Reaction). Under argon, a mixture of NDI2OD-Br$_2$ (Example 1A, 84.3 mg, 0.086 mmol), 5,5-bis(trimethylstannyl)-4',7'-di-2-thienyl)-2',1',3'-benzothiadiazole (53.6 mg, 0.086 mmol), and Pd(PPh$_3$)$_2$Cl$_2$ (2.5 mg, 0.004 mmol) in anhydrous toluene (6.5 mL) was stirred at 90° C. for 3 days. Bromobenzene (0.3 mL) was then added and the resulting mixture was stirred for an additional 12 hours. After cooling to room temperature, a solution of potassium fluoride (1 g) in water (2 mL) was added. This mixture was stirred and shaken at room temperature for 1 hour, before it was diluted with chloroform (150 mL) The resulting mixture was washed with water (100 mL×3), dried over anhydrous $Na_2SO_4$, and concentrated on a rotary evaporator. The residue was taken with chloroform (50 mL) and precipitated in methanol (100 mL). This procedure was repeated using chloroform and acetone, leading to a dark solid as the crude product (58.0 mg, 60.3%).

Example 1H

Preparation of Poly{[N,N'-bis(2-octyldodecyl)-1,4,5,8-naphthalene diimide-2,6-diyl]-alt-5,5-(1',4'-di-2-thienyl-2',3',5',6'-tetrafluorobenzene)} [P(NDI2OD-TFBT)]

Preparation of copolymer P(NDI2OD-TFBT). Under argon, a mixture of NDI2OD-BrT1 (Example 1E, 94.3 mg, 0.082 mmol), 1,4-bis(trimethylstannyl)-2,3,5,6-tetrafluorobenzene (39.0 mg, 0.082 mmol), and Pd(PPh$_3$)$_2$Cl$_2$ (1.8 mg, 0.003 mmol) in anhydrous toluene (6 mL) was stirred at 90° C. for 4 days. Bromobenzene (0.3 mL) was then added and the reaction mixture was maintained at 90° C. for an additional 12 hours. Upon cooling to room temperature, a solution of potassium fluoride (1 g) in water (2 mL) was added. This mixture was stirred and shaken at room temperature for 1 hour before it was diluted with chloroform (150 mL). The resulting mixture was washed with water (100 mL×3), dried over anhydrous $Na_2SO_4$, and concentrated on a rotary evaporator. The residue was taken with chloroform (20 mL) and precipitated in methanol (50 mL). The precipitates were collected by filtration, washed with methanol, and dried in vacuum, leading to a purple/blue solid as the product (134 mg, yield 94.4%).

$^1H$ NMR ($CDCl_3$, 500 MHz): δ: 8.72-8.75 (m, 2H), 7.14-7.16 (m, 2H), 7.09-7.11 (m, 2H), 4.08 (m, 4H), 1.96 (s, br, 2H), 1.15-1.45 (m, br, 64H) 0.80-0.92 (m, br, 12H). Elemental Analysis (calc. C, 71.80; H, 7.80; N, 2.48): found C, 69.73; H, 8.56; N, 1.83.

Example 1I

Preparation of Poly{[N,N'-bis(2-octyldodecyl)-1,4,5,8-naphthalene diimide-2,6-diyl]-alt-5,5'-(1,2-bis(2'-thienyl)vinyl)} [P(NDI2OD-TVT)]

Preparation of copolymer P(NDI2OD-TVT). Under argon, a mixture of NDI2OD-Br$_2$ (86.5 mg, 0.088 mmol), 5,5'-bis(trimethylstannyl)-(1,2-bis(2'-thienyl)vinyl (45.5 mg, 0.088 mmol), and Pd(PPh$_3$)$_2$Cl$_2$ (3.1 mg, 0.004 mmol) in anhydrous toluene (7 mL) was stirred at 90° C. for 3 days. Bromobenzene (0.3 mL) was then added and the resulting mixture was stirred for an additional 12 hours. After cooling to room temperature, a solution of potassium fluoride (1.5 g) in water (3 mL) was added. This mixture was stirred and shaken at room temperature for 1 hour, before it was diluted with chloroform (150 mL). The resulting mixture was washed with water (80 mL×3), dried over anhydrous $Na_2SO_4$, and concentrated on a rotary evaporator. The residue was taken with chloroform (50 mL) and precipitated in methanol (100 mL). The precipitate was collected by filtration and redissolved in chloroform (50 mL). This chloroform solution was precipitated again in acetone (100 mL), leading to a deep blue solid as the crude product. This crude product was purified by Soxhlet extraction with acetone for 48 hours. The isolated solid was dissolved in chloroform (60 mL) and then heated to boil. Upon cooling to room temperature, the chloroform solution was passed through a syringe filter (5 μm), and the filtrate was precipitated in methanol (60 mL) The precipitate was collected by filtration, washed with methanol, and dried in vacuum, leading to a blue solid (84.0 mg, 94.2%).

$^1H$ NMR ($CDCl_2CDCl_2$, 500 MHz): δ: 8.79 (br, 2H), 7.33 (br, 2H), 7.20 (br, 4H), 4.10 (br, 4H), 2.00 (br, 2H), 1.20-1.60 (br, 64H), 0.80-91 (br, 12H). GPC: $M_n$=185.6 K Da, $M_w$=713.0 K Da, PDI=3.8. Elemental Analysis (calc. C, 75.69; H, 8.93; N, 2.76): found C, 75.42; H, 8.79; N, 2.84.

Example 1K

Preparation of Poly{([N,N'-bis(2-octyldodecyl)-1,4,5,8-naphthalene diimide-2,6-diyl]-alt-5,5'-[2,6-bis(2'-thienyl)naphthalene]} [P(NDI2OD-TNT)]

Preparation of copolymer P(NDI2OD-TNT). Under argon, a mixture of N,N'-bis(2-octyldodecyl)-2,6-bis(2'-(5'-bromothienyl))naphthalene-1,4,5,8-bis(dicarboximide) (39.1 mg, 0.034 mmol), 2,6-bis(trimethylstannyl)naphthalene (15.4 mg, 0.034 mmol), and Pd(PPh$_3$)$_2$Cl$_2$ (1.2 mg, 0.002 mmol) in anhydrous toluene (4 mL) was stirred at 90° C. for 2 days. Bromobenzene (0.3 mL) was then added and the reaction mixture was maintained at 90° C. for an additional 12 hours. Upon cooling to room temperature, a solution of potassium fluoride (1 g) in water (2 mL) was added. This mixture was stirred and shaken at room temperature for 1 hour before it was diluted with chloroform (100 mL). The resulting mixture was washed with water (80 mL×3), dried over anhydrous $Na_2SO_4$, and concentrated on a rotary evaporator. The residue was taken with THF (5 mL) and precipitated in methanol (75 mL). The precipitate was collected by filtration, washed with methanol, and dried in vacuum, leading to a blue solid, which was further purified by Soxhlet extraction with methanol for 72 hours. The isolated solid residue was redissolved in THF (2 mL), and the resulting solution was passed through a syringe filter (5 μm). The filtrate was precipitated in methanol (70 mL). The precipitate was collected by filtration, washed with methanol, and dried in vacuum, leading to a blue solid as the product (33.2 mg, yield 87.5%).

$^1H$ NMR ($CDCl_2CDCl_2$, 500 MHz): δ: 8.80-8.90 (m, br, 2H), 6.83-8.20 (m, br, 10H), 4.11 (s, br, 4H), 2.02 (br, 2H), 1.10-1.50 (br, 64H) 0.76-0.92 (br, 12H). Elemental Analysis (calc. C, 77.51; H, 8.49; N, 2.51): found C, 76.89; H, 8.65; N, 2.16.

Example 1L

Preparation of Poly{[N,N'-bis(2-octyldodecyl)-1,4,5,8-naphthalene diimide-2,6-diyl]-alt-5,5'-(1,1'-dimethyl-2,2'-bipyrrole)} [P(NDI2OD-Py2)]

Preparation of N,N'-bis(2-octyldodecyl)-2,6-bis(1-methyl-1H-pyrrol-2-yl)naphthalene-1,4,5,8-bis(dicarboximide) (NDI2OD-Py). Under argon, a mixture of NDI2OD-Br$_2$ (489.7 mg, 0.50 mmol), 1-methyl-2-trimethylstannylpyrrole (736.1 mg, 1.99 mmol), Pd(PPh$_3$)$_2$Cl$_2$ (35.0 mg, 0.050 mmol) in anhydrous toluene (35 mL) was stirred at 90° C. for 48 h. Upon cooling to room temperature, the reaction mixture was poured into water (100 mL), and the resulting mixture was extracted with chloroform (100 mL×2). The combined organic layers were washed with water (100 mL×2), dried over anhydrous sodium sulfate ($Na_2SO_4$), and concentrated on rotary evaporator. The residue was subject to column chromatography on silica gel with a mixture of chloroform:hexane (3:2, v/v) as eluent, leading to a purple/blue solid as the product (450.0 mg, 0.457 mmol, 91.9%).

$^1H$ NMR ($CDCl_3$ 500 MHz): δ: 8.77 (s, 2H), 6.91 (m, 2H), 6.38 (m, 4H), 4.08 (d, J=7.0 Hz, 4H), 3.41 (s, 6H), 1.98 (m, 2H), 1.16-1.40 (m, br, 64H), 0.83-0.90 (m, 12H); $^{13}C$ NMR ($CDCl_3$ 125 MHz): δ: 163.1, 162.6, 137.7, 137.4, 132.3, 127.4, 125.5, 125.0, 123.2, 110.7, 109.1, 45.2, 36.6, 34.6, 32.1, 31.7, 30.3, 29.9, 29.8, 29.7, 29.6, 29.5, 26.6, 22.9, 14.3.

Preparation of copolymer P(NDI2OD-Py2). Under argon, a solution of NDI2OD-Py (70.0 mg, 0.071 mmol) in anhydrous chlorobenzene (3.5 mL) was added dropwise to a suspension of FeCl$_3$ (65 mg, 0.40 mmol) in chlorobenzene (2.5 mL). The resulting mixture was warmed to 65° C. and maintained at this temperature for 48 h. Upon cooling to room temperature, additional chlorobenzene (10 mL) was added to the reaction mixture, which was then precipitated in methanol (100 mL). This mixture was sonicated for 10 mins and filtered to collect a black solid, which was washed thoroughly with methanol and dried in vacuum (28.2 mg, 40.4%).

Example 2

Characterization of Polymers

P(NDI2OD-T2) was purified by multiple dissolution-precipitation procedures and was fully characterized by elemental analysis, GPC measurements ($M_w$=~265 k, PD=5.5), and ¹H NMR spectroscopy. The room temperature solubilities of this polymer in conventional organic solvents such as xylene, dichlorobenzene (DCB), CHCl₃ and other chlorinated hydrocarbons (CHCs) was found to be as high as 60 g/L. Differential scanning calorimetry (DSC) of P(NDI2OD-T2) exhibits no thermal transitions up to ~300° C.

Figure 2:
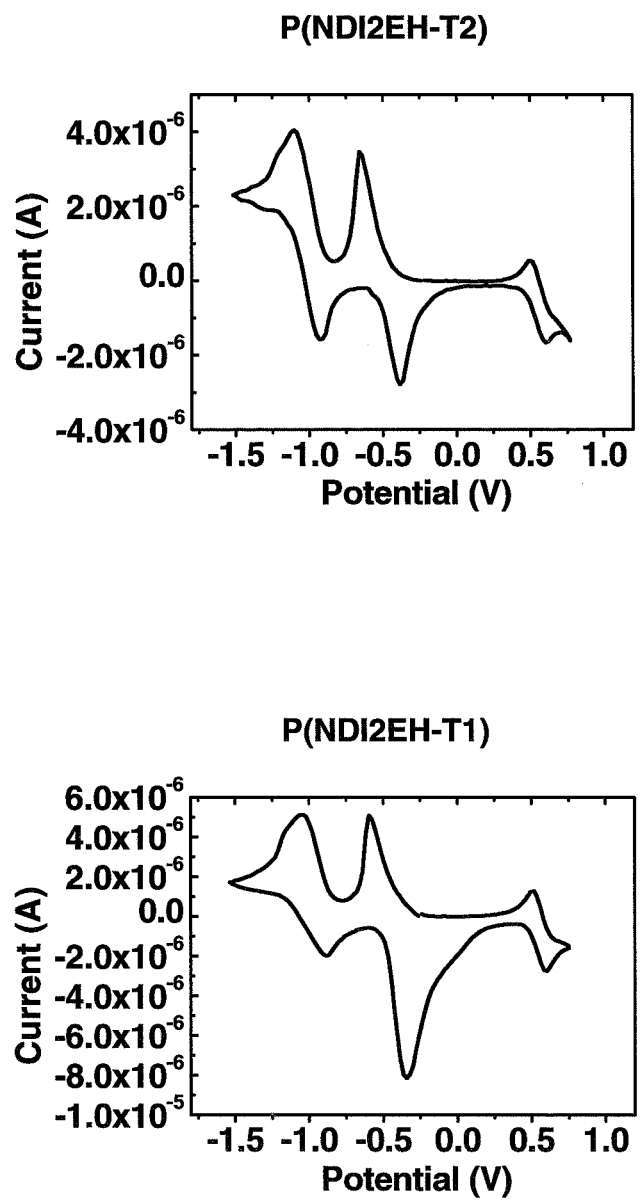
FIG. 2 shows cyclic voltammograms for two embodiments of the present polymers, namely, P(NDI2EH-T2) (top) and P(NDI2EH-T1) (bottom), with the polymer deposited on a 0.4-mm diameter Pt working electrode with silver as the counter electrode in a TFH-TBAPF6 electrolyte solution at a scanning rate of v=80 mVs$^{-1}$ with ferrocene as the internal standard (0.54V vs SCE).
Figure 3:
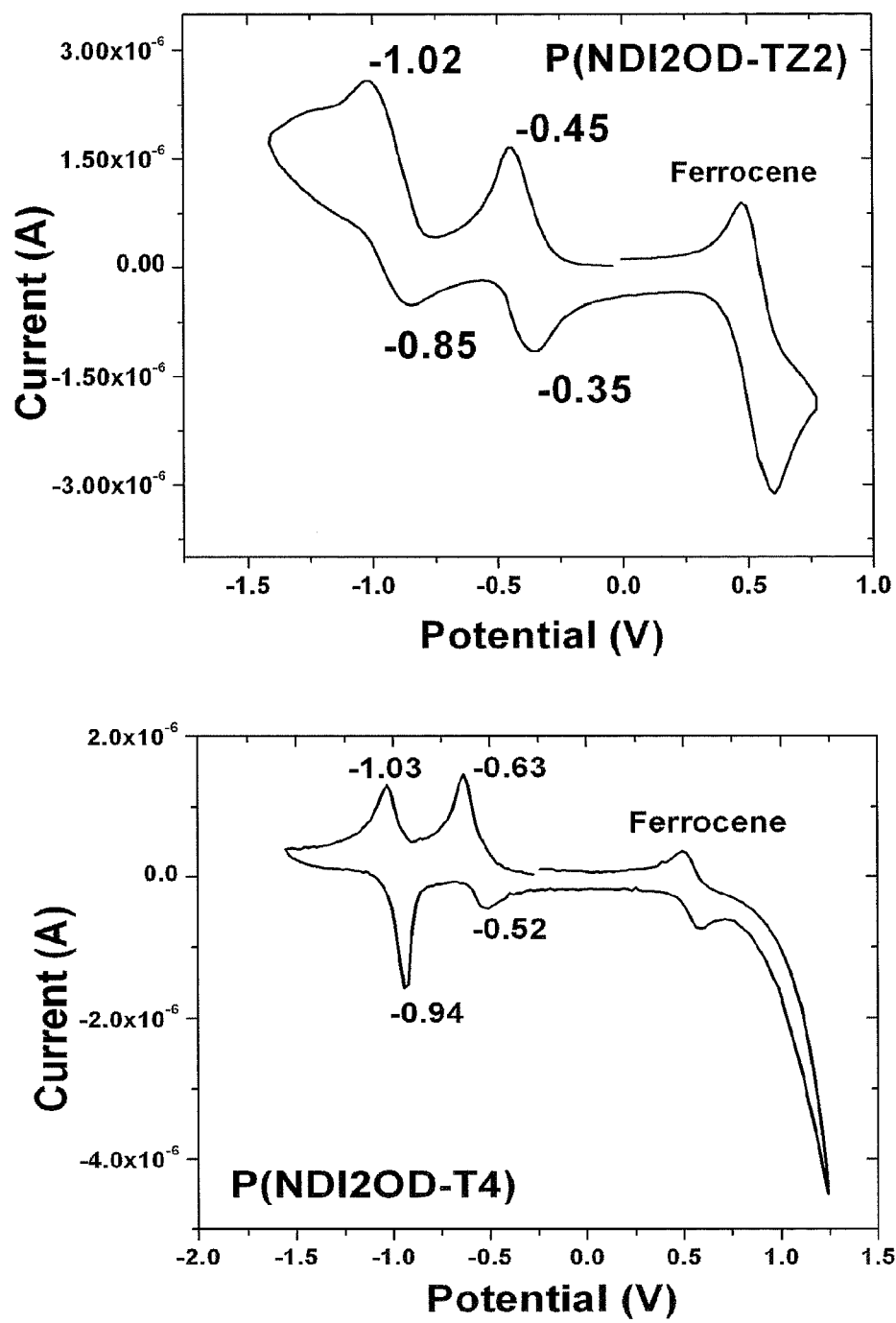
FIG. 3 shows cyclic voltammograms for two embodiments of the present polymers, namely, P(NDI2OD-TZ2) (top) and P(NDI2OD-T4) (bottom), with the polymer deposited on a 0.4-mm diameter Pt working electrode with silver as the counter electrode in a TFH-TBAPF6 electrolyte solution at a scanning rate of v=80 mVs$^{-1}$ with ferrocene as the internal standard (0.54V vs SCE).

To investigate the redox properties of the new polymers, cyclic voltammetry experiments were performed on P(NDI2OD-T2), P(NDI1MH-T2), P(NDI2EH-T2), P(NDI2EH-T1), P(NDI1MH-T2), P(NDI2OD-TZ2), and P(NDI2OD-T4), using a THF-(NBu)₄PF₆ solvent-electrolyte solution, Pt as the working electrode, silver as the pseudo reference electrode and ferrocene (0.54 V vs SCE) as the internal standard. The Pt working electrode was coated with a thin polymer film by drop-casting a CHCl₃ solution. The cyclic voltammograms are shown in FIGS. 1-3, and exemplary redox potential data are collected in Tables 1a and 1b.

and ~1 V, respectively, independent of the N-alkyl functionalization and co-monomer type. These values are among the lowest recorded for semiconducting polymers, approaching, for example, those of strongly electron-depleted core-cyanated rylenes. These values also support the stability of the corresponding transistor under ambient conditions.

Figure 4:
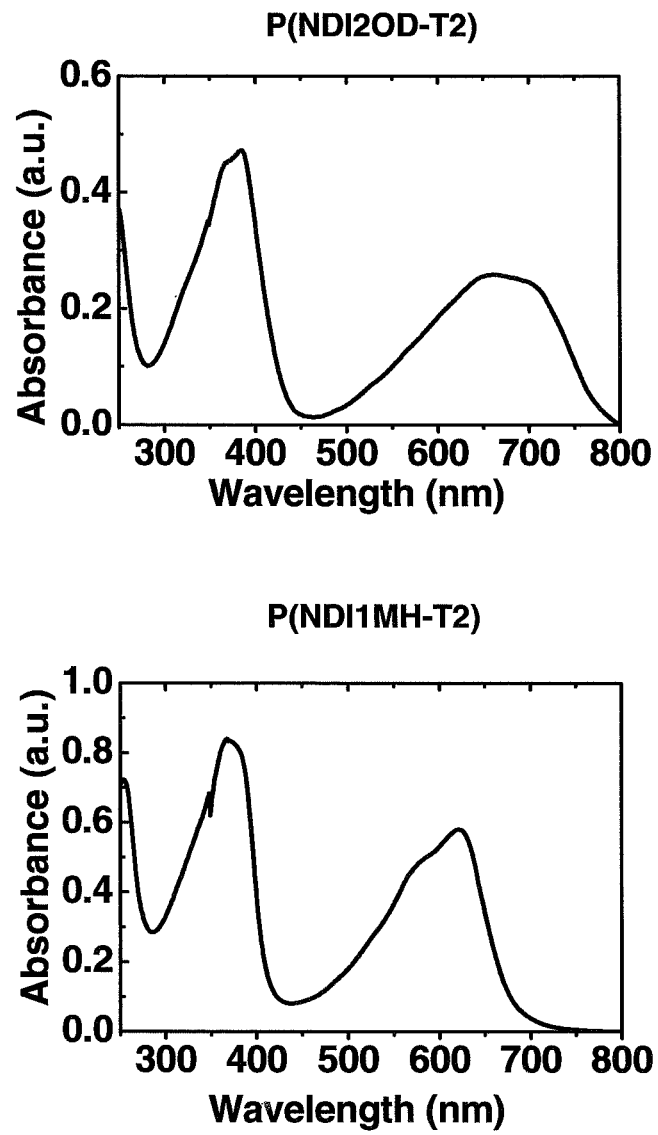
FIG. 4 shows the UV-vis spectra of two embodiments of the present polymers, namely, P(NDI2OD-T2) (top) and P(NDI1MH-T2) (bottom), in solution (CHCl$_3$).
Figure 5:
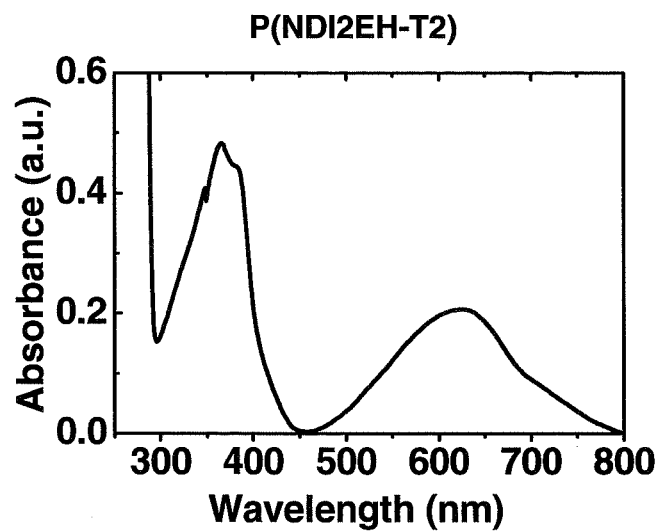
FIG. 5 shows the UV-vis spectra of two embodiments of the present polymers, namely, P(NDI2EH-T2) (top) and P(NDI2EH-T1) (bottom), in solution (CHCl$_3$).
Figure 5:
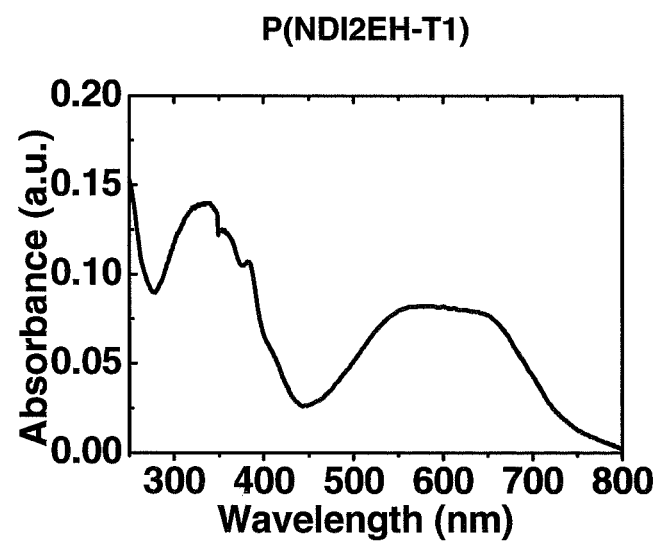

FIG. 4-6 show the thin-film polymer optical absorption spectra (spin-coated on glass, ~30 nm thick) of various embodiments of the present polymers. For P(NDI2OD-T2), the two main absorptions are located at $\lambda_{max}$=697/391 nm. The corresponding (optical) energy gap ($E_g$) was estimated from the spectrum low absorption band edge as ~1.45 eV. Note that the $E_g$ contraction ($\Delta E_g$) going from the formal NDI2OD monomer units ($E_g$=~3.0) to the corresponding polymer is relatively large ($\Delta E_g$~1.65 eV). The low $E_g$ and the large $\Delta E_g$ corroborate the extended/regioregular π-conjugated backbone and the efficient donor (T2)-acceptor(NDI) nature of P(NDI2OD-T2).

Example 3

Device Fabrication

The semiconducting properties of polymers of the present teachings were evaluated in two transistor architectures (bottom-gate top contact and top-gate bottom-contact). The p-channel polymer P3HT was obtained from BASF (Mannheim, Germany) under tradename Sepiolid™ P 100. The dielectric materials ActivInk™ D1100 and ActivInk™ D2200 were obtained from Polyera Corporation (Skokie, Ill.) All solutions were filtered through a 0.2 μm size syringe filter before use. The procedure reported below is for the TFTs based on the polymer P(NDI2OD-T2). Similar procedures can be used for the other polymers although the semiconductor solution concentration and the solvent may vary. All device fabrication processes, except metal evaporation and the film drying steps (≦110° C.), were performed under ambient conditions. Table 2 summarizes the structure, the material for the different components, and the method of fabrication of the various devices made.

TABLE 1a

| | | Reduction Potential (V, versus SCE) | | | |
|---|---|---|---|---|---|
| Polymer | $\lambda_{abs}$ (nm) | $E_{red1}$ (Cathodic) | $E_{red1}$ (Anodic) | $E_{red2}$ (Cathodic) | $E_{red2}$ (Anodic) |
| P(NDI2OD-T2) | 702 (s), 660 384, 366 (s) | −0.54 | −0.45 | −1.02 | −0.91 |
| P(NDI2EH-T2) | 699 (s), 625 383 (s), 365 | −0.60 | −0.34 | −1.06 | −0.89 |
| P(NDI2EH-T1) | 648 (s), 573 383, 338 | −0.66 | −0.38 | −1.10 | −0.93 |
| P(NDI1MH-T2) | 621, 574 (s) 368 | −0.66 | −0.45 | −1.02 | −0.95 |

TABLE 1b

| | | Reduction Potential (V, versus SCE) | | | |
|---|---|---|---|---|---|
| Polymer | UV-vis $\lambda_{abs}$ (nm) (in solution unless indicated) | $E_{red1}$ (Cathodic) | $E_{red1}$ (Anodic) | $E_{red2}$ (Cathodic) | $E_{red2}$ (Anodic) |
| P(NDI2OD-T1) | 548, 385 (s), 327 | −0.69 | −0.53 | −1.08 | −0.92 |
| P(NDI2OD-T2) | 702 (s), 660, 384, 366 (s) | −0.54 | −0.45 | −1.02 | −0.91 |
| P(NDI2OD-TZ2) | 542, 512 (s), 368 | −0.45 | −0.35 | −1.02 | −0.85 |
| P(NDI2OD-T4) | 710, 420 (film) | −0.63 | −0.52 | −1.03 | −0.94 |

For all polymers, two semi-reversible reductions but no oxidation were observed, suggesting that all polymers are intrinsically n-dopable. Analysis of the half-wave potentials reveals the importance of naphthalene imide functionalization of the polymer backbone in modulating the reduction behavior, hence the LUMO energies. The first and second reduction potentials of these polymers are located at ~0.5 V

TABLE 2

| Entry | Device Structure | Sub. | Dielectric[a] (d, nm) | P(NDI2OD-T2)[b] Deposition | $\mu^c$ (cm²/Vs) | $I_{on}:I_{off}{}^d$ (log10) | $V_{on}$ (V) | $V_T$ (V) | $S_d$ (V/dec.) |
|---|---|---|---|---|---|---|---|---|---|
| 1 | BGTC | n⁺⁺-Si | SiO₂ (300) | spin-coating | 0.06-0.08 | 7 | −20~−15 | −5~0 | 3-4 |
| 2 | BGTC | n⁺⁺-Si | D1100 (700-800) | spin-coating | 0.01-0.02 | 6-7 | 0~+5 | +10~+20 | 2-3 |
| 3 | TGBC | Glass | D2200 (350-450) | spin-coating | 0.2-0.85 | 6-7 | 0~+5 | +5~+10 | 1-2 |
| 4 | TGBC | PET | D2200 (350-450) | spin-coating | 0.3-0.5 | 6-7 | 0~+5 | +5~+10 | 1-2 |
| 5 | TGBC | PET | D2200 (1000-1200) | gravure (3 pass) | 0.1-0.4 | 6-7 | 0~+5 | +5~+10 | 2-3 |

TABLE 2-continued

| Entry | Device Structure | Sub. | Dielectric[a] (d, nm) | P(NDI2OD-T2)[b] Deposition | $\mu^c$ (cm$^2$/Vs) | $I_{on}{:}I_{off}{}^d$ (log10) | $V_{on}$ (V) | $V_T$ (V) | $S_d$ (V/dec.) |
|---|---|---|---|---|---|---|---|---|---|
| 6 | TGBC | PET | D2200 (1000-1200) | gravure (1 pass) | 0.2-0.3 | 6-7 | 0~+5 | +5~+10 | 2-3 |
| 7 | TGBC | PET | D2200 (350-450) | gravure (2 pass) | 0.1-0.3 | 6-7 | 0~+5 | +5~+10 | 1-2 |
| 8 | TGBC | PET | D2200 (350-450) | gravure (1 pass) | 0.1-0.3 | 6-7 | 0~+5 | +5~+10 | 1-2 |
| 9 | TGBC | PET | D2200 (1000-1200) | flexo | 0.1-0.3 | 5-6 | +10~+20 | +25~+35 | 8-10 |
| 10 | TGBC | PET | D2200 (400-900) | flexo | 0.1-0.3 | 5-7 | 0~+5 | +35~+40 | 4-6 |
| 11 | TGBC | PET | D2200 (1100-1200) | inkjet | ~0.1 | ~5 | ~+10 | ~+40 | ~10 |
| 12 | TGBC | PETg | gravure D2200 (700-800) | gravure (1 pass) | 0.1-0.5 | 6-8 | 0~+5 | +10~+15 | 1-2 |
| 13 | TGBC | PETg | gravure D2200 (1100-1200) | gravure (1 pass) | 0.1-0.65 | 5-7 | +5~+10 | +30~+35 | 4-6 |

Example 3A

Fabrication of Bottom-Gate Top-Contact Transistors Based on P(NDI2OD-T2)

Bottom-gate top-contact (BGTC) thin film transistors (TFTs) were fabricated on n$^{++}$-Si substrates with a thermally grown SiO$_2$ (300 nm, Montco Silicon Tech) layer. These substrates were treated with octadecyltrichlorosilane (OTS, 10 mM solution in toluene, aqueous contact angle ~95°) overnight before semiconductor deposition. Bottom-gate top-contact devices of entry 2 (Table 2) were fabricated on n$^{++}$-Si substrates (Montco Silicon Tech) functioning as the gate. ActivInk™ 1100 dioxane solutions were spin-coated (concentration ~80-110 mg/mL in dioxane, 1500-2000 rpm) on these substrates to afford ~700-800 nm-thick gate dielectric layer. These films were then crosslinked with UV light (λ=300 nm) and dried in a vacuum oven (110° C., 10 min) to afford a robust, completely insoluble dielectric layer. The film dielectric constant (∈) is ~3.3-3.5. All BGTC devices were completed with P(NDI2OD-T2) layer deposition by spin-coating (concentration ~5-10 mg/mL in DCB-CHCs mixture, 1500-2000 rpm, film dried in a vacuum oven at ~110° C. for 1 h, film thickness=40-80 nm) followed by Au source and drain contact (30 nm thick) deposition using a shadow mask. Channel lengths and widths are 25-75 μm and 0.5-1.5 mm, respectively, to afford W/L=20.

Example 3B

Fabrication of Top-Gate Bottom-Contact Transistors Based on P(NDI2OD-T2)

Top-gate bottom-contact (TGBC) TFTs were fabricated on glass (PGO glass) and PET (DuPont or other providers) substrates. Depending on the substrate source, they were used as received or first planarized by depositing a ~400 nm-thick ActivInk™ 1100 film (cured as described above) followed by thermally-evaporated Au source-drain contacts (30 nm-thick). These substrates were coated with the semiconductor layer deposited by spin-coating (for conditions see BGTC devices), gravure printing (concentration ~1-2% w/w in DCB-CHCs mixture, anilox force=50-100 N, printing speed 0.2 m/s, anilox cylinder 402.110 IGT printer), flexographic printing (concentration ~5-9% w/w in DCB-CHCs mixture, anilox force=100-150 N, printing force=30-100 N, printing speed 0.2 m/s, anilox cylinder 402.110 IGT printer), and inkjet printing (concentration ~0.1-0.2% w/w in DCB-CHCs mixture, droplet size=5 pL, Dimatix 2800 series printer). Typical semiconductor film thicknesses are 40-120 nm. For the gravure printing experiments, different semiconductor printing passes (from 1 to 3) were tested affording various semiconductor film thicknesses (from ~80 to ~200 nm, respectively). Next, the dielectric layer was spin coated or gravure printed to afford 400-1200 nm thick films. The film dielectric constant (∈) is ~3.0-3.2. The device structure was completed by vapor deposition of patterned Au gate contacts (~30 nm thick) through a shadow mask. Channel lengths and widths are 25-75 μm and 0.5-1.5 mm, respectively, to afford W/L=20.

Example 3C

Fabrication of Inverters Based on P(NDI2OD-T2)

For the fabrication of complementary inverters, the P3HT (p-channel) transistors were fabricated by spin-coating (concentration ~1% w/w in DCB, 1500-2000 rpm) and gravure printing (concentration-1-2% w/w in DCB, 1500-2000 rpm). The n-channel devices were fabricated as described above and they were connected to the p-channel TFTs with a common gate line (Au, 30 nm).

Example 4

Device Characterization

A Keithley 4200 semiconductor characterization system was used to perform all electrical/TFT characterizations concerning the bottom gate devices. The 4200 SCS system consists of three source measurement units (SMU), all of which are supplied with remote pre-amplifiers. The other major component of the test system is a Signatone probe station. Triax cable and probes were used for all electrodes to provide the first level of shielding. A dark/metal box enclosure was used to avoid light exposure and to further reduce environmental noise. The dark box had a triax cable feedthrough panel to maintain consistent triax shielding all the way from the preamps to the end of triax probe tips. The semiconductor film morphology and microstructure were investigated by wide-angle x-ray diffraction (WA-XRD) and atomic force microscopy (AFM). Thin film XRD characterization was performed using a Rigaku ATXG thin film diffractometer with Ni-filtered Cu Kα radiation. AFM images were taken from a JEOL-SPM5200 with a Si cantilever. Film thickness was determined by profilometry using a Veeco Dektak 150.

Transistor carrier mobilities (μ) were calculated by standard field effect transistor equations. In traditional metal-insulator-semiconductor FETs (MISFETs), there is typically a linear and saturated regime in the $I_{DS}$ vs $V_{DS}$ curves at different $V_G$ (where $I_{DS}$ is the source-drain saturation current, $V_{DS}$ is the potential between the source and drain, and $V_G$ is the gate voltage). At large $V_{DS}$, the current saturates and is given by:

$$(I_{DS})_{sat} = (WC_i/2L)\mu(V_G-V_t)^2 \quad (1)$$

where L and W are the device channel length and width, respectively, $C_i$ is the capacitance of the gate insulator, and $V_t$ is the threshold voltage. Mobilities (μ) were calculated in the saturation regime by rearranging equation (1):

$$\mu_{sat} = (2I_{DS}L)/[WC_i(V_G-V_t)^2] \quad (2)$$

The threshold voltage ($V_t$) can be estimated as the x intercept of the linear section of the plot of $V_G$ versus $(I_{DS})^{1/2}$.

Figure 8:
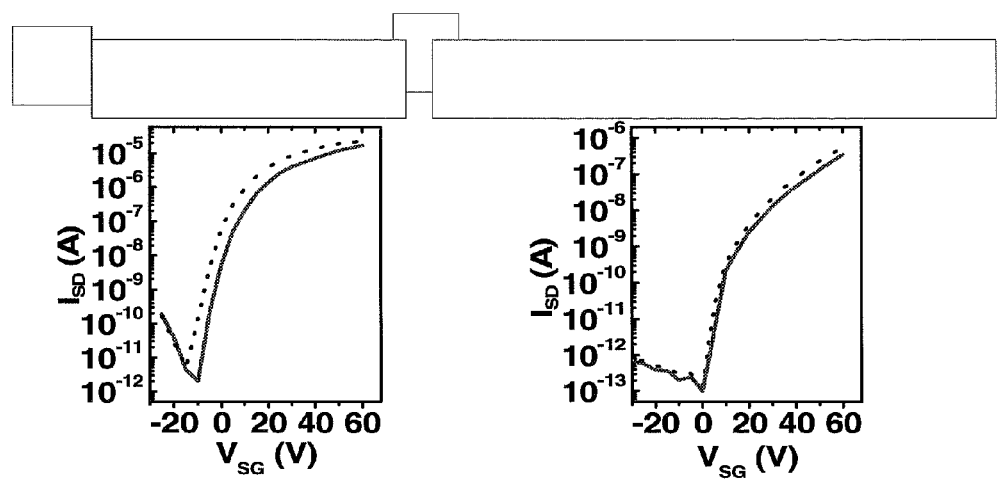
FIG. 8 shows representative transfer characteristics for four bottom-gate top-contact (BGTC) TFTs which incorporate spin-coated P(NDI2OD-T2) as the thin film semiconductor and SiO$_2$ (left) and ActivInk™ D1100 (right), respectively, as the gate dielectrics (Entries 1 and 2 in Table 2). The dotted line and the solid line represent two different devices of the same composition and demonstrate the reproducibility of device performance.
Figure 9:
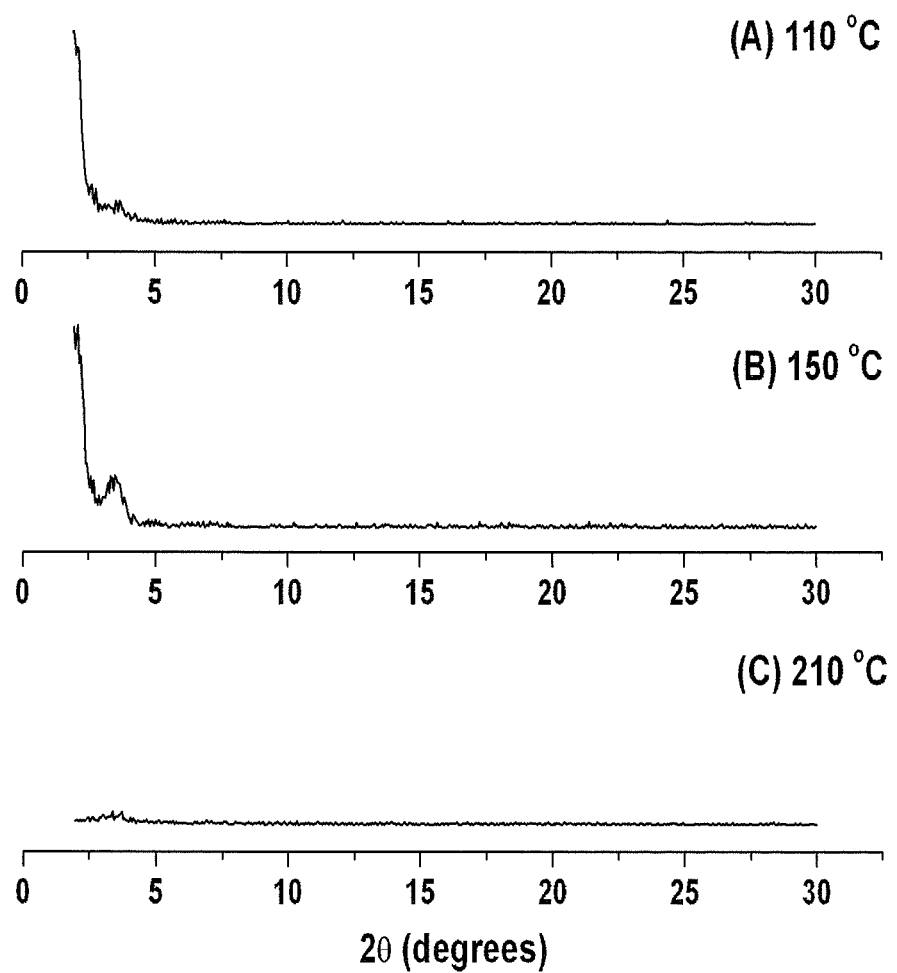
FIG. 9 shows representative 2θXRD scans of films that were obtained by spin-coating polymers of the present teachings (e.g., P(NDI2OD-T2)) on Si—SiO$_2$ substrates and annealed at the indicated temperatures for 1 hour.

Table 2 above summarizes the transistor performance parameters measured under ambient conditions including the field-effect electron mobility ($\mu_e$, in saturation unless indicated), current on-to-off ratio ($I_{on}:I_{off}$), turn-on voltage ($V_{on}$), threshold voltage ($V_T$), and subthreshold swing (S). The electron mobilities of the BGTC TFTs on conventional Si/SiO$_2$ (control devices, FIG. 8) and Si/ActivInk™ D1100 substrates can vary between 0.02-0.08 cm$^2$/Vs with $I_{on}:I_{off}$ ratios ~10$^6$-10$^7$ (entries 1 and 2, Table 2). It should be noted that these data demonstrate P(NDI2OD-T2) as the first n-channel polymeric semiconductor readily processable from conventional organic solvents and functioning under ambient conditions. More importantly, device performance was found negligibly affected by the P(NDI2OD-T2) semiconductor layer thermal annealing ($T_a$) over a wide temperature range [$\mu_e(T_a)$=0.047-0.049 (110° C.), 0.036-0.047 (150° C.), 0.037-0.085 (210° C.) cm$^2$/Vs for a device array of entry 1 in Table 2]. This result is in agreement with the absence in the P(NDI2OD-T2) DSC plot of thermal transitions below 300° C. and the minimal variations of the polymer film morphology and microstructure upon thermal annealing. Atomic force microscopy images of the films annealed at different $T_a$'s exhibit similar fiber-like morphologies. Furthermore, the corresponding wide-angle x-ray diffraction scans reveal negligible Bragg reflection intensities under all film thermal annealing conditions (FIG. 9). It also should be noted that those skilled in the art would not have expected high electron mobilities of polymers of the present teachings given the amorphous nature of films that incorporate these polymers.

Figure 10:
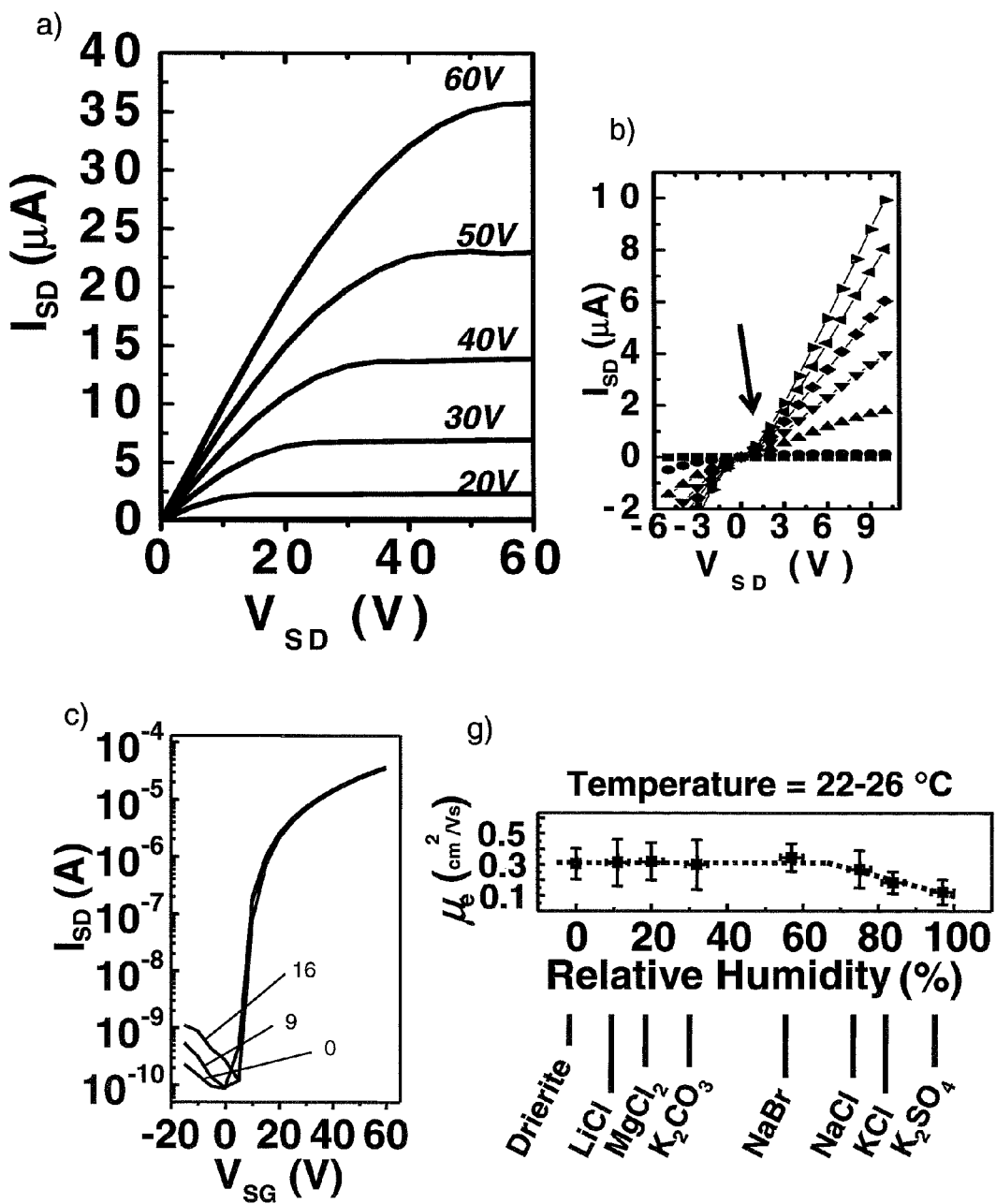
FIG. 10 shows performance and stability of representative TFT devices that incorporate polymers of the present teachings (i.e., P(NDI2OD-T2)) by spin-coating and ActivInk™ D2200 (of thickness d) layers under ambient conditions. Specifically.
Figure 10:
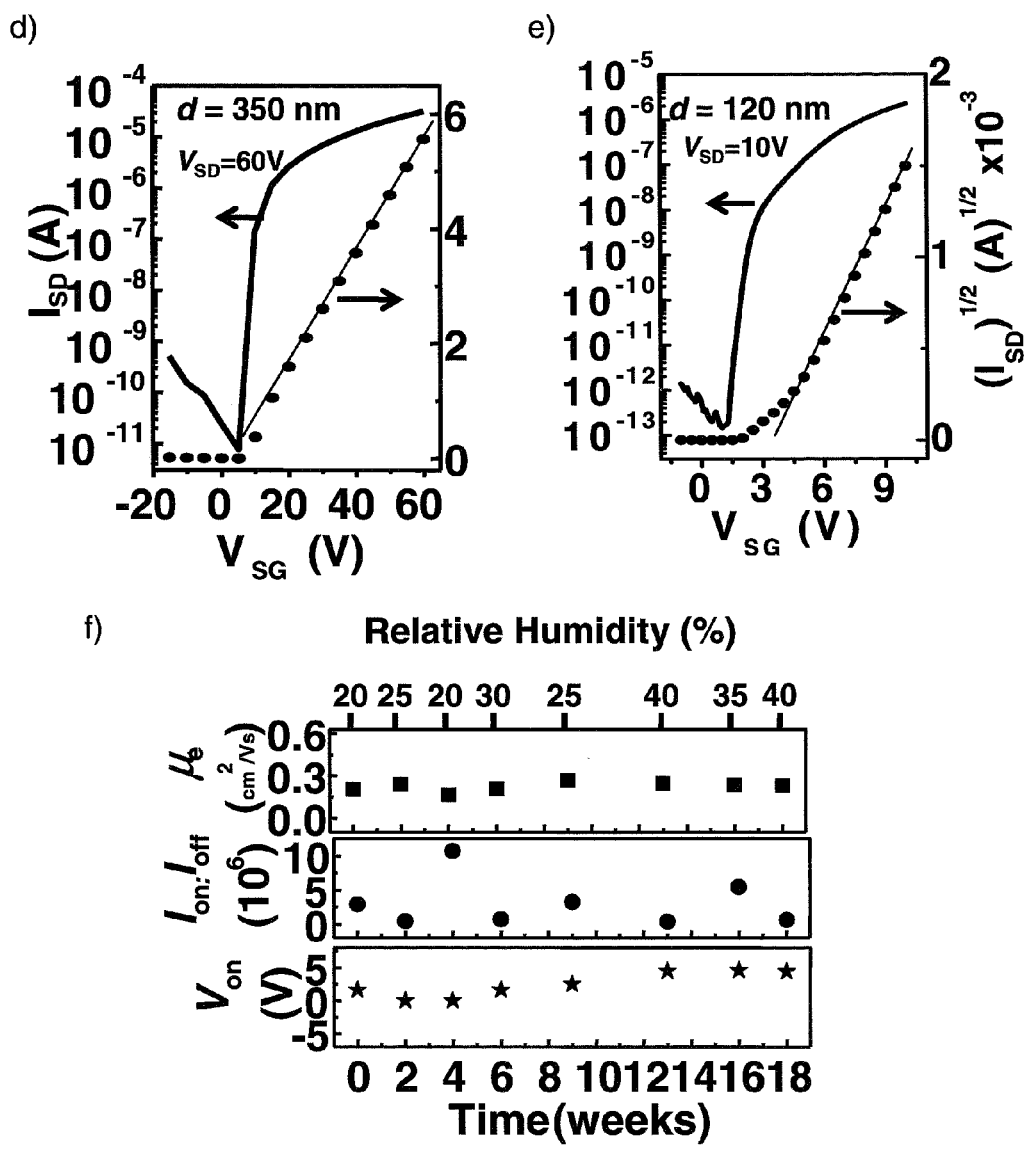

Several TGBC device structures were fabricated and optimized (entries 3-13, Table 2). FIG. 10 shows representative output (FIG. 10a) and transfer (FIG. 10c) current-voltage plots for a TGBC TFT fabricated by spin-coating both the semiconductor and the dielectric layers on glass/Au substrates (entry 3, Table 2). These devices exhibited very high performance, with average $\mu_e$'s ~0.5 cm$^2$/Vs, $I_{on}:I_{off}$~10$^7$, $V_{on}$ ~+3 V, $V_{th}$ ~+7 V, and S<2 V/dec with yields approaching 100%. Several devices from different batches even exhibited $\mu_e$'s ~0.85 cm$^2$/Vs with $L_n:I_{off}$>10$^6$. Comparable device performance and device yields were also achieved for TGBC TFTs on PET plastic substrates (entry 4, Table 2, FIG. 10d). To the inventors' knowledge, TGBC TFTs based on a very thin spin-coated dielectric layer (<200 nm) were fabricated for the first time (FIG. 10e). The resulting TFTs operate at <10 V and achieve S as low as ~280 mV/dec. Despite the unoptimized TFT architecture, in all of these devices the gate leakage current ($I_{SG}$) was at least 2-3 orders of magnitude lower than the drain current ($I_{SD}$), in agreement with the dielectric layer large breakdown fields [$E_{break}$ (intrinsic)>4 MV/cm].

In summary, TFTs based on the present polymers show excellent field effect characteristics. Particularly noteworthy are the electron mobilities of these TFTs, which approach those of the best n-channel devices based on molecular semiconductors vapor-deposited on conventional Si—SiO$_2$ substrates and are only ~2× lower than that of the best single crystal n-channel transistors reported to date ($\mu_e$~1.6 cm$^2$/Vs in vacuum for TCNQ). In addition, it should be noted that these devices do not only have large $\mu_e$'s per se. The combination of large mobility with very low threshold voltages and steep turn-on sets apart these devices from other currently available polymeric devices.

An important issue for organic semiconductor-based electronics, but particularly challenging for n-channel transistors, is stability. To test the stability of the TFTs based on the present polymers, a TGBC TFT array on glass (entry 3, Table 2) was stored under ambient conditions, and the device performance was monitored periodically over several months after fabrication. FIG. 10c shows representative I-V transfer plots of the same device 9 and 16 weeks after fabrication, revealing no appreciable $I_{SD}$ differences. FIG. 10f plots the average TFT performance parameters ($\mu_e$, $I_{on}:I_{off}$, and $V_{on}$) for the whole array over the same time period, showing no appreciable statistical variations of $\mu_e$ and $I_{on}:I_{off}$ and a very small increase of $V_{on}$ which stabilizes at ~+4.5 V (from ~+2.5 V). Furthermore, device stability in air was monitored under increased relative humidity (RH, ~0%→98%) atmospheres. FIG. 10g plots the electron mobility vs. RH for a set of devices on PET of entry 4 in Table 2. This plot shows no erosion of the device characteristics up to ~70% RH ($\mu_e$~0.30 cm$^2$/Vs) demonstrating that P(NDI2OD-T2) TFTs operate properly under ambient conditions in the presence of O$_2$ and humidity. At ~98%, RH the electron mobility drops by ~3× from the original value ($\mu_e$~0.1 cm$^2$/Vs). Baking of these devices in air at 110° C. overnight partially restores the original performance ($\mu_e$ ~0.2 cm$^2$/Vs).

Example 4

Fabrication of Printable Devices

Because the present polymers exhibit a unique combination of high solubility, low semiconductor film curing temperatures, and comparable carrier mobilities on rigid and flexible substrates [entries 3 (glass) vs. 4 (PET) in Table 2], various printing methods to process the semiconductor film were explored for TFT fabrication.

Gravure-printing of P(NDI2OD-T2) solutions was optimized by controlling semiconductor concentration and solvent mixtures (1-2% w/w in DCB-CHCs), printing speed and force, and number of passes of the gravure cylinder on the PET/Au (source-drain contacts) substrates. For successful TFT fabrication by printing, it is necessary to achieve a smooth and uniform semiconductor film morphology as well as complete substrate coverage so that a pinhole-free gate dielectric film can be deposited on top. Furthermore, an interesting question is whether a thin gate dielectric layer can be utilized for TFT fabrication with a printed semiconductor. This is relevant for low-voltage TFT operation.

Photo images of gravure-printed films of the present polymers demonstrate the importance of the semiconductor ink formulation viscosity and gravure cylinder cell volume to afford proper polymer film morphologies. AFM images of optimized gravure printed vs. spin-coated P(NDI2OD-T2) films on PET/Au substrates show that both films exhibit a fiber-like morphology, and that the polymer domain sizes are ~10× smaller than those previously observed for the spin-coated films on Si—SiO$_2$/OTS substrates. Furthermore, the gravure-printed films exhibit a periodic pitting (depth only ~2 nm for ~80 nm-thick film) resulting from the gravure cylinder topography. However, both films are comparably smooth (rms roughness ~1-2 nm for a 20×20 μm$^2$ area), and it was possible to fabricate a TGBC TFTs with high fidelity a ~1 μm-thick ActivInk™ D2200 dielectric layer (entries 5 and 6 in Table 2, device yields >95%). The transfer plots for equal accumulated carrier density comparable TFTs with different dielectric layer thicknesses (FIG. 11a demonstrate that very thin dielectric films (~400 nm) also can be utilized (entries 7 and 8 in Table 2, device yield >85%). All of these TFTs exhibit remarkable performance with $\mu_e$'s ~0.2 cm$^2$/Vs, $I_{on}$:$I_{off}$>10$^6$, and $V_{on}$ ~0~+5 V.

Figure 11:
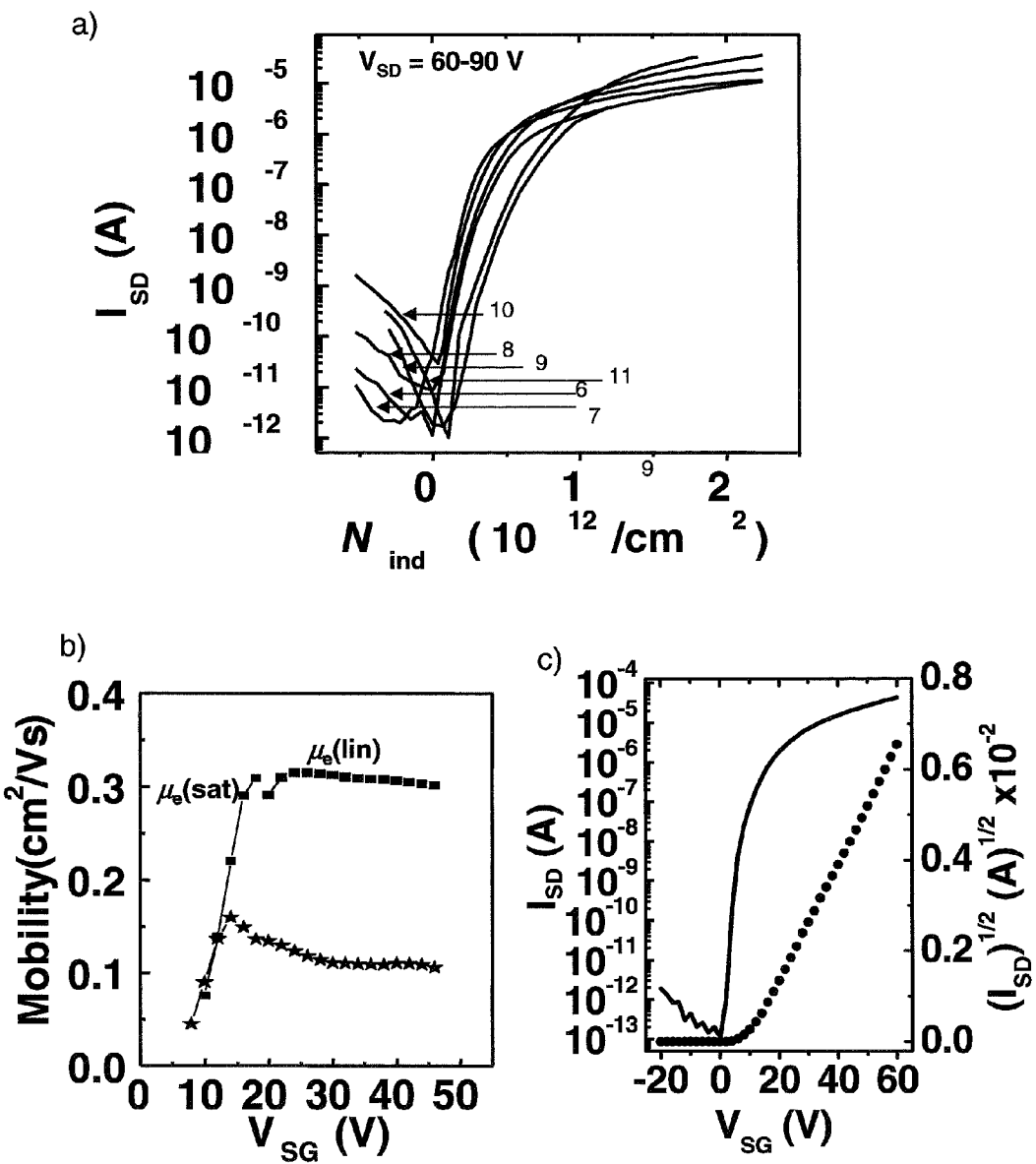
FIG. 11 shows TGBC TFT performance for polymer films/devices fabricated using various solution-processing techniques on PET/Au substrates.

FIG. 11b shows the gate voltage-dependence of the saturation [$\mu_e$(sat)] and linear [$\mu_e$(lin)] region mobilities for two representative spin-coated and gravure-printed devices calculated using standard FET equations. In combination with the transfer plots shown in FIGS. 10 and 11a, these data demonstrate the high quality of both the semiconductor-insulator and semiconductor-contact interfaces. First, the rapid increase of $\mu_e$(sat) to the largest value and the very small subthreshold swing clearly indicate a very low density of shallow trap states at the D2200/P(NDI2OD-T2) interface. The trapped charge densities at room temperature ($N_t^{max}$) for these devices, calculated from the S values, are ~0.5-2×10$^{12}$ cm$^{-2}$. Second, the linear and saturation mobilities are similar for both spin-coated and printed devices. Without wishing to be bound by any particular theory, in general, the higher conductivity of the channel in the linear region results in lower estimated mobilities for devices in which the contacts provide an appreciable fraction of the device resistance. This effect is present for the spin-coated devices, but the difference between $\mu_e$(sat) and $\mu_e$(lin) is minimal (~5%) over the range of conductivities tested. This result coupled with the lack of significant second-order curvature in the low-$V_{SD}$ region of the output characteristics (FIG. 10b) testifies to the high-quality of the contacts. The mobility variations with $V_{SG}$ are more pronounced for the gravure-printed devices. In a staggered TFT architecture (such as TGBC), overly thick semiconductor films manifest themselves in the electrical characteristics as higher contact resistances.

TGBC TFTs also were fabricated by flexo printing (5-9% w/w in DCB-CHCs, entry 9 in Table 2) and inkjet printing (0.1-0.2% w/w in DCB, entry 10 in Table 2) the semiconductor layer. The flexo-printed film morphology exhibits in relief the circular patterns of the flexo printing plate surface. The flexo-printed P(NDI2OD-T2) films can be quite uniform and only slightly less smooth than the spin-coated/gravure-printed films (rms roughness=4-6 nm, FIG. 11b), thus affording good device yields (>70%). Inkjet-printing using our unoptimized printer results in rougher and far less uniform morphologies with only partial uniform coverage of the channel region (rms roughness=8-9 nm). Both flexo- and inkjet-printed TFTs routinely afford electron mobilities>0.1 cm$^2$/Vs and acceptable device characteristics (FIG. 11a).

Figure 12:
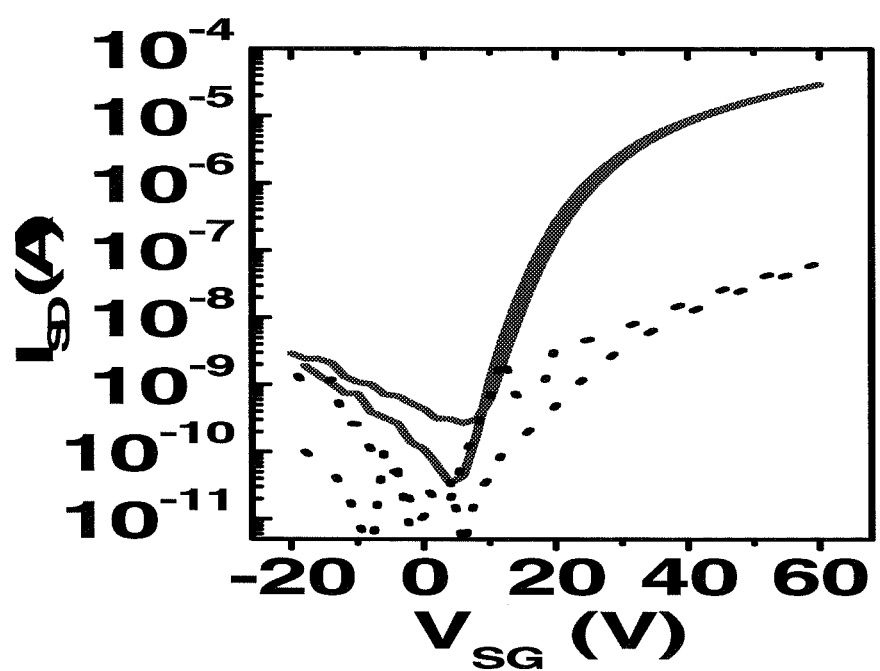
FIG. 12 shows representative transfer characteristics for the forward and reverse scan for representative all-gravure printed (both semiconductor and dielectric layers were gravure-printed) TGBC TFTs measured after 6 weeks from fabrication (Entries 12 and 13 in Table 2). The dotted line denotes the gate leakage current. This device exhibits a mobility of ~0.46 cm$^2$/Vs comparable to the freshly tested device (~0.45 cm$^2$/Vs).

Fully-printed (or all-printed) devices, where both the semiconductor and the dielectric layers are gravure-printed, were also fabricated and tested. The transfer plot of a representative device is shown in FIG. 11c, which shows $\mu_e$'s as high as ~0.65 cm$^2$/Vs (average ~0.2 cm$^2$/Vs) and $I_{on}$:$I_{off}$>10$^6$ (entries 12 and 13 in Table 2). It should be noted that the all-gravure-printed devices are as stable as the spin-coated TFTs and exhibit negligible gate leakage (<0.1 μA) and I-V hysteresis (<5%), confirming the excellent interface quality between the two gravure-printed films (FIG. 12).

Figure 13:
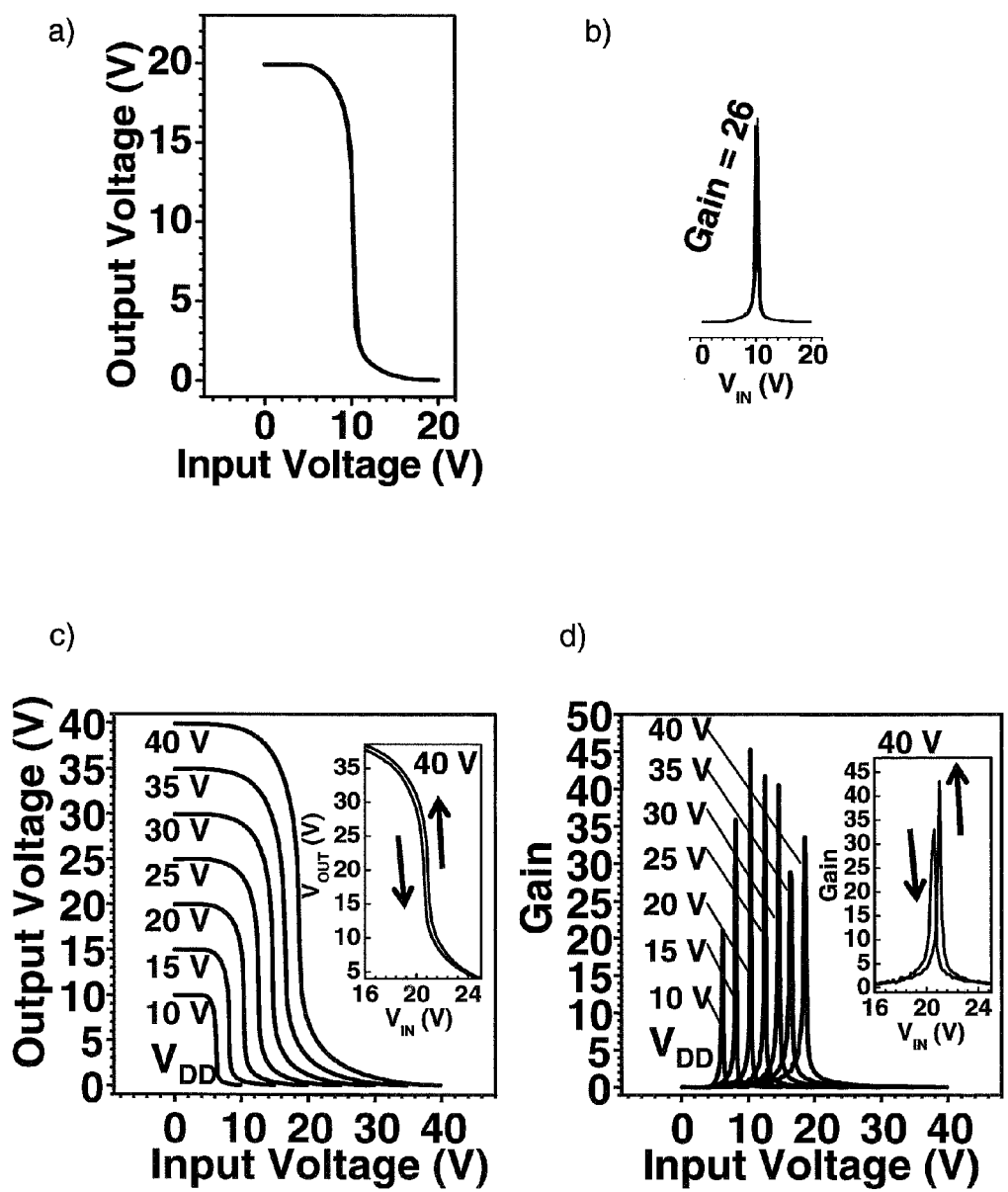
FIG. 13a shows static switching characteristics of an inverter that was prepared by gravure-printing of polymers of the present teachings (e.g., P(NDI2OD-T2)).
FIG. 13b shows a typical gain plot of the corresponding device.
FIG. 13c shows static switching characteristics of an inverter that was prepared by spin-coating using polymers of the present teachings (e.g., P(NDI2OD-T2)).
FIG. 13d shows representative gains of an inverter that was prepared by spin-coating using polymers of the present teachings (e.g., P(NDI2OD-T2)).

P-channel TGBC polymeric transistors were fabricated using poly(3-hexylthiophene) (P3HT) as the hole transporting semiconductor and Au/ActivInk™ D2200 as the contact/dielectric materials. These TFTs exhibit hole mobilities of ~0.01-0.08 cm$^2$/Vs, $I_{on}$/$I_{off}$=10$^2$-10$^3$, and $V_{on}$=−20~−5 V. Complementary inverters having P3HT (p-channel) and P(NDI2OD-T2) (n-channel) transistors were also fabricated following two procedures, one in which both the p-/n-channel semiconductor and dielectric layers were spin-coated and the second in which all layers were gravure-printed. For both devices inverter response can be clearly observed for switching between logic "1" (10-40 V) and logic "0" (0 V) (FIGS. 13a and c). All inverters show small hysteresis. The voltage gains for the gravure-printed (FIG. 13b) and spin-coated (FIG. 13d) devices are very large (dV$_{OUT}$/dV$_{IN(max)}$>25 and 45, respectively), implying that these devices could be used to switch subsequent stages in more complex logic circuits.

Example 5

Fabrication of Additional Devices

Figure 14:
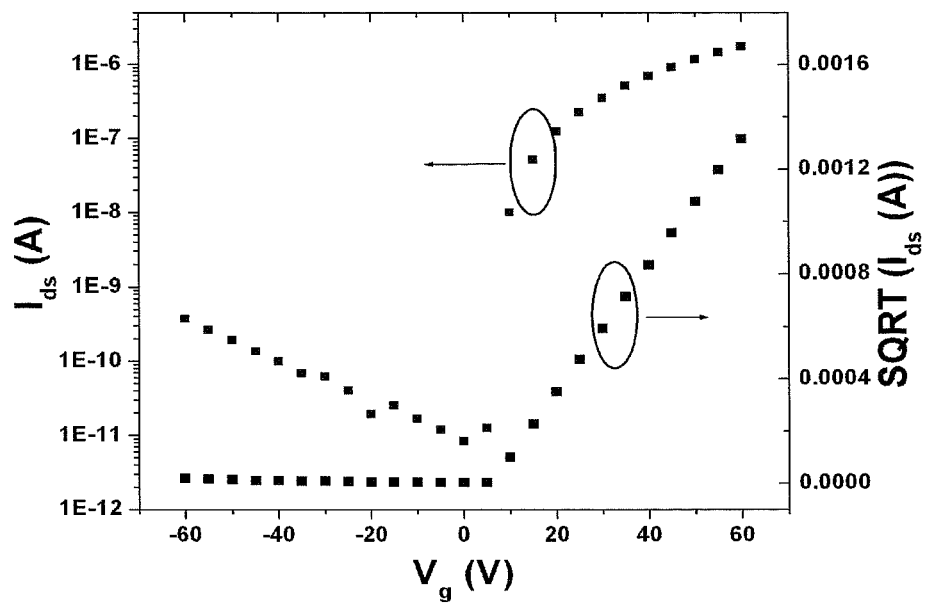
FIG. 14 shows representative transfer and output plots for a TGBC TFT incorporating a spin-coated semiconductor layer prepared from a polymer of the present teachings (i.e., P(NDI2OD-TZ2)).
Figure 14:
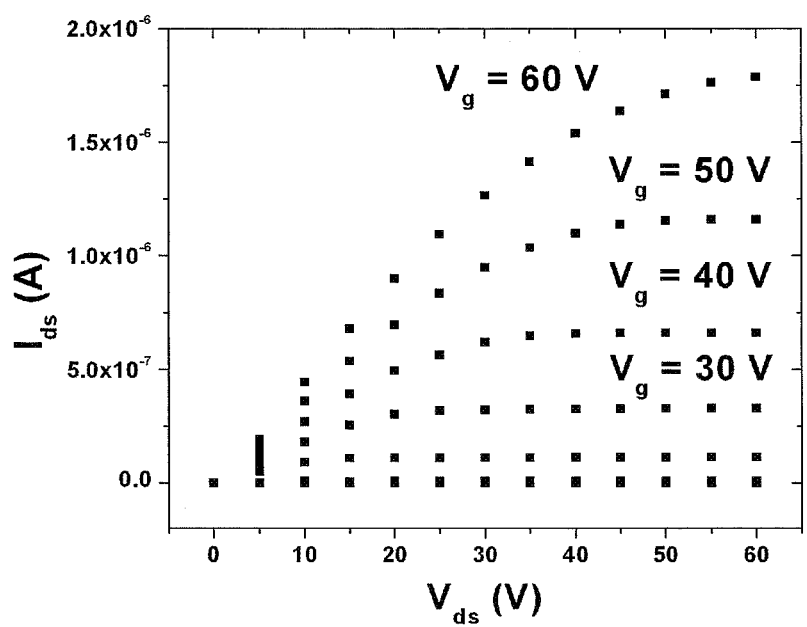

TGBC TFTs were fabricated with P(NDI2OD-TZ2) by spin-coating (in DCB, 7 mg/mL) on glass substrate. Electron-mobilities were determined to be up to 0.01 cm$^2$/Vs, with $I_{on}$/$I_{off}$: ~2×10$^5$. Exemplary transfer and output plots are shown in FIG. 14.

Figure 15:
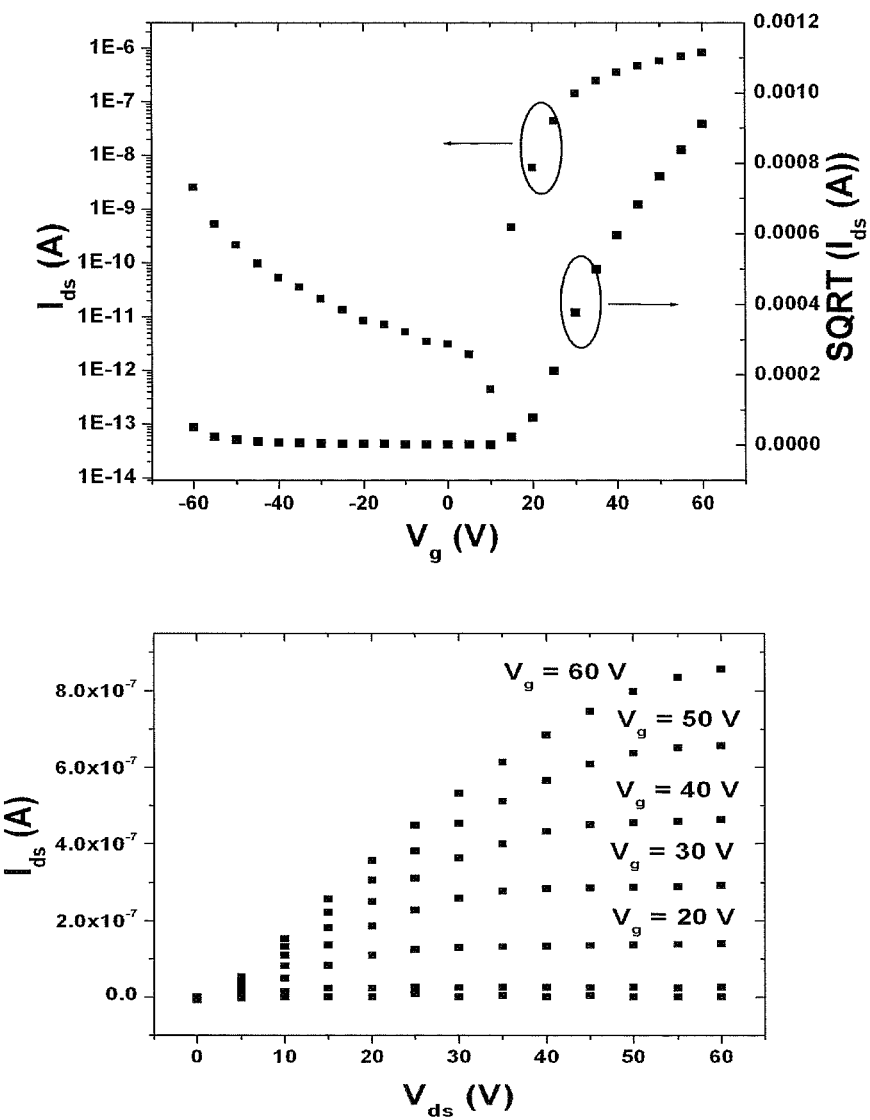
FIG. 15 shows representative transfer and output plots for a TGBC TFT incorporating a spin-coated semiconductor layer prepared from a polymer of the present teachings (i.e., P(NDI2OD-T1)).

Transfer and output plots of similar TGBC TFTs fabricated with P(NDI2OD-T1) are shown in FIG. 15. Electron-mobilities were determined to be up to 0.015 cm$^2$/Vs, with $I_{on}$/$I_{off}$: ~2×10$^5$.

Figure 16:
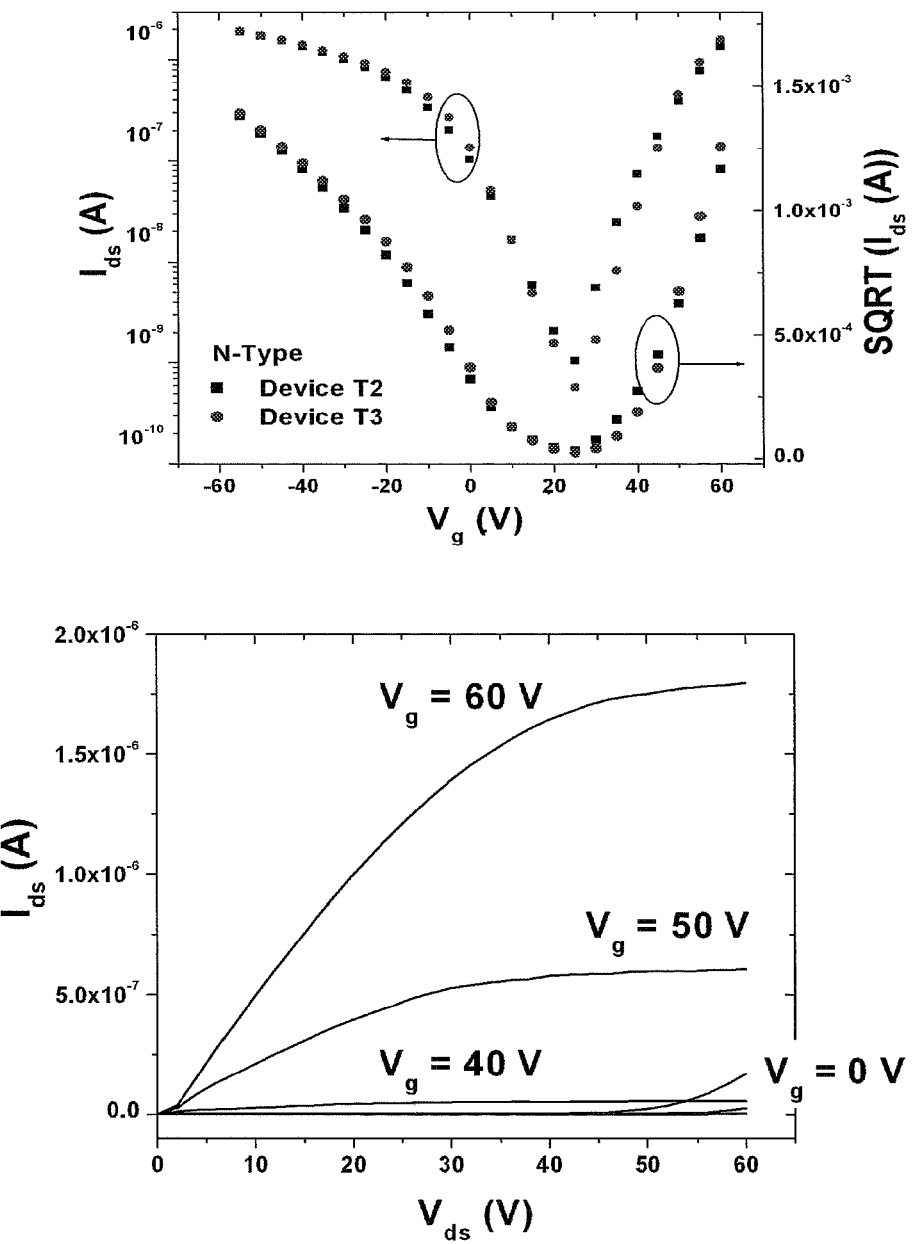
FIG. 16 shows representative transfer and output plots for a TGBC TFT incorporating a spin-coated semiconductor layer prepared from a polymer of the present teachings (i.e., P(NDI2OD-TVT), n-type).

Similar TGBC TFTs were fabricated with P(NDI2OD-TVT). Transfer and output plots (n-type) are shown in FIG. 16. The electron mobility was measured to be between about 0.295 cm$^2$/Vs and about 0.338 cm$^2$/Vs, and the on/off ratio was measured to be about 3×10$^3$.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A polymer of the formula:

, wherein:

$M_1$ is an optionally substituted naphthalene imide selected from:

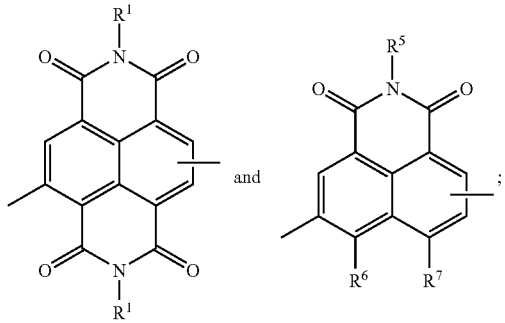

and wherein:

$R^1$, at each occurrence, is independently selected from H, a $C_{1-40}$ alkyl group, a $C_{2-40}$ alkenyl group, a $C_{1-40}$ haloalkyl group, and 1-4 cyclic moieties, wherein:

each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$;

each of the $C_{1-40}$ alkyl group, the $C_{2-40}$ alkenyl group, and the $C_{1-40}$ haloalkyl group can be covalently bonded to the imide nitrogen atom via an optional linker; and each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, =C(CN)$_2$, —$NH_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)$NH_2$, —C(O)NH—$C_{1-20}$ alkyl, —C(O)N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, a $C_{1-20}$ alkyl group, a $C_{1-20}$ alkenyl group, and a $C_{1-20}$ haloalkyl group;

$R^5$ is defined as $R^1$;

$R^6$ and $R^7$, independently are selected from H, an electron-withdrawing group, and a $C_{1-40}$ alkyl group optionally substituted with 1-5 electron-withdrawing groups;

$M_2$ is a repeating unit comprising one or more monocyclic moieties; and n is an integer between 2 and 5,000.

2. The polymer of claim 1, wherein $M_1$ is selected from:

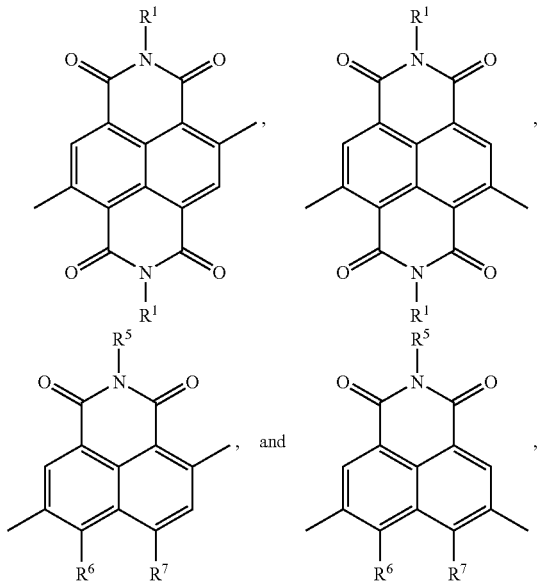

wherein $R^1$, $R^5$, $R^6$, and $R^7$ are as defined in claim 1.

3. The polymer of claim 1, wherein $M_2$ is selected from:

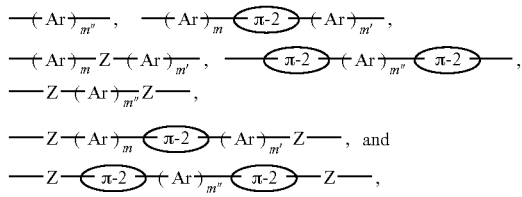

wherein:

π-2 is a polycyclic moiety optionally substituted with 1-6 $R^e$ groups;

Ar, at each occurrence, is independently a 5- or 6-membered aryl or heteroaryl group, wherein each of these groups optionally is substituted with 1-6 $R^e$ groups;

wherein:

$R^e$, at each occurrence, is independently a) halogen, b) —CN, c) —$NO_2$, d) oxo, e) —OH, f) =C($R^f$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y—3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^f$, at each occurrence, is independently a) halogen, b) —CN, c) —$NO_2$, d) oxo, e) —OH, f) —$NH_2$, g) —NH($C_{1-20}$ alkyl), h) —N($C_{1-20}$ alkyl)$_2$, i) —N($C_{1-20}$ alkyl)—$C_{6-14}$ aryl, j) —N($C_{6-14}$ aryl)$_2$, k) —S(O)$_w$H, l) —S(O)$_w$—$C_{1-20}$ alkyl, m) —S(O)$_2$OH, n) —S(O)$_w$—O$C_{1-20}$ alkyl, o) —S(O)$_w$—O$C_{6-14}$ aryl, p) —CHO, q) —C(O)—$C_{1-20}$ alkyl, r) —C(O)—$C_{6-14}$ aryl, s) —C(O)OH, t) —C(O)—O$C_{1-20}$ alkyl, u) —C(O)—O$C_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)—C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)—C$_{6-14}$ aryl, ag) —C(S)NH—C$_{6-14}$ aryl, ah) —S(O)$_w$NH$_2$, ai) —S(O)NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$N(C$_{1-20}$ alkyl)—C$_{6-14}$ aryl, am) —S(O)$_w$N(C$_{6-14}$ aryl)$_2$, an) —SiH$_3$, ao) —SiH(C$_{1-20}$ alkyl)$_2$, ap) —SiH$_2$(C$_{1-20}$ alkyl), aq) —Si(C$_{1-20}$ alkyl)$_3$, ar) a C$_{1-20}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 3-12 membered cycloheteroalkyl group, or bb) a 5-14 membered heteroaryl group;

Y, at each occurrence, is independently selected from a divalent C$_{1-6}$ alkyl group, a divalent C$_{1-6}$ haloalkyl group, and a covalent bond; and w is 0, 1, or 2;

Z is a conjugated linear linker; and m, m' and m'' independently are 1, 2, 3, or 4.

4. The polymer of claim 1, wherein R$^1$ and R$^5$ are selected from H, a C$_{1-40}$ alkyl group, a C$_{2-40}$ alkenyl group, a C$_{2-40}$ alkynyl group, a C$_{1-40}$ haloalkyl group, -L-R$^a$, -L-Ar$^1$, -L-Ar$^1$—Ar$^1$, -L-Ar$^1$—R$^a$, -L-Ar$^1$—Ar$^1$—R$^a$, -L-Cy$^j$, -L-Cy$^1$-Cy$^j$, -L-Cy$^j$-R$^a$, and -L-Cy$^1$-Cy$^1$-R$^a$;

wherein:

L, at each occurrence, is independently selected from —Y—O—Y—, —Y—[S(O)$_w$]—Y—, —Y—C(O)—Y—, —Y—[NR$^c$C(O)]—Y—, —Y—[C(O)NR$^c$]-, —Y—NR$^c$-, —Y—[SiR$^c_2$]—Y—, a divalent C$_{1-20}$ alkyl group, a divalent C$_{1-20}$ alkenyl group, a divalent C$_{1-20}$ haloalkyl group, and a covalent bond;

Ar$^1$, at each occurrence, is independently a monovalent or divalent C$_{6-14}$ aryl group or a 5-14 membered heteroaryl group, each optionally substituted with 1-5 substituents independently selected from a halogen, —CN, oxo, ═C(CN)$_2$, a C$_{1-6}$ alkyl group, a C$_{1-6}$ alkoxy group, and a C$_{1-6}$ haloalkyl group;

Cy$^j$, at each occurrence, is independently a monovalent or divalent C$_{3-14}$ cycloalkyl group or a 3-14 membered cycloheteroalkyl group, each optionally substituted with 1-5 substituents independently selected from a halogen, —CN, oxo, ═C(CN)$_2$, a C$_{1-6}$ alkyl group, a C$_{1-6}$ alkoxy group, and a C$_{1-6}$ haloalkyl group; and R$^a$, at each occurrence, is independently selected from a C$_{1-40}$ alkyl group, a C$_{2-40}$ alkenyl group, a C$_{2-40}$ alkynyl group, a C$_{1-40}$ haloalkyl group, a C$_{1-40}$ alkoxy group, -L'-R$^b$, -L'-Ar$^2$, -L'-Ar$^2$—Ar$^2$, -L'-Ar$^2$—R$^b$, -L'-Ar$^2$—Ar$^2$—R$^b$, -L'-Cy$^2$, -L'-Cy$^2$-Cy$^2$, -L'-Cy$^2$-R$^b$, -L'-Cy$^2$-Cy$^2$-R$^b$;

wherein:

L', at each occurrence, is independently selected from —Y—O—Y—, —Y—[S(O)$_w$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent C$_{1-20}$ alkyl group, a divalent C$_{1-20}$ alkenyl group, a divalent C$_{1-20}$ haloalkyl group, and a covalent bond;

Ar$^2$, at each occurrence, is independently a monovalent or divalent C$_{6-14}$ aryl group or a 5-14 membered heteroaryl group, each optionally substituted with 1-5 substituents independently selected from halogen, —CN, oxo, ═C(CN)$_2$, a C$_{1-6}$ alkyl group, a C$_{1-6}$ alkoxy group, and a C$_{1-6}$ haloalkyl group;

Cy$^2$, at each occurrence, is independently a monovalent or divalent C$_{3-14}$ cycloalkyl group or a 3-14 membered cycloheteroalkyl group, each optionally substituted with 1-5 substituents independently selected from a halogen, —CN, oxo, ═C(CN)$_2$, a C$_{1-6}$ alkyl group, a C$_{1-6}$ alkoxy group, and a C$_{1-6}$haloalkyl group;

R$^b$, at each occurrence, is independently selected from a C$_{1-40}$ alkyl group, a C$_{2-40}$ alkenyl group, a C$_{2-40}$ alkynyl group, a C$_{1-40}$ haloalkyl group, and a C$_{1-40}$ alkoxy group;

R$^c$, at each occurrence, is independently selected from H, a C$_{1-6}$ alkyl group, and a —Y—C$_{6-14}$ aryl group;

Y, at each occurrence, is independently selected from a divalent C$_{1-6}$ alkyl group, a divalent C$_{1-6}$ haloalkyl group, and a covalent bond; and w is 0, 1, or 2.

5. The polymer of claim 1, wherein R$^1$ and R$^5$ are selected from:

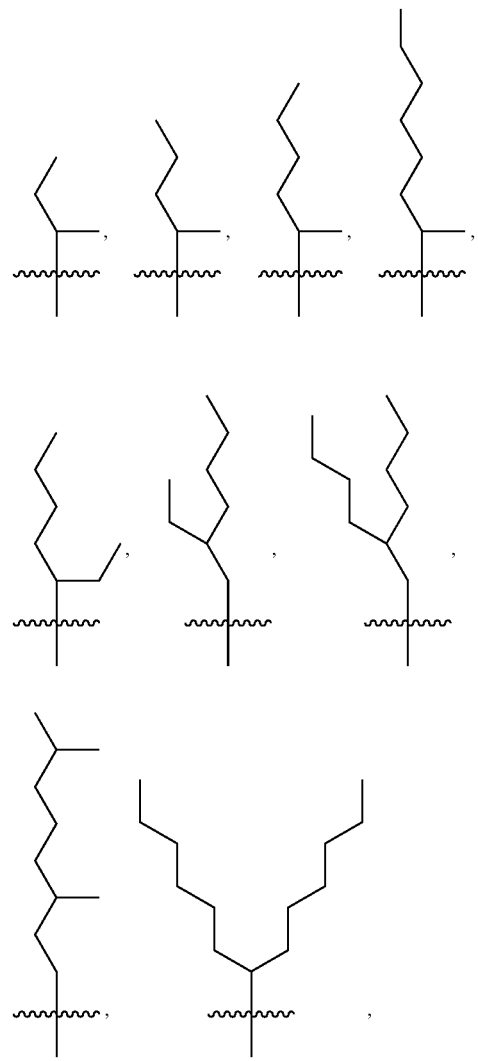

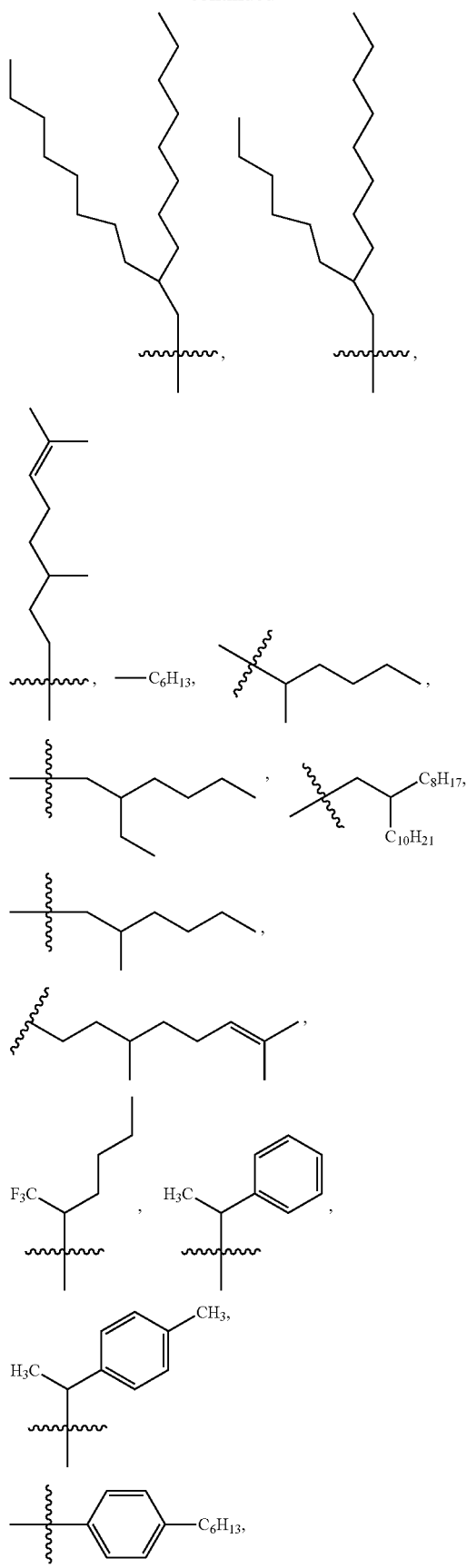
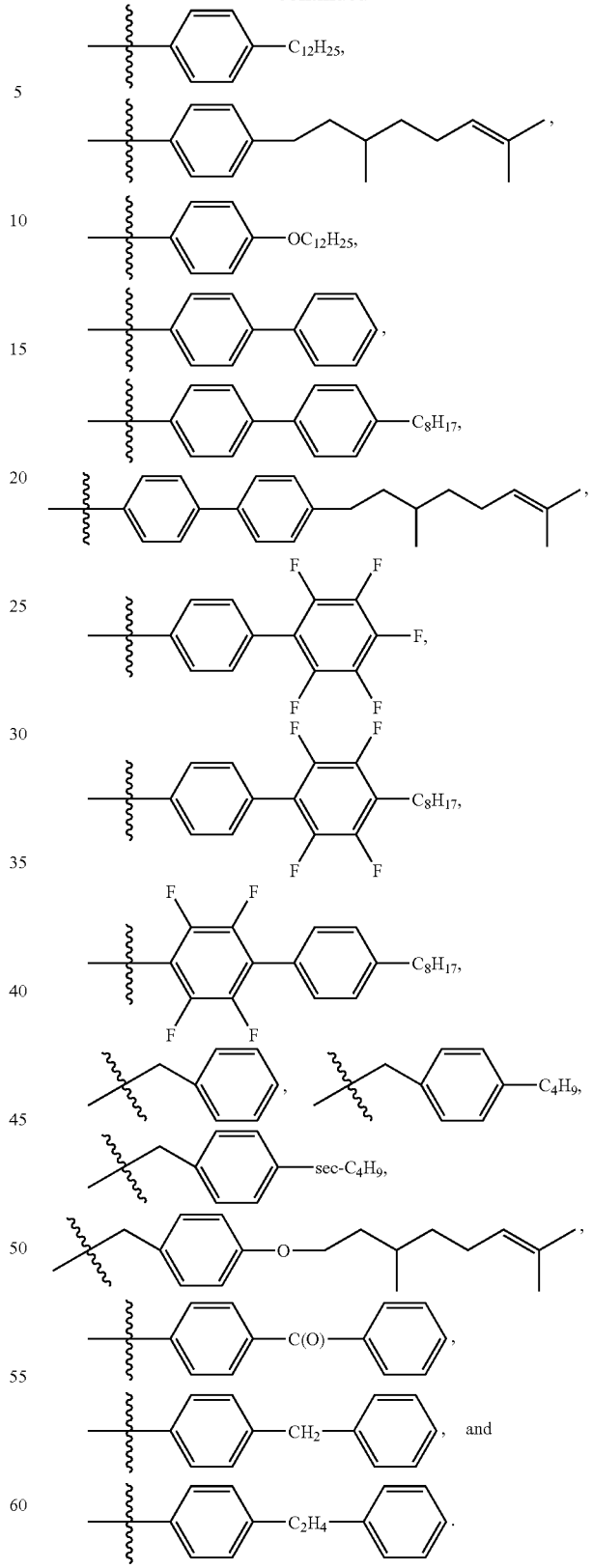
6. The polymer of claim 1, wherein $R^1$ and $R^5$ are selected from a branched $C_{3-40}$ alkyl group or a branched $C_{3-40}$ alkenyl group.

7. The polymer of claim 1, wherein $R^1$ and $R^5$ are selected from:

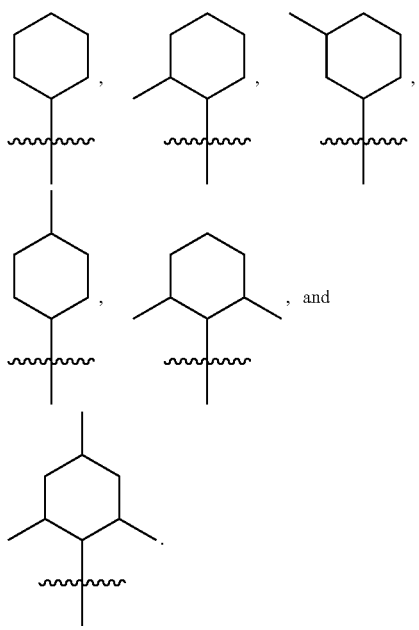

8. The polymer of claim 1, wherein $R^6$ and $R^7$ independently are selected from H, a halogen, —CN, and a $C_{1-10}$ haloalkyl group.

9. The polymer of claim 3, wherein Ar, at each occurrence, is independently selected from:

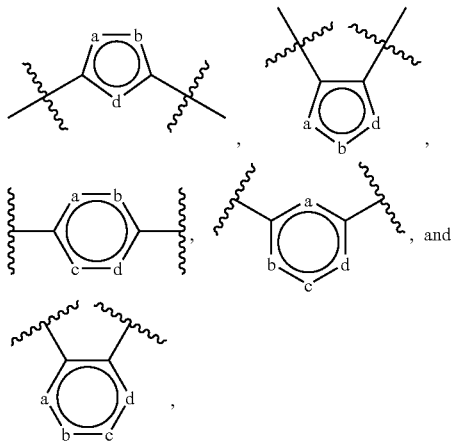

wherein:
a, b, c and d independently are selected from —S—, —O—, —CH=, =CH—, —CR³—, =CR³—, —C(O)—, —C(C(CN)₂)—, —N=, =N— NH— and —NR³—;
R³, at each occurrence, is independently selected from a) halogen, b) —CN, c) —NO₂, d) —N(R$^c$)₂, e) —OR$^c$, f) —C(O)R$^c$, g) —C(O)OR$^c$, h) —C(O)N(R$^c$)₂, i) a $C_{1-40}$ alkyl group, j) a $C_{2-40}$ alkenyl group, k) a $C_{2-40}$ alkynyl group, l) a $C_{1-40}$ alkoxy group, m) a $C_{1-40}$ alkylthio group, n) a $C_{1-40}$ haloalkyl group, o) a —Y—$C_{3-14}$ cycloalkyl group, p) a —Y—$C_{6-14}$ aryl group, q) a —Y—3-14 membered cycloheteroalkyl group, and r) a —Y-5-14 membered heteroaryl group, wherein each of the $C_{1-40}$ alkyl group, the $C_{2-40}$ alkenyl group, the $C_{2-40}$ alkynyl group, the $C_{3-14}$ cycloalkyl group, the $C_{6-14}$ aryl group, the 3-14 membered cycloheteroalkyl group, and the 5-14 membered heteroaryl group optionally is substituted with 1-5 R$^e$ groups;

R$^c$, at each occurrence, is independently selected from H, a $C_{1-6}$ alkyl group, and a —Y—$C_{6-14}$ aryl group; wherein R$^e$ and Y are as defined in claim 3.

10. The polymer of claim 9, wherein $(Ar)_m$, $(Ar)_{m'}$, and $(Ar)_{m''}$ are selected from:

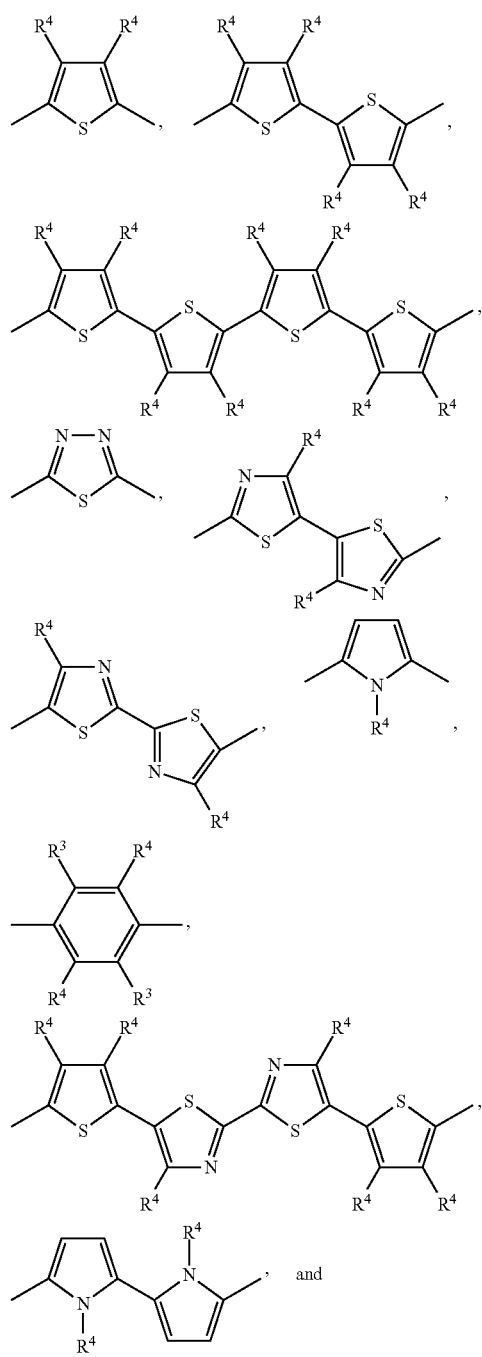

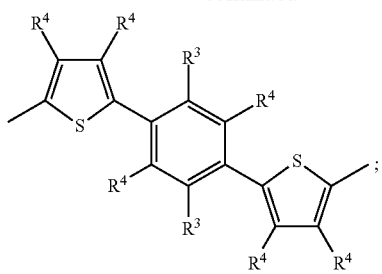
wherein R[4], at each occurrence, independently is H or R[3], and R[3] is as defined in claim 9.
11. The polymer of claim 9, wherein M$_2$ is selected from:
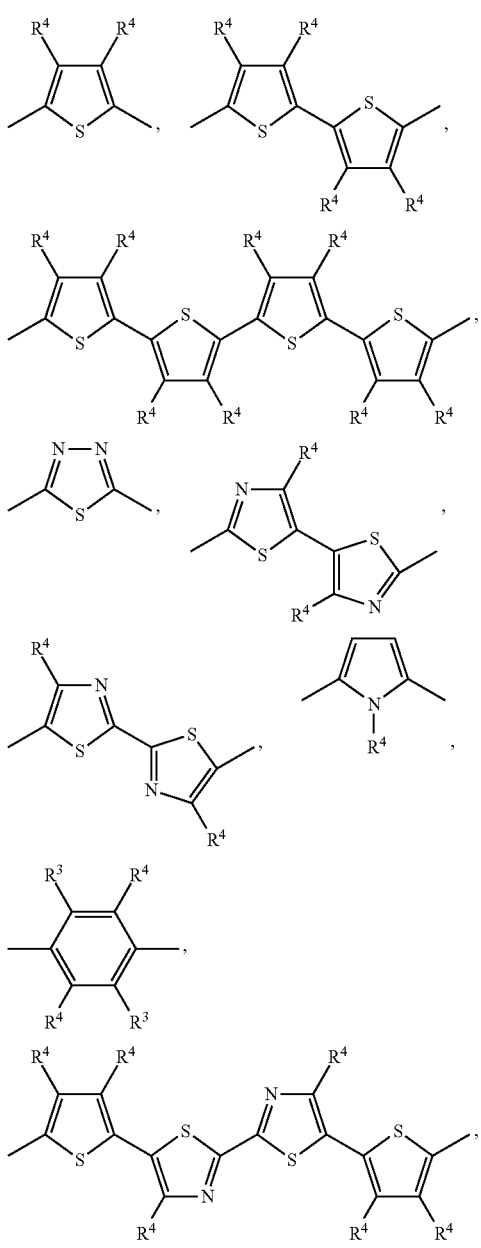
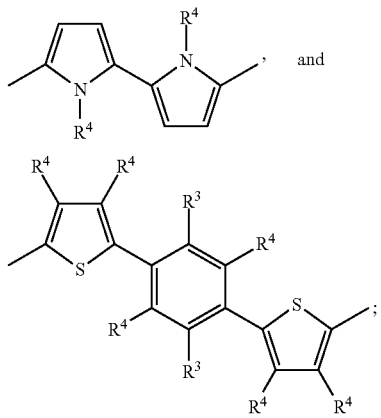
wherein R[3] and R[4] are as defined in claim 9.
12. The polymer of claim 3, wherein Z is selected from:
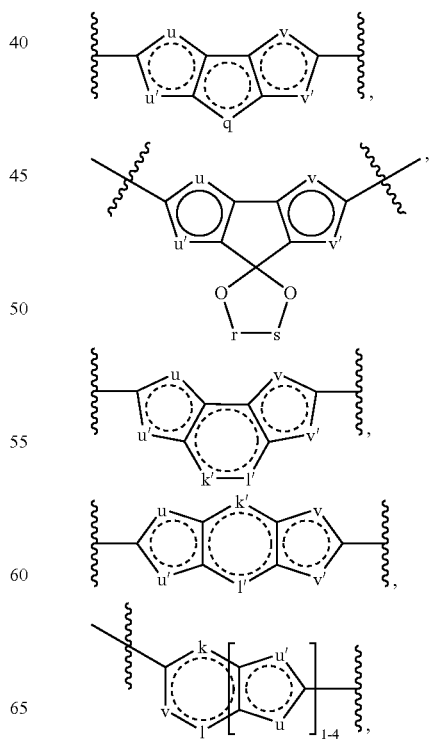
13. The polymer of any one of claim 3, wherein π-2 is an optionally substituted $C_{8\text{-}24}$ aryl group or 8-24 membered heteroaryl group selected from:

-continued

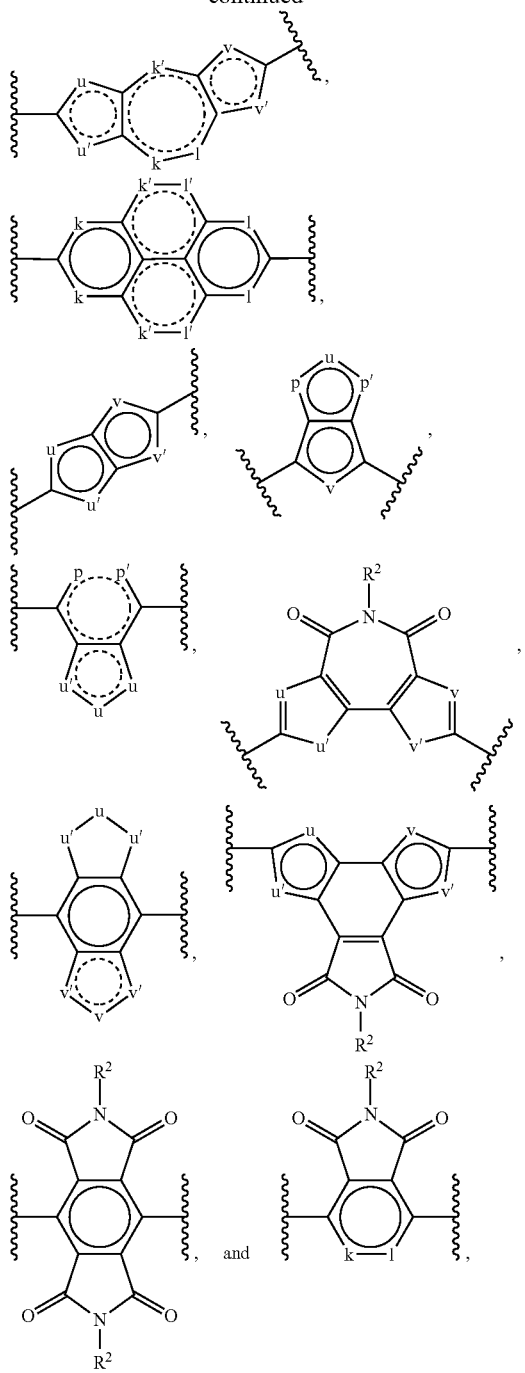

wherein:

k, k', l and l' independently can be selected from —CR²=, =CR²—, —C(O)—, and —C(C(CN)₂)—;

p, p', q and q' independently can be selected from —CR=, =CR—, —C(O)—, —C(C(CN)₂)—, —O—, —S—, —N=, =N—N(R²)—, —SiR²=, =SiR²—, and —SiR²R²—;

r and s independently can be —CR²R²— or —C(C(CN)₂)—;

u, u', v and v' independently can be selected from —CR²=, =CR²—, —C(O)-, —C(C(CN)₂)—, —S—, —S(O)—, —S(O)₂—, —O—, —N=, =N—SiR²=, =SiR²—, —SiR²R²—, —CR²R²—CR²R²—, and —CR²=CR²—; and R², at each occurrence, independently can be H or R^e, wherein R^e is as defined in claim 3.

14. The polymer of claim 3, wherein π-2 is selected from:

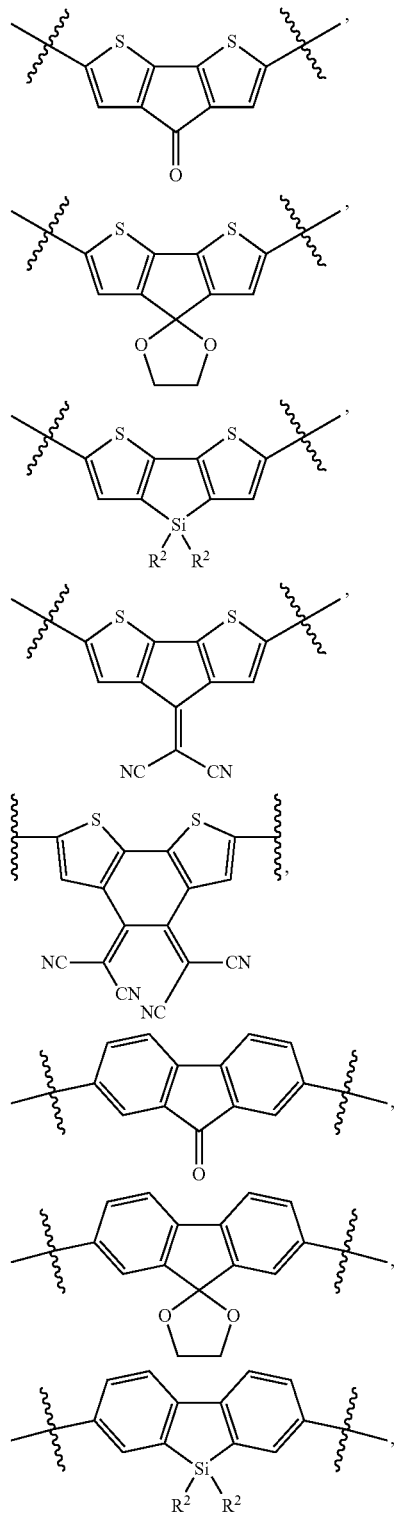

93
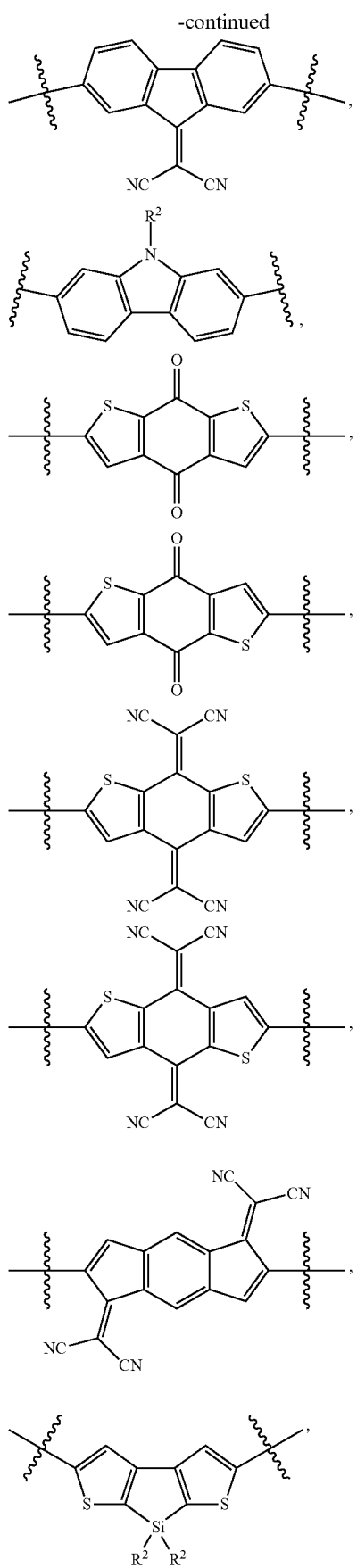
94
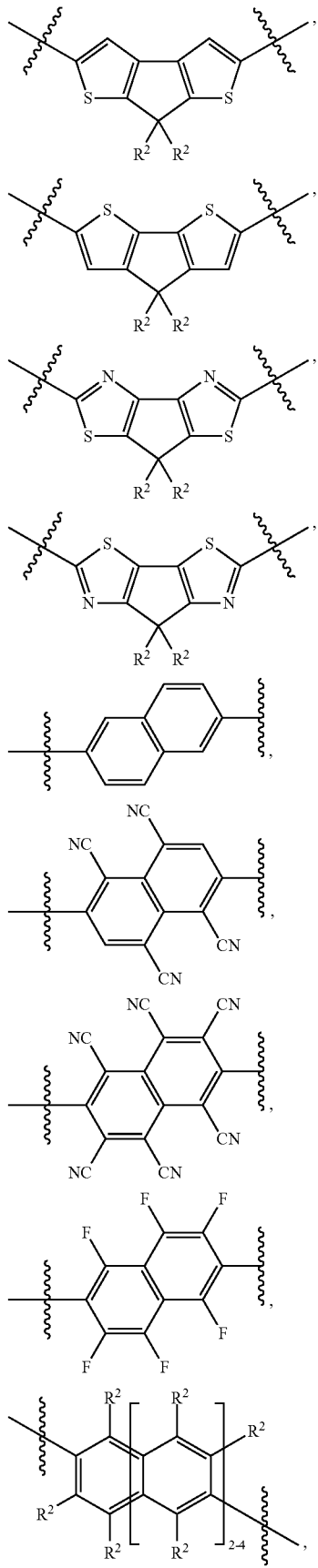

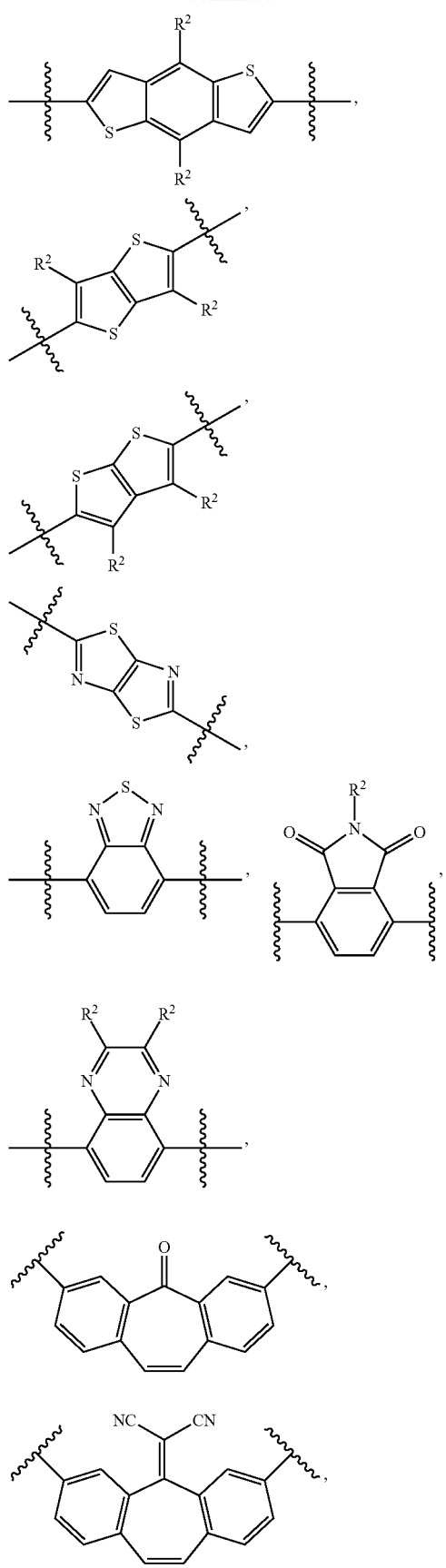
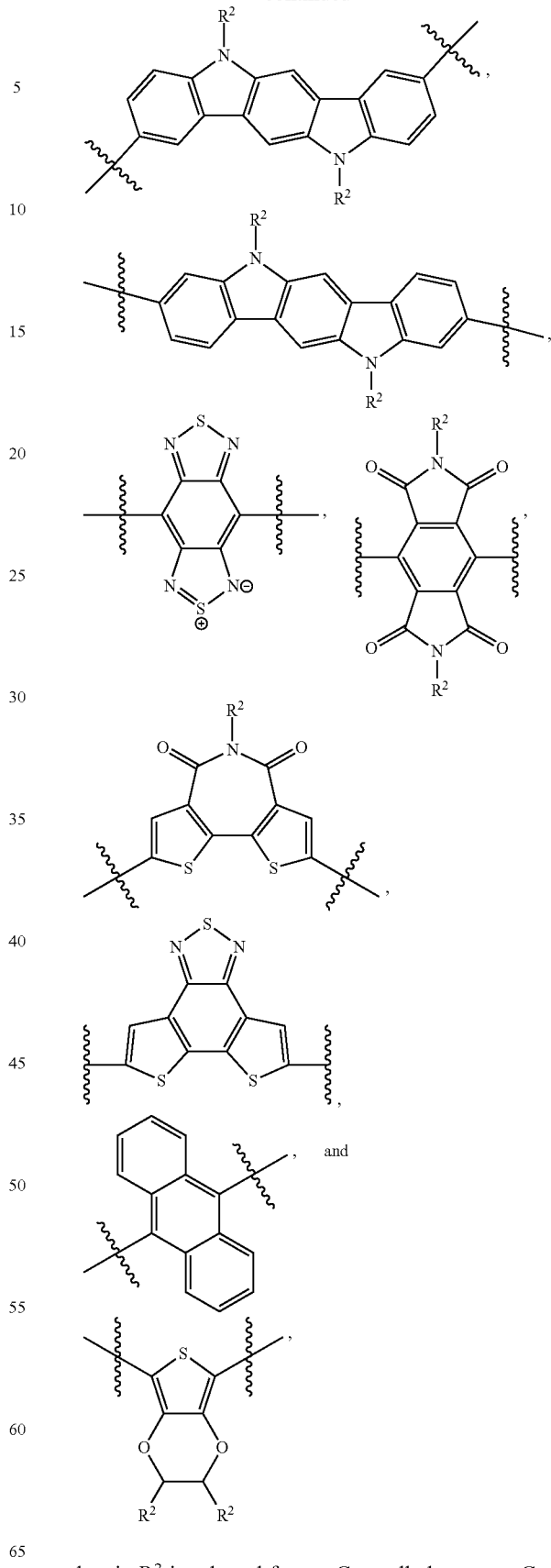
wherein $R^2$ is selected from a $C_{1-20}$ alkyl group, a $C_{1-20}$ alkoxy group, and a $C_{1-20}$ haloalkyl group.

15. The polymer of claim 1, wherein $M_2$ comprises one or more 5- membered heteroaryl group optionally substituted with 1-2 $R^3$ groups, wherein $R^3$, at each occurrence, is independently selected from a halogen, —CN, a $C_{1-20}$ alkyl group, a $C_{1-20}$ alkoxy group, and a $C_{1-20}$ haloalkyl group.

16. The polymer of claim 1, wherein $M_2$ is selected from:

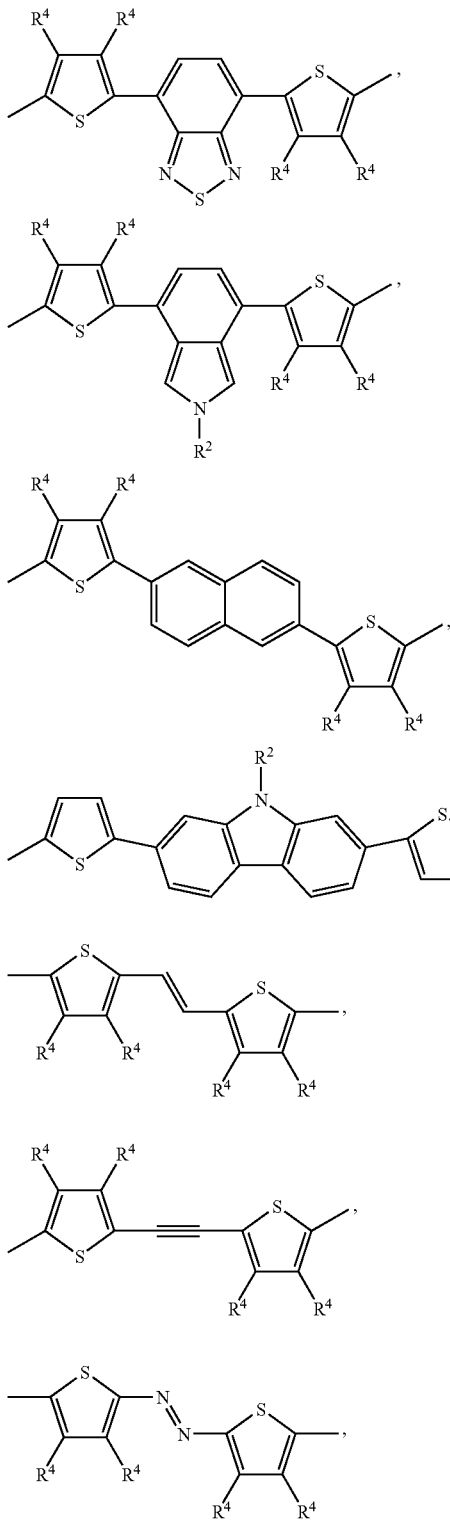

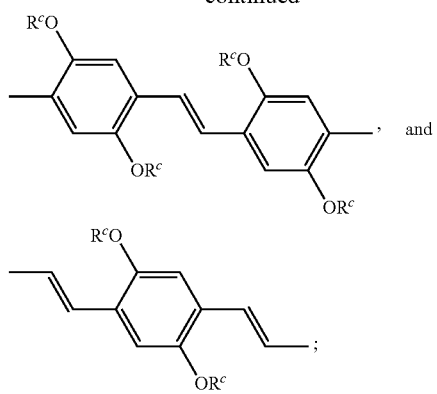

wherein:
$R^2$ is selected from a $C_{1-20}$ alkyl group, a $C_{1-20}$ alkoxy group, and a $C_{1-20}$ haloalkyl group;

$R^c$ is a $C_{1-6}$ alkyl group;

$R^3$, at each occurrence, is independently selected from a halogen, —CN, a $C_{1-20}$ alkyl group, a $C_{1-20}$ alkoxy group, and a $C_{1-20}$ haloalkyl group; and $R^4$, at each occurrence, is independently selected from H, a halogen, —CN, a $C_{1-20}$ alkyl group, a $C_{1-20}$ alkoxy group, and a $C_{1-20}$ haloalkyl group.

17. The polymer of claim 1, wherein n is an integer between 4 and 1,000.

18. The polymer of claim 3 selected from the formula:

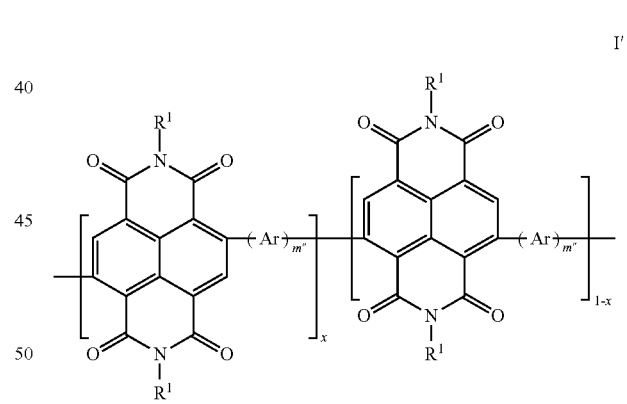

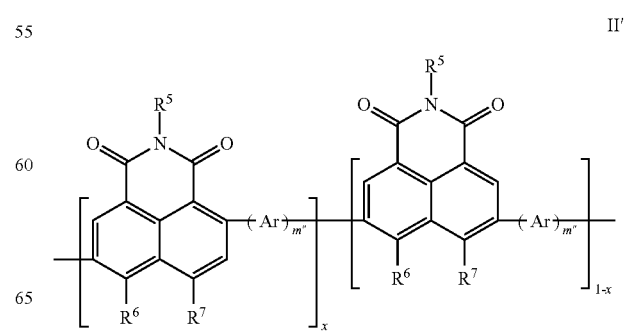

III'

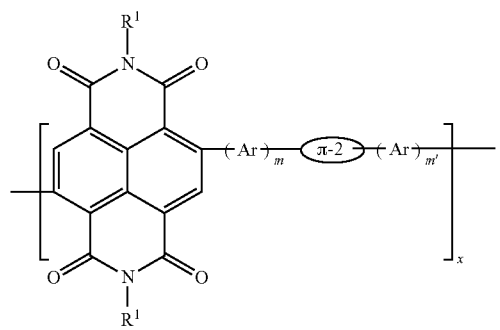

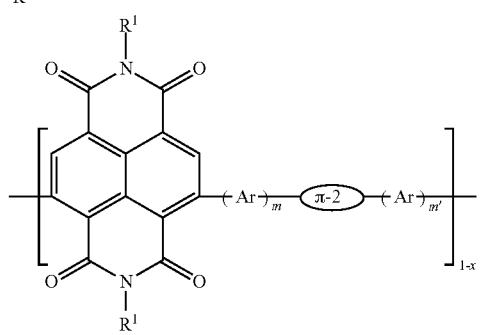

IV'

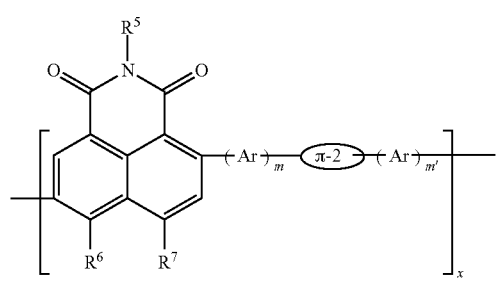

V'

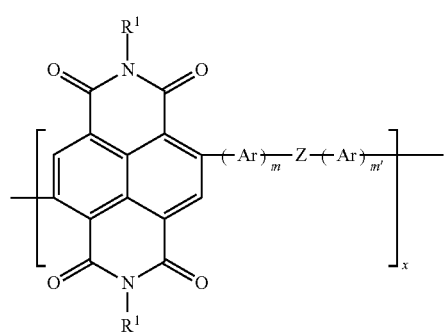

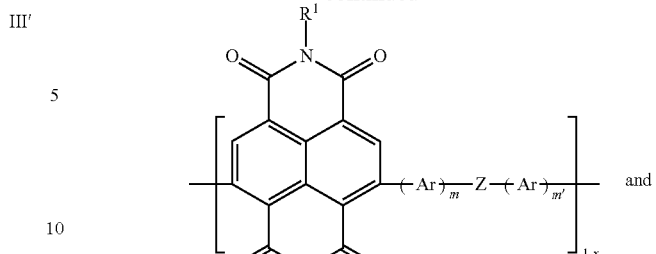

and

VI'

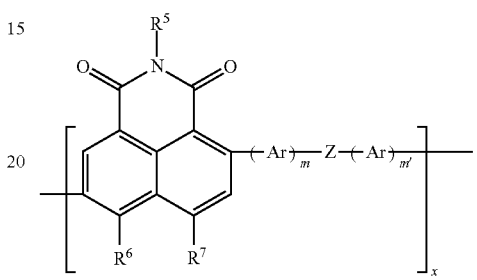

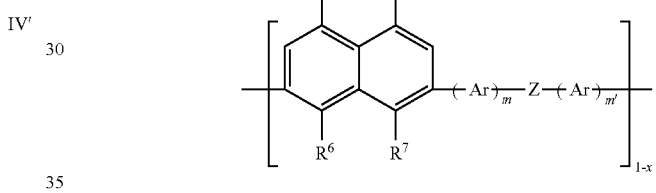

wherein x is a real number and 0.5<x≦1, and $R^1$, $R^5$, $R^6$, $R^7$, π-2, Ar, Z, m, m', and m" are as defined in claim 3.

19. A composition comprising one or more polymers of claim 1 dissolved or dispersed in a liquid medium.

20. The composition of claim 19, wherein the liquid medium comprises water or an organic solvent.

21. The composition of claim 19, the composition further comprising one or more additives.

22. The composition of claim 21, wherein the additives are independently selected from viscosity modulators, detergents, dispersants, binding agents, compatiblizing agents, curing agents, initiators, humectants, antifoaming agents, wetting agents, pH modifiers, biocides, and bactereriostats.

23. An article of manufacture comprising one or more polymers of claim 1.

24. The article of manufacture of claim 23, wherein the article of manufacture is an electronic device, an optical device, or an optoelectronic device.

25. A thin film semiconductor comprising one or more polymers of claim 1.

26. A composite comprising a substrate and the thin film semiconductor of claim 23 deposited on the substrate.

27. A field effect transistor device comprising the thin film semiconductor of claim 25.

28. A field effect transistor device comprising the composite of claim 26.

29. The field effect transistor device of claim 27, wherein the field effect transistor has a structure selected from top-gate bottom-contact structure, bottom-gate top-contact structure, top-gate top-contact structure, and bottom-gate bottom-contact structure.

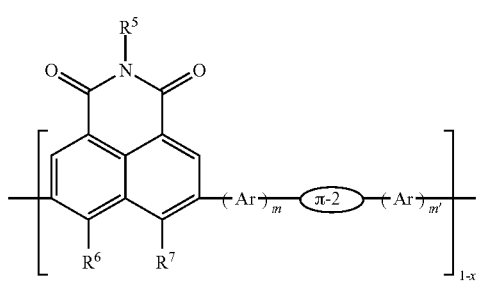

30. The field effect transistor device of claim 27 comprising a dielectric material, wherein the dielectric material comprises an organic dielectric material, an inorganic dielectric material, or a hybrid organic/inorganic dielectric material.

31. A photovoltaic device comprising the thin film semiconductor of claim 25.

32. A photovoltaic device comprising the composite of claim 26.

33. The photovoltaic device of claim 31 comprising a p-type semiconducting material adjacent to the one or more polymers.

34. An organic light emitting device comprising the thin film semiconductor of claim 25.

35. An organic light emitting device comprising the composite of claim 26.

36. A method of making an article of manufacture, the method comprising depositing a composition of any one of claim 19 onto a substrate.

37. The method of claim 36, wherein depositing the composition comprises at least one of printing, spin coating, drop-casting, zone casting, dip coating, blade coating, and spraying.

38. The method of claim 37, wherein printing is selected from gravure printing, inkjet printing, and flexo printing.

* * * * *